US012744519B2

(12) United States Patent
Chiang et al.

(10) Patent No.: US 12,744,519 B2
(45) **Date of Patent: *Sep. 22, 2026**

(54) INTEGRATED CIRCUIT AND METHOD OF FORMING THE SAME

(71) Applicant: TAIWAN SEMICONDUCTOR MANUFACTURING COMPANY, LTD., Hsinchu (TW)

(72) Inventors: Yueh Chiang, Hsinchu (TW); Shang-Hsuan Chiu, Hsinchu (TW); Ming-Xiang Liu, Hsinchu (TW); Guang-Cheng Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/777,308

(22) Filed: Jul. 18, 2024

(65) Prior Publication Data

US 2024/0372538 A1 Nov. 7, 2024

Related U.S. Application Data

(63) Continuation of application No. 18/192,546, filed on Mar. 29, 2023, now Pat. No. 12,095,464.

(Continued)

(51) Int. Cl.

*H03K 3/037* (2006.01)
*G06F 30/39* (2020.01)

(Continued)

(52) U.S. Cl.

CPC .......... *H03K 3/0372* (2013.01); *G06F 30/39* (2020.01); *H03K 3/356121* (2013.01);

(Continued)

(58) Field of Classification Search

CPC .......... H03K 3/02; H03K 3/027; H03K 3/037; H03K 3/0372; H03K 3/353; H03K 3/356;

(Continued)

(56) References Cited

U.S. PATENT DOCUMENTS 8,667,349 B2 3/2014 Hsieh et al.
12,095,464 B2 * 9/2024 Chiang ............... H03K 3/3562

(Continued)

FOREIGN PATENT DOCUMENTS

TW 202036360 10/2020
TW 202211622 3/2022
TW I778603 9/2022

*Primary Examiner* — Long Nguyen
(74) *Attorney, Agent, or Firm* — Hauptman Ham, LLP

(57) ABSTRACT

A flip-flop includes a first set of transistors of a first type being located in a first row and a second set of transistors of a second type being located in a second row. The second type being different from the first type. The first and second set of transistors include a first slave latch circuit and a second slave latch circuit. The first and second slave latch circuit are separated from each other in the first direction by a first distance. A first output signal of the first slave latch circuit and the second slave latch circuit is a first input signal of the first slave latch circuit and the second slave latch circuit. A second output signal of the first slave latch circuit and the second slave latch circuit is a second input signal of the first slave latch circuit and the second slave latch circuit.

20 Claims, 30 Drawing Sheets

Related U.S. Application Data

(60) Provisional application No. 63/387,998, filed on Dec. 19, 2022.

(51) Int. Cl.
*H03K 3/356* (2006.01)
*H03K 3/3562* (2006.01)
*H10D 84/01* (2025.01)
*H10D 84/03* (2025.01)

(52) U.S. Cl.
CPC ....... *H03K 3/3562* (2013.01); *H03K 3/35625* (2013.01); *H10D 84/0165* (2025.01); *H10D 84/038* (2025.01)

(58) Field of Classification Search
CPC ....... H03K 3/356104; H03K 3/356113; H03K 3/356121; H03K 3/35625; G06F 30/30; G06F 30/39
See application file for complete search history.

(56) References Cited

U.S. PATENT DOCUMENTS

2021/0175876 A1 6/2021 Lai et al.
2023/0361760 A1* 11/2023 Kim .................. H03K 3/35625

* cited by examiner

INTEGRATED CIRCUIT AND METHOD OF FORMING THE SAME

PRIORITY

The present application is a continuation of U.S. application Ser. No. 18/192,546, filed Mar. 29, 2023, now U.S. Pat. No. 12,095,464, issued on Sep. 17, 2024, which claims the priority of U.S. Provisional Application No. 63/387,998, filed Dec. 19, 2022, which are incorporated herein by reference in their entireties.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
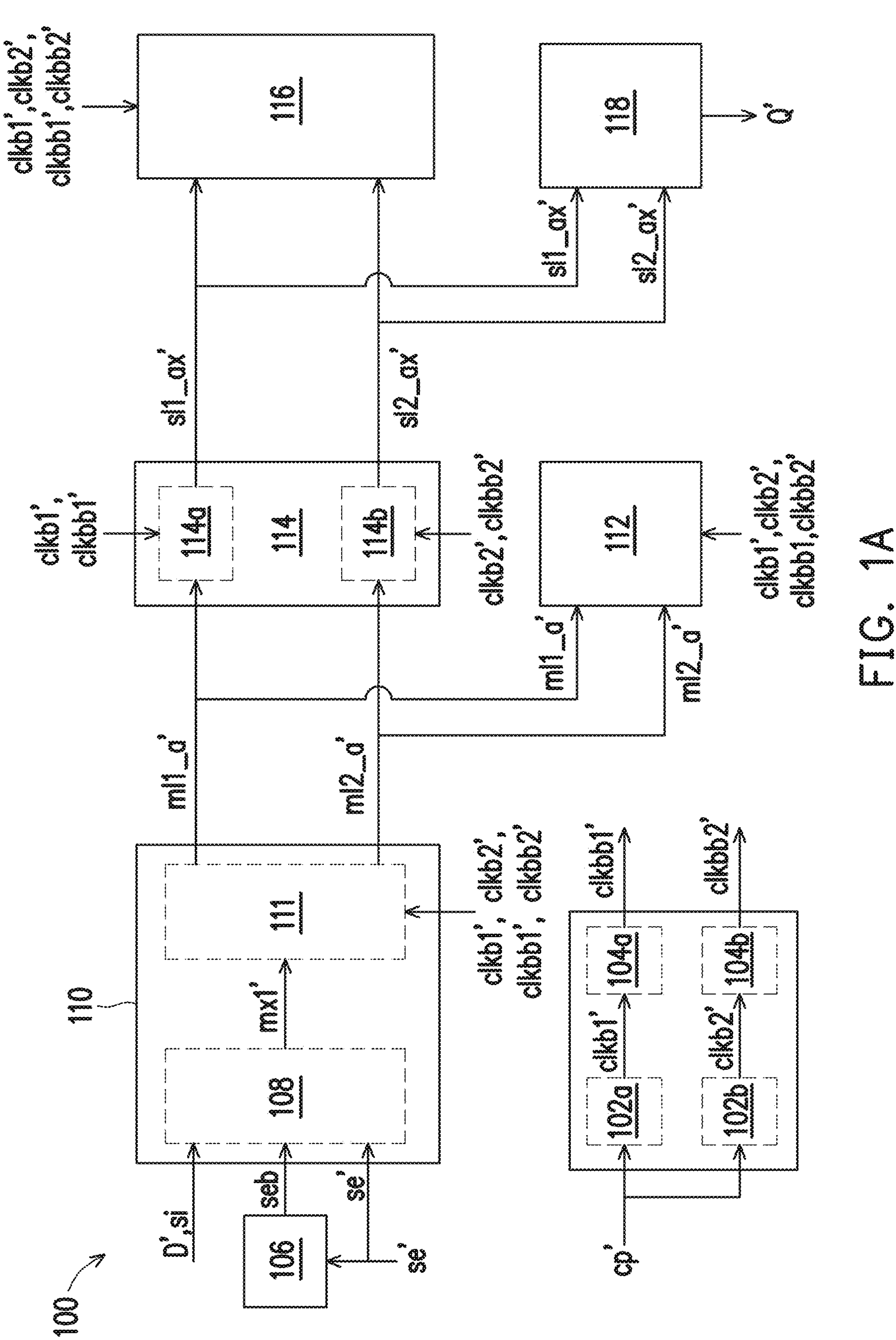
FIG. 1A is a block diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a flip-flop includes a first set of transistors of a first type being located in a first row. In some embodiments, the first row extends in a first direction.

In some embodiments, the flip-flop further includes a second set of transistors of a second type being located in a second row. In some embodiments, the second row extends in the first direction and is separated from the first row in a second direction different from the first direction. In some embodiments, the second type is different from the first type;

In some embodiments, the first set of transistors and the second set of transistors include a first master latch circuit and a second master latch circuit. In some embodiments, a first output signal of the first master latch circuit and the second master latch circuit is a first input signal of the first master latch circuit and the second master latch circuit. In some embodiments, a second output signal of the first master latch circuit and the second master latch circuit is a second input signal of the first master latch circuit and the second master latch circuit.

In some embodiments, the first master latch circuit and the second master latch circuit are separated from each other in the first direction by a first distance.

In some embodiments, separating the first master latch circuit and the second master latch circuit from each other in the first direction by the first distance thereby reduces sensitivity of the flip-flop to a single-event upset (SEU) or a single-event error (SEE) that is caused by one or more ionizing particles (electrons, ions, photons, or the like)

striking one or more sensitive nodes within the flip-flop, thus increasing reliability and accuracy of the flip-flop compared to other approaches.

Figure 1B:
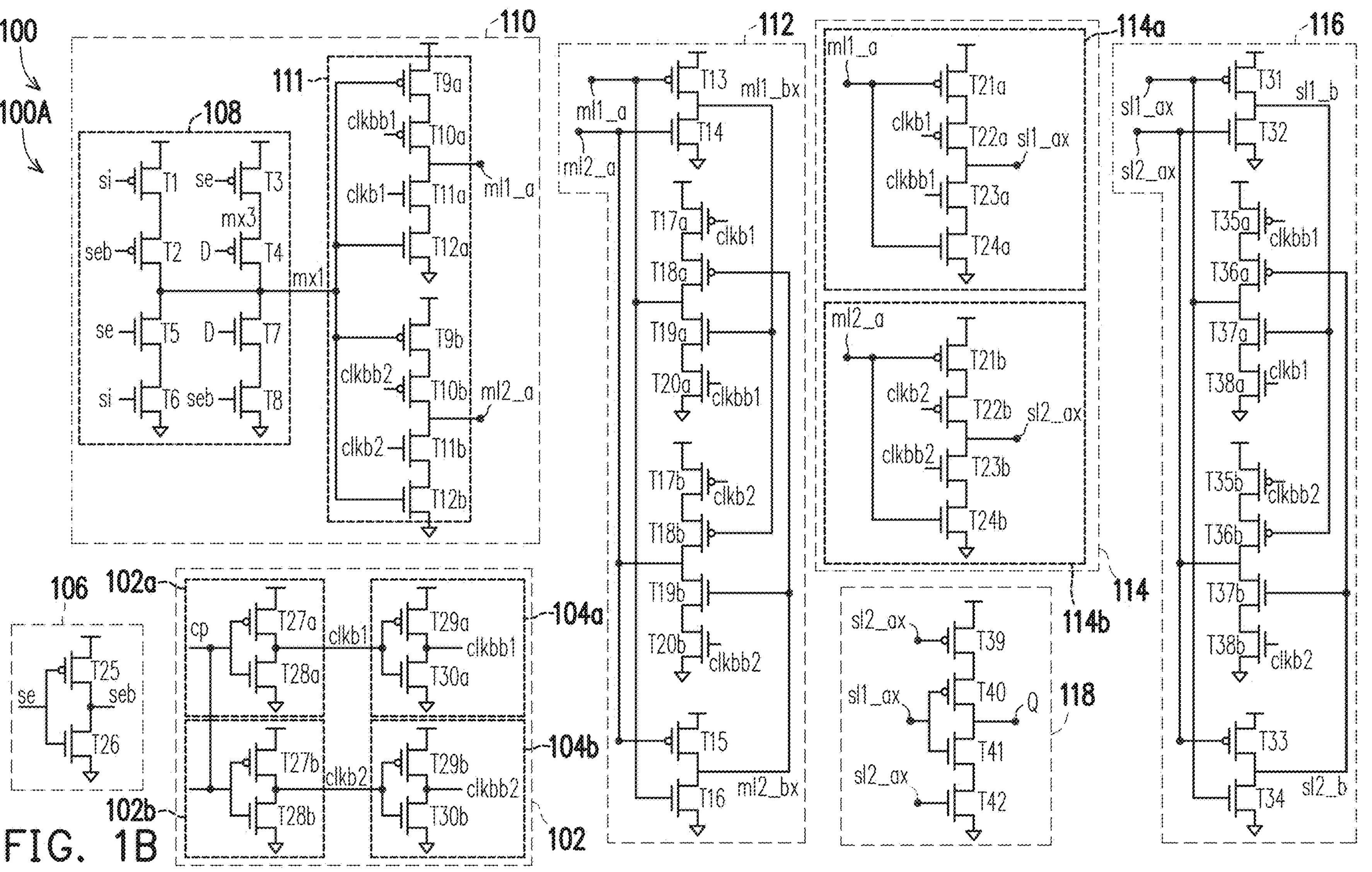
FIG. 1B is a circuit diagram of an integrated circuit, in accordance with some embodiments.
Figure 1C:
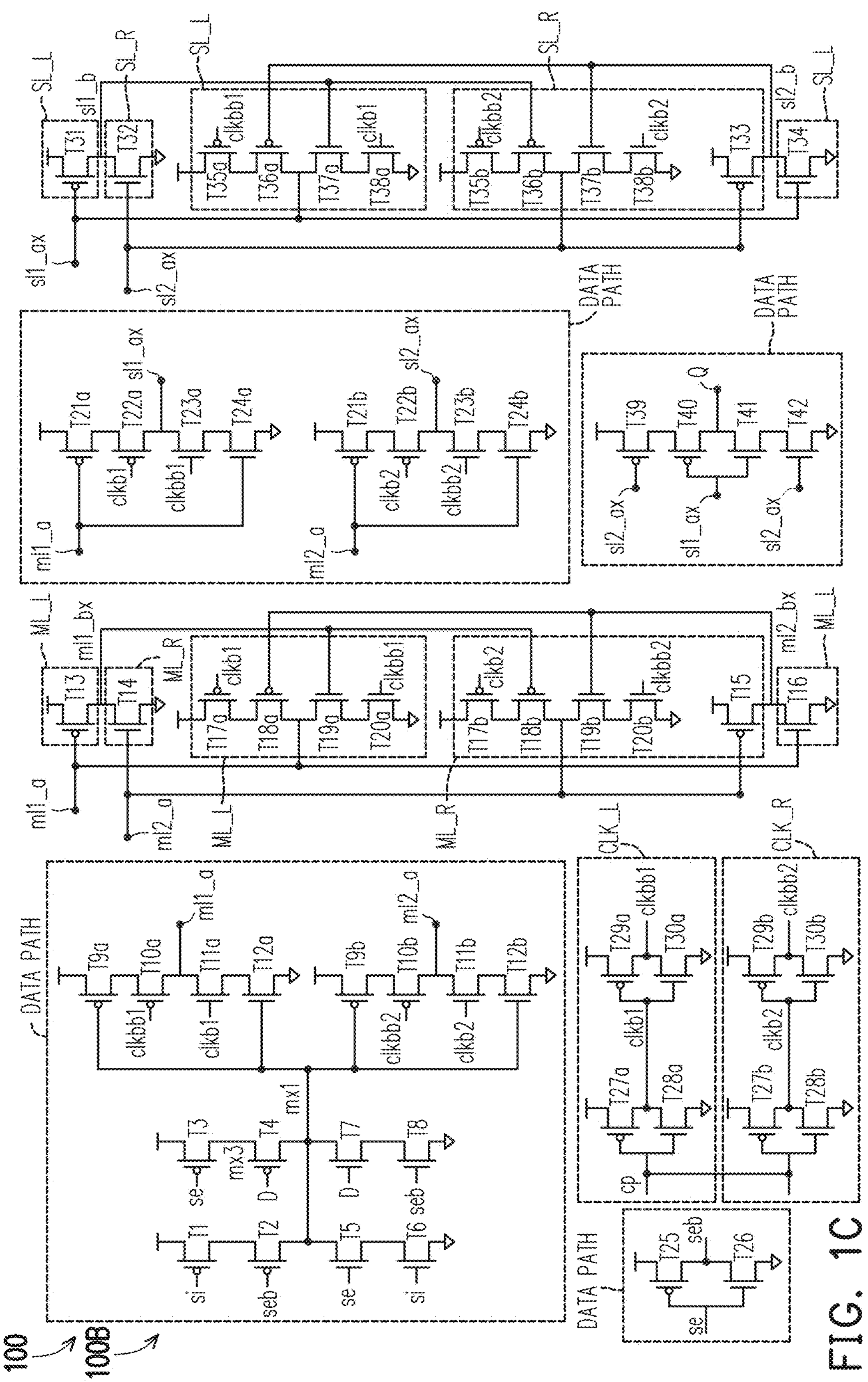
FIG. 1C is a circuit diagram of an integrated circuit, in accordance with some embodiments.

FIGS. 1A-1C are a diagram of an integrated circuit 100, in accordance with some embodiments. In some embodiments, integrated circuit 100 is a flip-flop circuit. In some embodiments, integrated circuit 100 is a multi-bit flip-flop (MBFF) circuit.

FIG. 1A is a block diagram of integrated circuit 100, in accordance with some embodiments. FIG. 1B is a portion 100A of the circuit diagram of integrated circuit 100, in accordance with some embodiments. FIG. 1C is a portion 100B of the circuit diagram of integrated circuit 100, simplified for ease of illustration.

Each of portion 100A and portion 100B include the same elements as each other, but some elements labelled in portion 100A or 100B are not labelled in corresponding portion 100B or 100A for ease of illustration.

Integrated circuit 100 is a flip-flop circuit. Integrated circuit 100 is configured to receive at least a data signal D' or a scan in signal si', and is configured to output an output signal Q'. In some embodiments, the data signal D' is a data input signal. In some embodiments, the scan in signal si' is a scan input signal. In some embodiments, the output signal Q' is a stored state of at least the data signal D' or the scan in signal si'. A flip-flop circuit is used for illustration, other types of circuits are within the scope of the present disclosure.

Integrated circuit 100 includes a clock buffer 102, an inverter 106, a scan circuit 110, a latch circuit 112, a stacked gate circuit 114, a latch circuit 116 and an output circuit 118.

In some embodiments, nodes of the same name are coupled together, but are not shown for ease of illustration.

An input terminal of clock buffer 102 is configured to receive clock signal cp' on a node cp. In the present disclosure, signals of a corresponding node are denoted with a common symbol as the corresponding node, except the signals further include an apostrophe (e.g., ') symbol. For example, the clock signal cp' corresponds to the signal of node cp.

An output terminal of clock buffer 102 is configured to output a clock signal clkb1', a clock signal clkbb1', a clock signal clkb2' and a clock signal clkbb2'. In some embodiments, clock signal clkb1' is inverted from clock signal cp', and vice versa. In some embodiments, clock signal clkbb1' is inverted from clock signal clkb1', and vice versa. In some embodiments, clock signal clkb2' is inverted from clock signal cp', and vice versa. In some embodiments, clock signal clkbb2' is inverted from clock signal clkb2', and vice versa.

Clock buffer 102 includes an inverter 102*a* coupled to an inverter 104*a*. Clock buffer 102 further includes an inverter 102*b* coupled to an inverter 104*b*.

An input terminal of inverter 102*a* is configured to receive clock signal cp' on node cp. In some embodiments, the node cp corresponds to at least the input terminal of inverter 102*a*.

An output terminal of inverter 102*a* is configured to output a clock signal clkb1' to at least an input terminal of inverter 104*a*.

The input terminal of inverter 104*a* is coupled to at least the output terminal of inverter 102*a*, and is configured to receive clock signal clkb1'. In some embodiments, the node clkb1 corresponds to at least one of the output terminal of inverter 102*a*, the input terminal of inverter 104*a*, a first clock input terminal of scan circuit 106, a first clock input terminal of latch circuit 112, a first clock input terminal of stacked gate circuit 114, or a first clock input terminal of latch circuit 116.

An output terminal of inverter 104*a* is configured to output the clock signal clkbb1. In some embodiments, the node clkbb1 corresponds to at least one of the output terminal of inverter 104*a*, a second clock input terminal of scan circuit 106, a second clock input terminal of latch circuit 112, a second clock input terminal of stacked gate circuit 114, or a second clock input terminal of latch circuit 116.

An input terminal of inverter 102*b* is configured to receive clock signal cp' on node cp. In some embodiments, the node cp corresponds to at least the input terminal of inverter 102*b*.

An output terminal of inverter 102*b* is configured to output a clock signal clkb2' to at least an input terminal of inverter 104*b*.

The input terminal of inverter 104*b* is coupled to at least the output terminal of inverter 102*b*, and is configured to receive clock signal clkb2'. In some embodiments, the node clkb2 corresponds to at least one of the output terminal of inverter 102*b*, the input terminal of inverter 104*b*, a third clock input terminal of scan circuit 106, a third clock input terminal of latch circuit 112, a third clock input terminal of stacked gate circuit 114, or a third clock input terminal of latch circuit 116.

An output terminal of inverter 104*b* is configured to output the clock signal clkbb2. In some embodiments, the node clkbb2 corresponds to at least one of the output terminal of inverter 104*b*, a fourth clock input terminal of scan circuit 106, a fourth clock input terminal of latch circuit 112, a fourth clock input terminal of stacked gate circuit 114, or a fourth clock input terminal of latch circuit 116.

An input terminal of inverter 106 is configured to receive the scan enable signal se'. In some embodiments, the input terminal of inverter 106 is coupled to a third input terminal (described below) of multiplexer 108. An output terminal of inverter 106 is configured to output the inverted scan enable signal seb'. In some embodiments, the output terminal of inverter 106 is coupled to a fourth input terminal of multiplexer 108.

In some embodiments, the node seb corresponds to at least one of the output terminal of inverter 106 and a fourth input terminal of multiplexer 108.

In some embodiments, the node se corresponds to at least one of the input terminal of inverter 106 and a third input terminal of multiplexer 108.

Scan circuit 110 includes multiplexer 108 coupled to a stacked gate circuit 111. Multiplexer 108 includes a first input terminal (e.g., node D) configured to receive the data signal D', a second input terminal (e.g., node si) configured to receive the scan in signal si', a third input terminal (e.g., node se) configured to receive a scan enable signal se', and a fourth input terminal (e.g., node seb) configured to receive an inverted scan enable signal seb'. Multiplexer 108 includes transistors T1-T8 (described below).

In some embodiments, a node D corresponds to at least a first input terminal of multiplexer 108 and a node si corresponds to at least a second input terminal of multiplexer 108.

In some embodiments, the scan enable signal se' is a selection signal of multiplexer 108, and the inverted scan enable signal seb' is an inverted selection signal of multiplexer 108. An output terminal of multiplexer 108 is coupled to an input terminal of stacked gate circuit 111. Multiplexer 108 is configured to output a signal mx1' to stacked gate circuit 111 on corresponding node mx1. In some embodiments, multiplexer 108 is coupled to inverter 106, and is configured to receive inverted scan enable signal seb'.

Stacked gate circuit 111 is coupled to clock buffer 102, multiplexer 108, latch circuit 112, and stacked gate circuit 114.

A first input terminal of stacked gate circuit 111 is coupled to and configured to receive signal mx1' from multiplexer 108 on node mx1.

A first output terminal of stacked gate circuit 111 is coupled to a first input terminal of latch circuit 112 and a first input terminal of stacked gate circuit 114 by node ml1_*a*. The first output terminal of stacked gate circuit 111 is configured to output a signal ml1_*a* to the first input terminal of latch circuit 112 and the first input terminal of stacked gate circuit 114 by node ml1_*a*.

A second output terminal of stacked gate circuit 111 is coupled to a second input terminal of latch circuit 112 and a second input terminal of stacked gate circuit 114 by node ml2_*a*. The second output terminal of stacked gate circuit 111 is configured to output a signal ml2_*a* to the second input terminal of latch circuit 112 and the second input terminal of stacked gate circuit 114 by node ml2_*a*.

In some embodiments, the node ml1_*a* corresponds to at least one of the first output terminal of stacked gate circuit 111, the first input terminal of latch circuit 112 or the first input terminal of stacked gate circuit 114.

In some embodiments, the node ml2_*a* corresponds to at least one of the second output terminal of stacked gate circuit 111, the second input terminal of latch circuit 112 or the second input terminal of stacked gate circuit 114.

Latch circuit 112 is coupled to clock buffer 102 and stacked gate circuit 111.

A first input terminal of latch circuit 112 is coupled to and configured to receive signal ml1_*a*' from stacked gate circuit 111 on node ml1_*a*.

A second input terminal of latch circuit 112 is coupled to and configured to receive signal m12_*a*' from stacked gate circuit 111 on node ml2_*a*.

Stacked gate circuit 114 is coupled to clock buffer 102, stacked gate circuit 111, latch circuit 116, and output circuit 118. In some embodiments, stacked gate circuit 114 is further coupled to latch circuit 112.

Stacked gate circuit 114 includes stacked gate circuits 114*a* and 114*b*.

A first input terminal of stacked gate circuit 114 is coupled to and configured to receive signal ml1_*a*' from stacked gate circuit 111 on node ml1_*a*.

A second input terminal of stacked gate circuit 114 is coupled to and configured to receive signal ml2_*a*' from stacked gate circuit 111 on node ml2_*a*.

A first output terminal of stacked gate circuit 114 is coupled to a first input terminal of latch circuit 116 and a first input terminal of output circuit 118 by node sl1_*ax*. The first output terminal of stacked gate circuit 114 is configured to output a signal sl1_*ax* to the first input terminal of latch circuit 116 and the first input terminal of output circuit 118 by node sl1_*ax*.

A second output terminal of stacked gate circuit 114 is coupled to a second input terminal of latch circuit 116 and a second input terminal of output circuit 118 by node sl2_*ax*. The second output terminal of stacked gate circuit 114 is configured to output a signal sl2_*ax* to the second input terminal of latch circuit 116 and the second input terminal of output circuit 118 by node sl2_*ax*.

In some embodiments, the node sl1_*ax* corresponds to at least one of the first output terminal of stacked gate circuit 114, the first input terminal of latch circuit 116 or the first input terminal of output circuit 118.

In some embodiments, the node sl2_*ax* corresponds to at least one of the second output terminal of stacked gate circuit 114, the second input terminal of latch circuit 116 and the second input terminal of output circuit 118.

Latch circuit 116 is coupled to clock buffer 102 and stacked gate circuit 114.

A first input terminal of latch circuit 116 is coupled to and configured to receive signal sl1_*ax*' from stacked gate circuit 111 on node sl1_*ax*.

A second input terminal of latch circuit 116 is coupled to and configured to receive signal sl2_*ax*' from stacked gate circuit 111 on node sl2_*ax*.

Output circuit 118 is coupled to clock buffer 102 and stacked gate circuit 114.

A first input terminal of output circuit 118 is coupled to and configured to receive signal sl1_*ax*' from stacked gate circuit 111 on node sl1_*ax*.

A second input terminal of output circuit 118 is coupled to and configured to receive signal sl2_*ax*' from stacked gate circuit 111 on node sl2_*ax*.

An output terminal of output circuit 118 is configured to output the output signal Q' on node Q.

Multiplexer 108 includes transistors T1-T8. In some embodiments, each of transistors T1, T2, T3 and T4 is a p-type metal oxide semiconductor (PMOS) transistor. In some embodiments, each of transistors T5, T6, T7 and T8 is an n-type metal oxide semiconductor (NMOS) transistor.

A gate terminal of transistor T1 is configured to receive scan in signal si'. A gate terminal of transistor T6 is configured to receive scan in signal si'. In some embodiments, the gate terminal of transistor T1 is coupled to the gate terminal of transistor T6.

A gate terminal of transistor T2 is configured to receive inverted scan enable signal seb'. A source terminal of transistor T1 is coupled to the voltage supply VDD. A drain terminal of transistor T1 is coupled to a source terminal of transistor T2.

A gate terminal of transistor T3 is configured to receive scan enable signal se'. A source terminal of transistor T3 is coupled to the voltage supply VDD. A drain terminal of transistor T3 is coupled to a source terminal of transistor T4.

A gate terminal of transistor T4 is configured to receive data signal D'. A gate terminal of transistor T7 is configured to receive data signal D'. In some embodiments, the gate terminal of transistor T4 is coupled to the gate terminal of transistor T7.

A source terminal of transistor T6 is coupled to the reference voltage supply VSS. A drain terminal of transistor T6 is coupled to a source terminal of transistor T5. A gate terminal of transistor T5 is configured to receive scan enable signal se'. In some embodiments, the gate terminal of transistor T5 is coupled to the gate terminal of transistor T3.

A source terminal of transistor T8 is coupled to the reference voltage supply VSS. A drain terminal of transistor T8 is coupled to a source terminal of transistor T7. A gate terminal of transistor T8 is configured to receive inverted scan enable signal seb'. In some embodiments, the gate terminal of transistor T8 is coupled to the gate terminal of transistor T2.

Each of a gate terminal of transistor T9*a*, a gate terminal of transistor T12*a*, a gate terminal of transistor T9*b*, a gate terminal of transistor T12*b*, the drain terminal of transistor T2, the drain terminal of transistor T4, the drain terminal of transistor T5 and the drain terminal of transistor T7 are coupled together at node mx1. Signal mx1' is the signal of at least one of the drain terminal of transistor T2, the drain terminal of transistor T4, the drain terminal of transistor T5 or the drain terminal of transistor T7.

Stacked gate circuit 111 includes transistors T9*a*, T10*a*, T11*a*, T12*a*, T9*b*, T10*b*, T11*b* and T12*b*. In some embodiments, each of transistors T9*a*, T10*a*, T9*b* and T10*b* is a PMOS transistor. In some embodiments, each of transistors T11*a*, T12*a*, T11*b* and T12*b* is an NMOS transistor.

Transistors T9*a*, T10*a*, T11*a* and T12*a* are configured as a stacked gate circuit configured to output signal ml1_*a*.

Transistors T9*b*, T10*b*, T11*b* and T12*b* are configured as a stacked gate circuit configured to output signal ml2_*a*.

Each of the gate terminal of transistor T9*a*, the gate terminal of transistor T12*a*, the gate terminal of transistor T9*b* and the gate terminal of transistor T12*b* is configured to receive signal mx1' at node mx1.

A gate terminal of transistor T10*a* is configured to receive clock signal clkbb1' at node clkbb1. The gate terminal of transistor T10*a* is coupled to a drain terminal of transistor T29*a* and a drain terminal of transistor T30*a* at node clkbb1.

A gate terminal of transistor T11*a* is configured to receive clock signal clkb1' at node clkb1. The gate terminal of transistor T11*a* is coupled to a drain terminal of transistor T27*a* and a drain terminal of transistor T28*a* at node clkb1.

A source terminal of transistor T9*a* is coupled to the voltage supply VDD. A drain terminal of transistor T9*a* is coupled to a source terminal of transistor T10*a*.

Each of a drain terminal of transistor T10*a*, a drain terminal of transistor T11*a*, a gate terminal of transistor T13, a gate terminal of transistor T16, a drain terminal of transistor T18*a*, a drain terminal of transistor T19*a*, a gate terminal of transistor T21*a* and a gate terminal of transistor T24*a* are coupled together at node ml1_*a*.

Signal ml1_*a* is the signal of at least the drain terminal of transistor T10*a*, the drain terminal of transistor T11*a*, the gate terminal of transistor T13, the gate terminal of transistor T16, the drain terminal of transistor T18*a*, the drain terminal of transistor T19*a*, the gate terminal of transistor T21*a* and the gate terminal of transistor T24*a*.

A source terminal of transistor T11*a* is coupled to a drain terminal of transistor T12*a*. A source terminal of transistor T12*a* is coupled to the reference voltage supply VSS.

A gate terminal of transistor T10*b* is configured to receive clock signal clkbb2' at node clkbb2. The gate terminal of transistor T10*b* is coupled to a drain terminal of transistor T29*b* and a drain terminal of transistor T30*b* at node clkbb2.

A gate terminal of transistor T11*b* is configured to receive clock signal clkb2' at node clkb2. The gate terminal of transistor T11*b* is coupled to a drain terminal of transistor T27*b* and a drain terminal of transistor T28*b* at node clkb2.

A source terminal of transistor T9*b* is coupled to the voltage supply VDD. A drain terminal of transistor T9*b* is coupled to a source terminal of transistor T10*b*.

Each of a drain terminal of transistor T10*b*, a drain terminal of transistor T11*b*, a gate terminal of transistor T14, a gate terminal of transistor T15, a drain terminal of transistor T18*b*, a drain terminal of transistor T19*b*, a gate terminal of transistor T21*b* and a gate terminal of transistor T24*b* are coupled together at node ml2_*a*.

Signal ml2_*a* is the signal of at least the drain terminal of transistor T10*b*, the drain terminal of transistor T11*b*, the gate terminal of transistor T14, the gate terminal of transistor T15, the drain terminal of transistor T18*b*, the drain terminal of transistor T19*b*, the gate terminal of transistor T21*b* and the gate terminal of transistor T24*b*.

A source terminal of transistor T11*b* is coupled to a drain terminal of transistor T12*b*. A source terminal of transistor T12*b* is coupled to the reference voltage supply VSS.

Latch circuit 112 includes transistors T13, T14, T15, T16, T17*a*, T18*a*, T19*a*, T20*a*, T17*b*, T18*b*, T19*b* and T20*b*. In some embodiments, each of transistors T13, T15, T17*a*, T18*a*, T17*b* and T18*b* is a PMOS transistor. In some embodiments, each of transistors T14, T16, T19*a*, T20*a*, T19*b* and T20*b* is an NMOS transistor.

Transistors T17*a*, T18*a*, T19*a* and T20*a* are configured as a stacked gate circuit configured to output signal ml1_*a*.

Transistors T17*b*, T18*b*, T19*b* and T20*b* are configured as a stacked gate circuit configured to output signal ml2_*a*.

Each of the gate terminal of transistor T13 and the gate terminal of transistor T16 is configured to receive signal ml1_*a*' at node ml1_*a*.

Each of the gate terminal of transistor T14 and the gate terminal of transistor T15 is configured to receive signal ml2_*a*' at node ml2_*a*.

A source terminal of transistor T13 is coupled to the voltage supply VDD. A source terminal of transistor T14 is coupled to the reference voltage supply VSS.

A drain terminal of transistor T13 and a drain terminal of transistor T14 are configured to output a signal ml1_*bx*' at node ml1_*bx*. Each of the drain terminal of transistor T13, the drain terminal of transistor T14, a gate terminal of transistor T19*a*, a gate terminal of transistor T18*b* are coupled together at node ml1_*bx*. The gate terminal of transistor T19*a* and the gate terminal of transistor T18*b* are configured to receive signal ml1_*bx*' at node ml1_*bx*.

A source terminal of transistor T15 is coupled to the voltage supply VDD. A source terminal of transistor T16 is coupled to the reference voltage supply VSS.

A drain terminal of transistor T15 and a drain terminal of transistor T16 are configured to output a signal ml2_*bx*' at node ml2_*bx*. Each of the drain terminal of transistor T15, the drain terminal of transistor T16, a gate terminal of transistor T19*b*, a gate terminal of transistor T18*a* are coupled together at node ml2_*bx*. The gate terminal of transistor T19*b* and the gate terminal of transistor T18*a* are configured to receive signal ml2_*bx*' at node ml2_*bx*.

A gate terminal of transistor T17*a* is configured to receive clock signal clkb1' at node clkb1. The gate terminal of transistor T17*a* is coupled to a drain terminal of transistor T27*a* and a drain terminal of transistor T28*a* at node clkb1.

A gate terminal of transistor T20*a* is configured to receive clock signal clkbb1 at node clkbb1. The gate terminal of transistor T20*a* is coupled to a drain terminal of transistor T29*a* and a drain terminal of transistor T30*a* at node clkbb1.

A source terminal of transistor T17*a* is coupled to the voltage supply VDD.

A drain terminal of transistor T17*a* is coupled to a source terminal of transistor T18*a*.

A source terminal of transistor T19*a* is coupled to a drain terminal of transistor T20*a*.

A source terminal of transistor T20*a* is coupled to the reference voltage supply VSS.

A gate terminal of transistor T17*b* is configured to receive clock signal clkb2' at node clkb2. The gate terminal of transistor T17*b* is coupled to a drain terminal of transistor T27*b* and a drain terminal of transistor T28*b* at node clkb2.

A gate terminal of transistor T20*b* is configured to receive clock signal clkbb2 at node clkbb2. The gate terminal of transistor T20*b* is coupled to a drain terminal of transistor T29*b* and a drain terminal of transistor T30*b* at node clkbb2.

A source terminal of transistor T17*b* is coupled to the voltage supply VDD.

A drain terminal of transistor T17*b* is coupled to a source terminal of transistor T18*b*.

A source terminal of transistor T19*b* is coupled to a drain terminal of transistor T20*b*.

A source terminal of transistor T20*b* is coupled to the reference voltage supply VSS.

Stacked gate circuit 114 includes stacked gate circuit 114*a* and stacked gate circuit 114*b*.

Stacked gate circuit 114 includes transistors T21*a*, T22*a*, T23*a*, T24*a*, T21*b*, T22*b*, T23*b* and T24*b*. In some embodiments, each of transistors T21*a*, T22*a*, T21*b* and T22*b* is a PMOS transistor. In some embodiments, each of transistors T23*a*, T24*a*, T23*b* and T24*b* is an NMOS transistor.

Transistors T21*a*, T22*a*, T23*a* and T24*a* are configured as a stacked gate circuit 114*a* configured to output signal sl1_*ax*.

Transistors T21*b*, T22*b*, T23*b* and T24*b* are configured as a stacked gate circuit 114*b* configured to output signal sl2_*ax*.

Each of the gate terminal of transistor T21*a* and the gate terminal of transistor T24*a* is configured to receive signal ml1_*a*' at node ml1_*a*.

Each of the gate terminal of transistor T21*b* and the gate terminal of transistor T24*b* is configured to receive signal ml2_*a*' at node ml2_*a*.

A gate terminal of transistor T22*a* is configured to receive clock signal clkb1' at node clkb1. The gate terminal of transistor T22*a* is coupled to a drain terminal of transistor T27*a* and a drain terminal of transistor T28*a* at node clkb1.

A gate terminal of transistor T23*a* is configured to receive clock signal clkbb1' at node clkbb1. The gate terminal of transistor T23*a* is coupled to a drain terminal of transistor T29*a* and a drain terminal of transistor T30*a* at node clkbb1.

A source terminal of transistor T21*a* is coupled to the voltage supply VDD. A drain terminal of transistor T21*a* is coupled to a source terminal of transistor T22*a*.

Each of a drain terminal of transistor T22*a*, a drain terminal of transistor T23*a*, a gate terminal of transistor T31, a gate terminal of transistor T34, a drain terminal of transistor T36*a*, a drain terminal of transistor T37*a*, a gate terminal of transistor T40 and a gate terminal of transistor T41 are coupled together at node sl1_*ax*.

Signal sl1_*ax* is the signal of at least the drain terminal of transistor T22*a*, the drain terminal of transistor T23*a*, the gate terminal of transistor T31, the gate terminal of transistor T34, the drain terminal of transistor T36*a*, the drain terminal of transistor T37*a*, the gate terminal of transistor T40 and the gate terminal of transistor T41.

A source terminal of transistor T23*a* is coupled to a drain terminal of transistor T24*a*. A source terminal of transistor T24*a* is coupled to the reference voltage supply VSS.

A gate terminal of transistor T22*b* is configured to receive clock signal clkb2' at node clkb2. The gate terminal of transistor T22*b* is coupled to a drain terminal of transistor T27*b* and a drain terminal of transistor T28*b* at node clkb2.

A gate terminal of transistor T23*b* is configured to receive clock signal clkbb2' at node clkbb2. The gate terminal of transistor T23*b* is coupled to a drain terminal of transistor T29*b* and a drain terminal of transistor T30*b* at node clkbb2.

A source terminal of transistor T21*b* is coupled to the voltage supply VDD. A drain terminal of transistor T21*b* is coupled to a source terminal of transistor T22*b*.

Each of a drain terminal of transistor T22*b*, a drain terminal of transistor T23*b*, a gate terminal of transistor T32, a gate terminal of transistor T33, a drain terminal of transistor T36*b*, a drain terminal of transistor T37*b*, a gate terminal of transistor T39 and a gate terminal of transistor T42 are coupled together at node sl2_*ax*.

Signal sl2_*ax* is the signal of at least the drain terminal of transistor T22*b*, the drain terminal of transistor T23*b*, the gate terminal of transistor T32, the gate terminal of transistor T33, the drain terminal of transistor T36*b*, the drain terminal of transistor T37*b* the gate terminal of transistor T39 and the gate terminal of transistor T42.

A source terminal of transistor T23*b* is coupled to a drain terminal of transistor T24*b*. A source terminal of transistor T24*b* is coupled to the reference voltage supply VSS.

Latch circuit 116 includes transistors T31, T32, T33, T34, T35*a*, T36*a*, T37*a*, T38*a*, T35*b*, T36*b*, T37*b* and T38*b*. In some embodiments, each of transistors T31, T33, T35*a*, T36*a*, T35*b* and T36*b* is a PMOS transistor. In some embodiments, each of transistors T32, T34, T37*a*, T38*a*, T37*b* and T38*b* is an NMOS transistor.

Transistors T35*a*, T36*a*, T37*a* and T38*a* are configured as a stacked gate circuit configured to output signal sl1_*ax'*.

Transistors T35*b*, T36*b*, T37*b* and T38*b* are configured as a stacked gate circuit configured to output signal sl2_*ax'*.

Each of the gate terminal of transistor T31 and the gate terminal of transistor T34 is configured to receive signal sl1_*ax*' at node sl1_*ax*.

Each of the gate terminal of transistor T32 and the gate terminal of transistor T33 is configured to receive signal sl2_*ax*' at node sl2_*ax*.

A source terminal of transistor T31 is coupled to the voltage supply VDD. A source terminal of transistor T32 is coupled to the reference voltage supply VSS.

A drain terminal of transistor T31 and a drain terminal of transistor T32 are configured to output a signal sl1_*b*' at node sl1_*b*. Each of the drain terminal of transistor T31, the drain terminal of transistor T32, a gate terminal of transistor T37*a*, a gate terminal of transistor T36*b* are coupled together at node sl1_*b*. The gate terminal of transistor T37*a* and the gate terminal of transistor T36*b* are configured to receive signal sl1_*b*' at node sl1_*b*.

A source terminal of transistor T33 is coupled to the voltage supply VDD. A source terminal of transistor T34 is coupled to the reference voltage supply VSS.

A drain terminal of transistor T33 and a drain terminal of transistor T34 are configured to output a signal sl2_*b*' at node sl2_*b*. Each of the drain terminal of transistor T33, the drain terminal of transistor T34, a gate terminal of transistor T37*b*, a gate terminal of transistor T36*a* are coupled together at node sl2_*b*. The gate terminal of transistor T37*b* and the gate terminal of transistor T36*a* are configured to receive signal sl2_*b*' at node sl2_*b*.

A gate terminal of transistor T35*a* is configured to receive clock signal clkbb1' at node clkbb1. The gate terminal of transistor T35*a* is coupled to a drain terminal of transistor T29*a* and a drain terminal of transistor T30*a* at node clkbb1.

A gate terminal of transistor T38*a* is configured to receive clock signal clkb1 at node clkb1. The gate terminal of transistor T38*a* is coupled to a drain terminal of transistor T27*a* and a drain terminal of transistor T28*a* at node clkb1.

A source terminal of transistor T35*a* is coupled to the voltage supply VDD.

A drain terminal of transistor T35*a* is coupled to a source terminal of transistor T36*a*.

A source terminal of transistor T37*a* is coupled to a drain terminal of transistor T38*a*.

A source terminal of transistor T38*a* is coupled to the reference voltage supply VSS.

A gate terminal of transistor T35*b* is configured to receive clock signal clkbb2' at node clkbb2. The gate terminal of transistor T35*b* is coupled to a drain terminal of transistor T29*b* and a drain terminal of transistor T30*b* at node clkbb2.

A gate terminal of transistor T38*b* is configured to receive clock signal clkb2 at node clkb2. The gate terminal of transistor T38*b* is coupled to a drain terminal of transistor T27*b* and a drain terminal of transistor T28*b* at node clkb2.

A source terminal of transistor T35*b* is coupled to the voltage supply VDD.

A drain terminal of transistor T35*b* is coupled to a source terminal of transistor T36*b*.

A source terminal of transistor T37*b* is coupled to a drain terminal of transistor T38*b*.

A source terminal of transistor T38*b* is coupled to the reference voltage supply VSS.

Output circuit 118 includes transistors T39, T40, T41 and T42. In some embodiments, each of transistors T39 and T40 is a PMOS transistor. In some embodiments, each of transistors T41 and T42 is an NMOS transistor.

Each of the gate terminal of transistor T39 and the gate terminal of transistor T42 is configured to receive signal sl2_*ax*' at node sl2_*ax*. The gate terminal of transistor T39 and the gate terminal of transistor T42 are coupled together at node sl2_*ax*.

Each of the gate terminal of transistor T40 and the gate terminal of transistor T41 is configured to receive signal sl1_*ax*' at node sl1_*ax*. The gate terminal of transistor T40 and the gate terminal of transistor T41 are coupled together at node sl1_*ax*.

A source terminal of transistor T39 is coupled to the voltage supply VDD. A drain terminal of transistor T39 is coupled to a source terminal of transistor T40.

Each of a drain terminal of transistor T40 and a drain terminal of transistor T41 are coupled together at output node Q, and are configured to output the output signal Q'.

Output signal Q' is the signal of at least the drain terminal of transistor T40 and the drain terminal of transistor T41. Output signal Q' is the signal of at least the output node Q.

A source terminal of transistor T41 is coupled to a drain terminal of transistor T42. A source terminal of transistor T42 is coupled to the reference voltage supply VSS.

Clock buffer 102 includes transistors T27*a*, T27*b*, T28*a*, T28*b*, T29*a*, T29*b*, T30*a* and T30*b*. In some embodiments, each of transistors T27*a*, T27*b*, T29*a* and T29*b* is a PMOS transistor. In some embodiments, each of transistors T28*a*, T28*b*, T30*a* and T30*b* is an NMOS transistor.

Transistors T27*a* and T28*a* are configured as an inverter 102*a* configured to output signal clkb1'. Transistors T29*a* and T30*a* are configured as an inverter 104*a* configured to output signal clkbb1'.

Transistors T27*b* and T28*b* are configured as an inverter 102*b* configured to output signal clkb2'. Transistors T29*b* and T30*b* are configured as an inverter 104*b* configured to output signal clkbb2'.

A gate terminal of transistor T27*a* and a gate terminal of transistor T28*a* are configured to receive clock signal cp' at node cp. Each of the gate terminals of transistor T27*a*, transistor T28*a*, transistor T27*b* and transistor T28*b* are coupled together. A source terminal of transistor T27*a* is coupled to the voltage supply VDD. A drain terminal of transistor T27*a* and a drain terminal of transistor T28*a* are coupled together, and are configured to output clock signal clkb1'. A source terminal of transistor T28*a* is coupled to the reference voltage supply VSS.

Each of the drain terminal of transistor T27*a*, the drain terminal of transistor T28*a*, a gate terminal of transistor T29*a* and a gate terminal of transistor T30*a* are coupled together at node clkb1. The gate terminal of transistor T29*a* and the gate terminal of transistor T30*a* are configured to receive clock signal clkb1'. A source terminal of transistor T29*a* is coupled to the voltage supply VDD. A drain terminal of transistor T29*a* and a drain terminal of transistor T30*a* are coupled together at node clkbb1, and are configured to output clock signal clkbb1'. A source terminal of transistor T30*a* is coupled to the reference voltage supply VSS.

A gate terminal of transistor T27*b* and a gate terminal of transistor T28*b* are configured to receive clock signal cp' at node cp. A source terminal of transistor T27*b* is coupled to the voltage supply VDD. A drain terminal of transistor T27*b* and a drain terminal of transistor T28*b* are coupled together, and are configured to output clock signal clkb2'. A source terminal of transistor T28*b* is coupled to the reference voltage supply VSS.

Each of the drain terminal of transistor T27*b*, the drain terminal of transistor T28*b*, a gate terminal of transistor T29*b* and a gate terminal of transistor T30*b* are coupled together at node clkb2. The gate terminal of transistor T29*b* and the gate terminal of transistor T30*b* are configured to receive clock signal clkb2'. A source terminal of transistor T29*b* is coupled to the voltage supply VDD. A drain terminal of transistor T29*b* and a drain terminal of transistor T30*b* are coupled together at node clkbb2, and are configured to output clock signal clkbb2'. A source terminal of transistor T30*b* is coupled to the reference voltage supply VSS.

Inverter 106 includes transistors T25-T26. In some embodiments, transistor T25 is a PMOS transistor. In some embodiments, transistor T26 is an NMOS transistor.

A gate terminal of transistor T25 and a gate terminal of transistor T26 are configured to receive scan enable signal se'. The gate terminals of transistor T25 and transistor T26 are coupled together at node se. A source terminal of transistor T25 is coupled to the voltage supply VDD. A drain terminal of transistor T25 and a drain terminal of transistor T26 are coupled together at node seb, and are configured to output inverted scan enable signal seb'. A source terminal of transistor T26 is coupled to the reference voltage supply VSS.

Other configurations, arrangements or other circuits in portion 100A of integrated circuit 100 are within the scope of the present disclosure.

FIG. 1C is a portion 100B of the circuit diagram of integrated circuit 100, simplified for ease of illustration.

Each of portion 100A and portion 100B include the same elements as each other, but some elements labelled in portion 100A or 100B are not labelled in corresponding portion 100B or 100A for ease of illustration.

As shown in FIG. 1C, portion 100B of integrated circuit 100 is divided or grouped into regions DATA PATH, CLK_L, CLK_R, ML_L, ML_R, SL_L, SL_R.

Region DATA PATH includes to inverter 106, scan circuit 110, stacked gate circuit 114 and output circuit 118.

Region CLK_L includes inverter 102*a* and inverter 104*a*.

Region CLK_R includes inverter 102*b* and inverter 104*b*.

Region ML_L includes a first portion of latch circuit 112. The first portion of latch circuit 112 includes transistors T13, T16, T17*a*, T18*a*, T19*a* and T20*a*.

Region ML_R includes a second portion of latch circuit 112. The second portion of latch circuit 112 includes transistors T14, T15, T17*b*, T18*b*, T19*b* and T20*b*.

Region SL_L includes a first portion of latch circuit 116. The first portion of latch circuit 116 includes transistors T31, T34, T35*a*, T36*a*, T37*a* and T38*a*.

Region SL_R includes a second portion of latch circuit 116. The second portion of latch circuit 116 includes transistors T32, T33, T35*b*, T36*b*, T37*b* and T38*b*.

In some embodiments, as shown in FIG. 1C, integrated circuit 100 are grouped into regions DATA PATH, CLK_L, CLK_R, ML_L, ML_R, SL_L, or SL_R based on at least the circuit functions and the sensitivity to a single-event upset (SEU) or a single-event error (SEE) caused by one or more ionizing particles (electrons, ions, photons, etc.) striking one or more sensitive nodes within the corresponding region.

By grouping integrated circuit 100 into regions DATA PATH, CLK_L, CLK_R, ML_L, ML_R, SL_L, SL_R, regions that are sensitive to a single-event upset (SEU) or a single-event error (SEE) caused by one or more ionizing particles (electrons, ions, photons, etc.) striking one or more sensitive nodes can be separated from each other by distances (D1*a*, D1*b*, D2*a*, D2*b*, D3*a*, D3*b*, etc. shown in FIGS. 2A-5D) thus reducing the likelihood of an SEU or SEE at both regions at the same time and increasing reliability and accuracy compared to other approaches.

For example, in some embodiments, at least one of region ML_L or SL_L and at least one of region ML_R or SL_R are determined to include sensitive nodes that are susceptible to SEU or SEE, and thus at least one of region ML_L or SL_L and at least one of region ML_R or SL_R are separated from each other by at least a distance D1*a* or D1*b* (shown in FIGS. 2A-5D) thus reducing the likelihood of an SEU or SEE at both regions at the same time and increasing reliability and accuracy compared to other approaches.

For example, in some embodiments, region CLK_L and region CLK_R are determined to include sensitive nodes that are susceptible to SEU or SEE, and thus region CLK_L and region CLK_R are separated from each other by at least a distance D2*a* or D2*b* (shown in FIGS. 2A-5D) thus reducing the likelihood of an SEU or SEE at both regions CLK_L and CLK_R at the same time and increasing reliability and accuracy compared to other approaches.

In some embodiments, integrated circuit 100 is configured to provide reliability over other approaches by having a left path (e.g., regions CLK_L, ML_L and SL_L) and a right path (e.g., regions CLK_R, ML_R and SL_R) that are interlocked with each other, and by separating sensitive nodes from each other by corresponding distances D1*a*, D1*b*, D2*a* or D2*b*.

For example, in some embodiments, region ML_L and region ML_R are duplicates of each other such that an SEU or an SEE that causes at least one flipped bit of data in one of region ML_L or region ML_R will not affect corresponding data of the other of region ML_L or region ML_R, and thus the other of region ML_L or region ML_R can correct the flipped bit of data and provide redundancy.

For example, in some embodiments, region SL_L and region SL_R are duplicates of each other such that an SEU or an SEE that causes at least one flipped bit of data in one of region SL_L or region SL_R will not affect corresponding data of the other of region SL_L or region SL_R, and thus the other of region SL_L or region SL_R can correct the flipped bit of data and provide redundancy.

For example, in some embodiments, region CLK_L and region CLK_R are duplicates of each other such that an SEU or an SEE that causes at least one flipped bit of data in one of region CLK_L or region CLK_R will not affect corresponding data of the other of region CLK_L or region CLK_R, and thus the other of region CLK_L or region CLK_R can correct the flipped bit of data and provide redundancy.

In some embodiments, one or more NMOS transistors are changed to one or more PMOS transistors, and vice versa. In some embodiments, one or more of the drains or sources are flipped with the other.

Other groupings, configurations, arrangements or other circuits in portion 100B of integrated circuit 100 are within the scope of the present disclosure.

Other configurations, arrangements or other circuits in integrated circuit 100 are within the scope of the present disclosure.

Figure 2A:
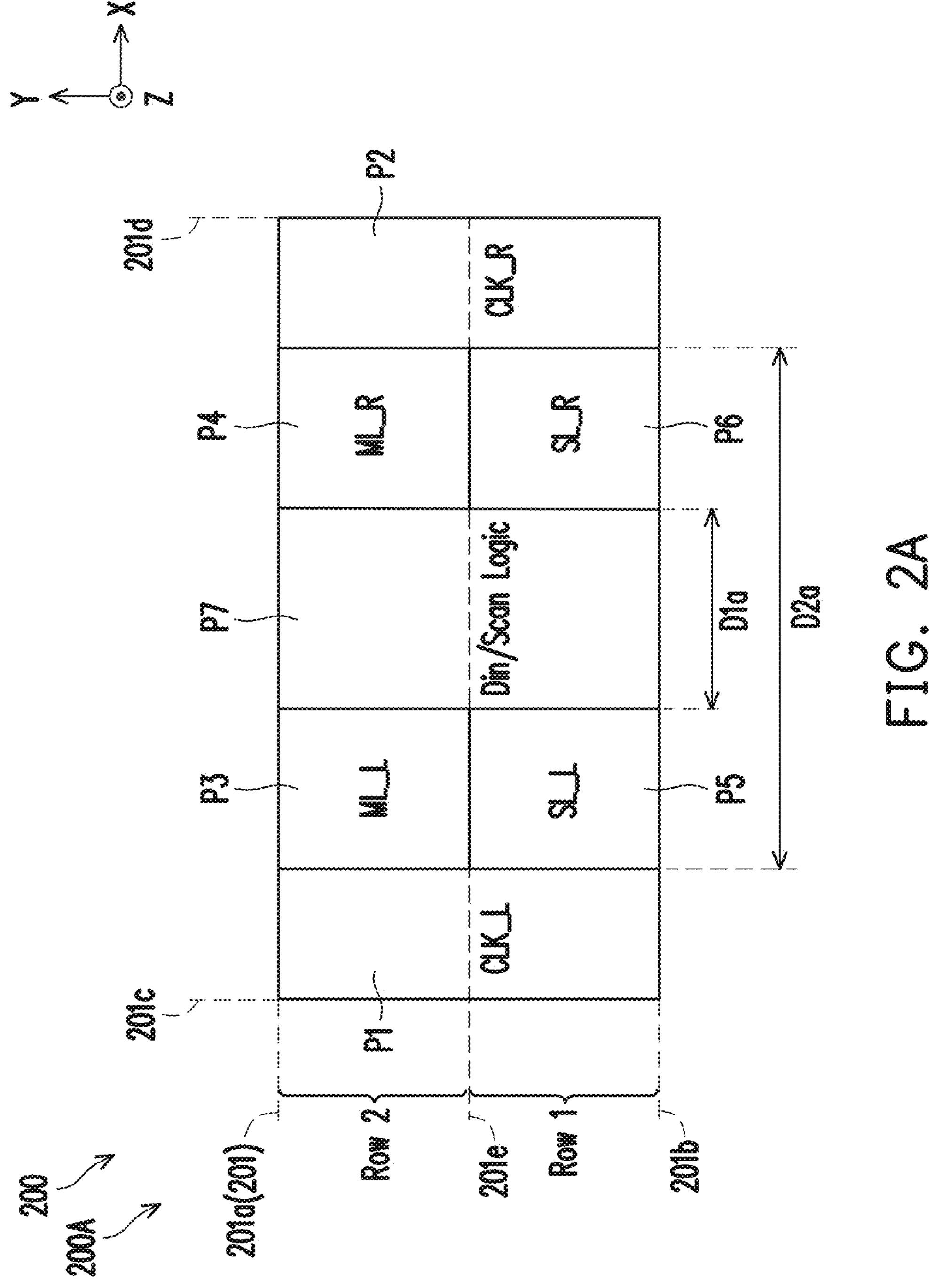
FIG. 2A is a diagram of a floorplan of an integrated circuit, in accordance with some embodiments.

FIG. 2A is a diagram of a floorplan 200A of an integrated circuit, in accordance with some embodiments.

In some embodiments, floorplan 200A is a floorplan of portion 100A of integrated circuit 100 of FIG. 1B or portion 100B of integrated circuit 100 of FIG. 1C. In some embodiments, floorplan 200A is a floorplan of integrated circuit 300 of FIGS. 3A-3E. In some embodiments, floorplan 200A corresponds to the layout 200 shown in FIGS. 2B-2E.

Floorplan 200A includes a first clock region P1, a second clock region P2, a first master latch region P3, a second master latch region P4, a first slave latch region P5, a second slave latch region P6, and a data input/scan logic region P7.

In some embodiments, the first clock region P1 corresponds to region CLK_L or inverter 102*a* and inverter 104*a*, the second clock region P2 corresponds to region CLK_R or inverter 102*b* and inverter 104*b*, the first master latch region P3 corresponds to region ML_L or the first portion of latch circuit 112, the second master latch region P4 corresponds to region ML_R or the second portion of latch circuit 112, the first slave latch region P5 corresponds to region SL_L or the first portion of latch circuit 116, the second slave latch region P6 corresponds to region SL_R or the second portion of latch circuit 116, and the data input/scan logic region P7 corresponds to Region DATA PATH or inverter 106, scan circuit 110, stacked gate circuit 114 and output circuit 118, and similar detailed description is therefore omitted.

Floorplan 200A has two rows extending in a first direction X, and being separated from each other in a second direction Y. In some embodiments, the second direction Y is different from the first direction X.

Each of the first slave latch region P5 and the second slave latch region P6 are in a first row (e.g., ROW1). Each of the first master latch region P3 and the second master latch region P4 are in a second row (e.g., ROW2). Each of the first clock region P1, the second clock region P2, and the data input/scan logic region P7 are in the first row (e.g., ROW1) and the second row (e.g., ROW2).

In some embodiments, by positioning the first slave latch region P5 in the first row (e.g., ROW1) of floorplan 200A, and the second slave latch region P6 in the first row (e.g., ROW1) of floorplan 200A, causes integrated circuit 200 to have better routing efficiency thereby increasing the speed of integrated circuit 200 compared to other approaches.

In some embodiments, by positioning the first master latch region P3 in the second row (e.g., ROW2) of floorplan2, and the second master latch region P4 in the second row (e.g., ROW2) of floorplan 200A, causes integrated circuit 200 to have better routing efficiency thereby increasing the speed of integrated circuit 200 compared to other approaches.

The first master latch region P3 is between the first clock region P1 and the data input/scan logic region P7. The second master latch region P4 is between the second clock region P2 and the data input/scan logic region P7.

The first slave latch region P5 is between the first clock region P1 and the data input/scan logic region P7. The second slave latch region P6 is between the second clock region P2 and the data input/scan logic region P7.

The first master latch region P3 and the first slave latch region P5 are adjacent to each of the first clock region P1 and the data input/scan logic region P7. In some embodiments, adjacent elements are directly next to each other.

The second master latch region P4 and the second slave latch region P6 are adjacent to each of the second clock region P2 and the data input/scan logic region P7.

In some embodiments, at least one of the first master latch region P3 or the first slave latch region P5 is separated from at least one of the second master latch region P4 or the second slave latch region P6 by at least a distance D1*a*.

In some embodiments, at least one of the distance D1*a* or D1*b* (shown in FIGS. 3A-3B) is greater than or equal to a first range. In some embodiments, the first range is 400 nanometers (nm) or greater. Other ranges or values for the first range are within the scope of the present disclosure.

In some embodiments, if at least one of the distance D1*a* or D1*b* is greater than or equal to the first range, then at least one of the first master latch region P3 or the first slave latch region P5 and at least one of the second master latch region P4 or the second slave latch region P6 are sufficiently separated from each other, thereby decreasing the likelihood of an SEU or SEE at both regions (e.g., at least one of the first master latch region P3 or the first slave latch region P5 and at least one of the second master latch region P4 or the second slave latch region P6) at the same time, thus increasing reliability and accuracy of floorplan 200A, layout design 200 or integrated circuit 300 compared to other approaches.

In some embodiments, if at least one of the distance D1*a* or D1*b* is less than the first range, then at least one of the first master latch region P3 or the first slave latch region P5 and at least one of the second master latch region P4 or the second slave latch region P6 are not sufficiently separated from each other, thereby increasing the likelihood of an SEU or SEE at both regions (e.g., at least one of the first master latch region P3 or the first slave latch region P5 and at least one of the second master latch region P4 or the second slave latch region P6) at the same time, thus decreasing reliability and accuracy of floorplan 200A, layout design 200 or integrated circuit 300 compared to other approaches.

The first clock region P1 and the second clock region P2 are on opposite ends of the floorplan 200A from each other. In some embodiments, the first clock region P1 and the second clock region P2 are separated from each other by at least distance D2*a*, thus reducing the likelihood of an SEU or SEE at both the first clock region P1 and the second clock region P2 at the same time and increasing reliability compared to other approaches.

In some embodiments, at least one of the distance D2*a* or D2*b* (shown in FIGS. 3A-3B) is greater than or equal to a second range. In some embodiments, the second range is 800 nanometers (nm) or greater. Other ranges or values for the second range are within the scope of the present disclosure.

In some embodiments, if at least one of the distance D2*a* or D2*b* is greater than or equal to the second range, then the first clock region P1 and the second clock region P2 are sufficiently separated from each other, thereby decreasing the likelihood of an SEU or SEE at both regions (e.g., the first clock region P1 and the second clock region P2) at the same time, thus increasing reliability and accuracy of floorplan 200A, layout design 200 or integrated circuit 300 compared to other approaches.

In some embodiments, if at least one of the distance D2*a* or D2*b* is less than the second range, then the first clock region P1 and the second clock region P2 are not sufficiently separated from each other, thereby increasing the likelihood of an SEU or SEE at both regions (e.g., the first clock region P1 and the second clock region P2) at the same time, thus decreasing reliability and accuracy of floorplan 200A, layout design 200 or integrated circuit 300 compared to other approaches.

FIGS. 2B-2E are diagrams of a layout design 200 of an integrated circuit, in accordance with some embodiments. Layout design 200 is a layout diagram of at least portion 100A of integrated circuit 100 of FIG. 1B, portion 100B of integrated circuit 100 of FIG. 1C or integrated circuit 300 of FIGS. 3A-3F.

Figure 2B:
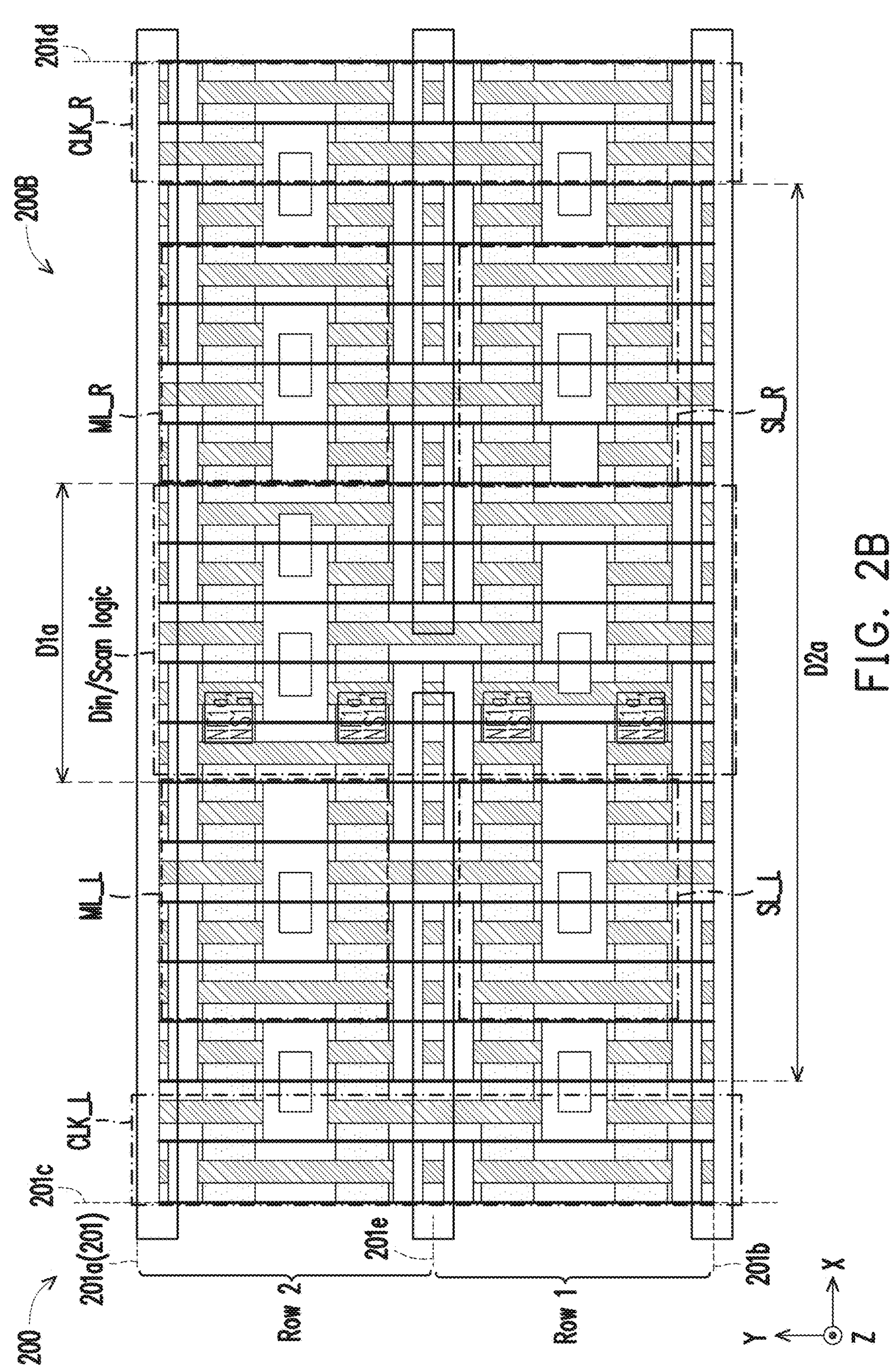
FIGS. 2B-2E are diagrams of a layout design of an integrated circuit, in accordance with some embodiments.

FIG. 2B is a diagram of a portion 200B of layout design 200 divided into the regions of floorplan 200A, simplified for ease of illustration.

Figure 2C:
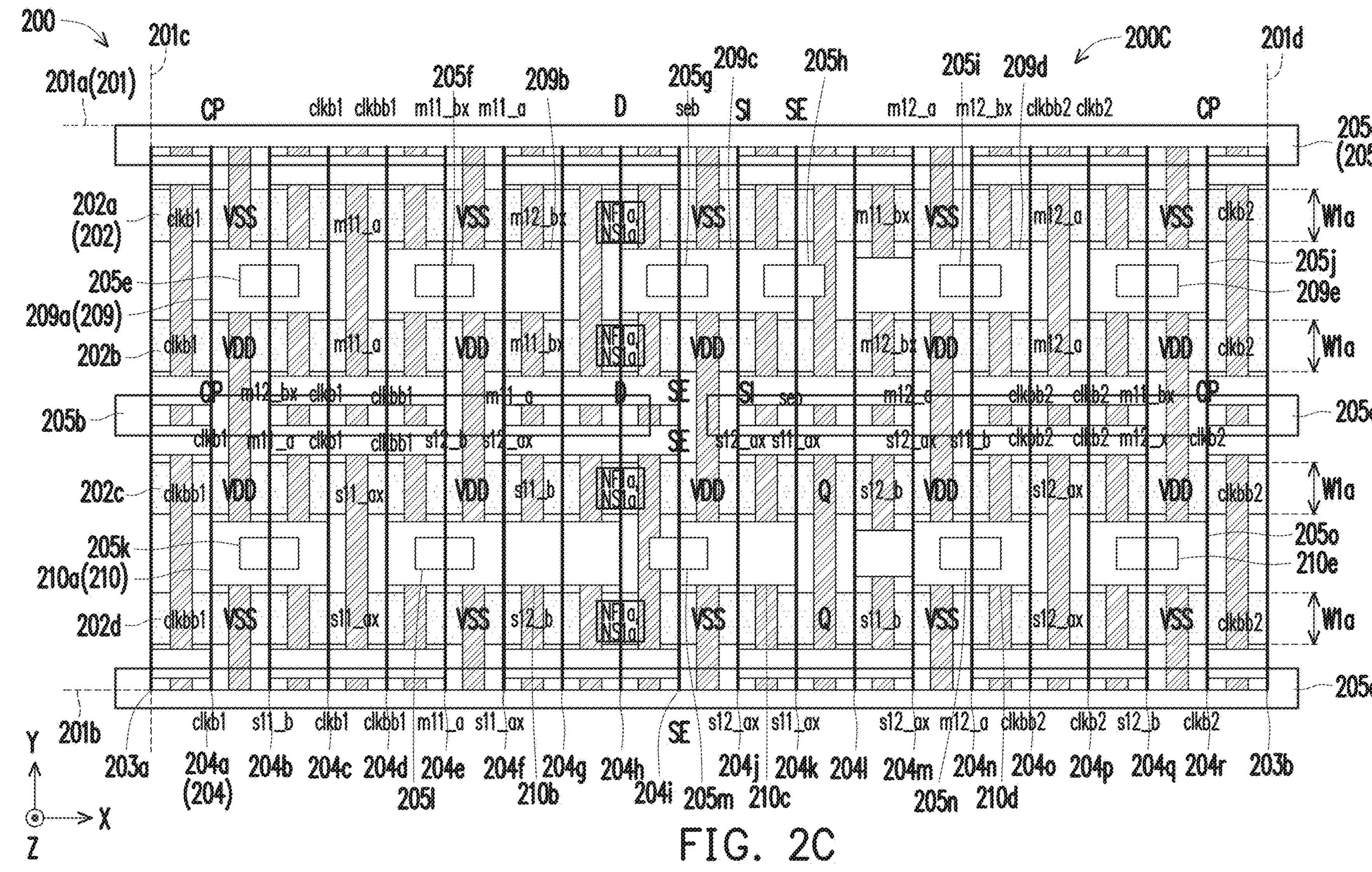

FIG. 2C is a diagram of a corresponding portion 200C of layout design 200, simplified for ease of illustration.

Figure 2D:
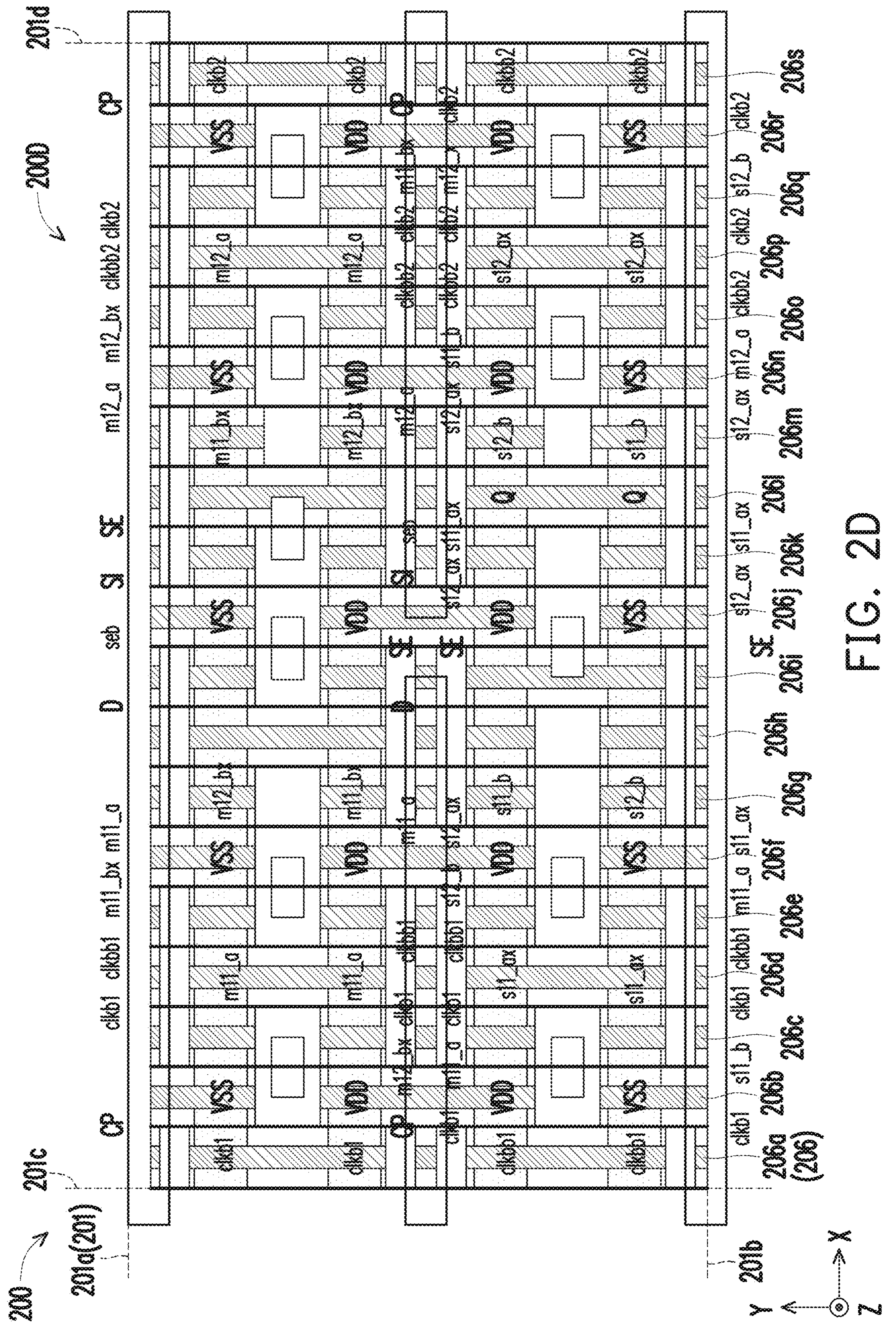

FIG. 2D is a diagram of a corresponding portion 200D of layout design 200, simplified for ease of illustration.

Figure 2E:
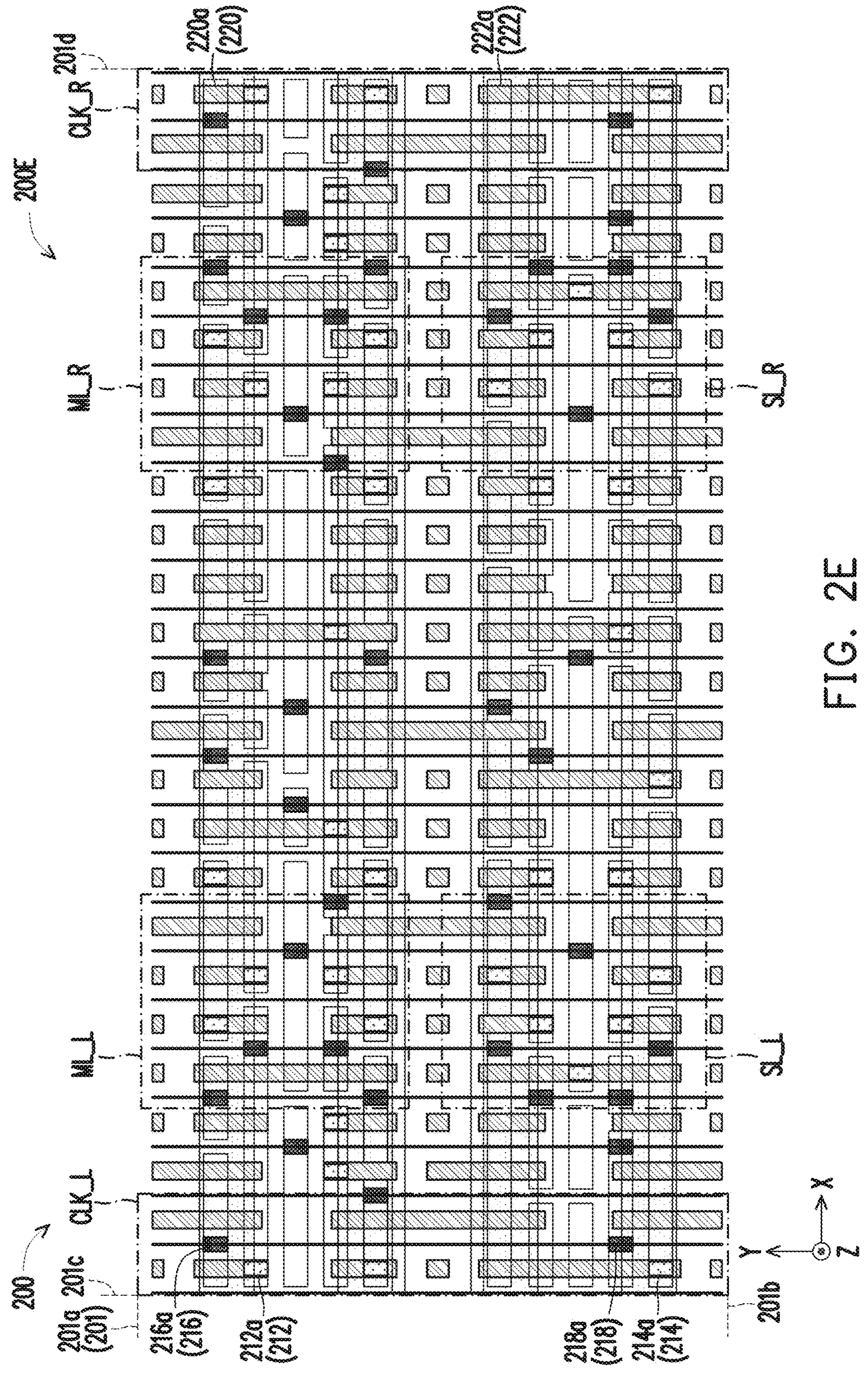

FIG. 2E is a diagram of a corresponding portion 200E of layout design 200, simplified for ease of illustration.

For ease of illustration, some of the labeled elements of one or more of FIGS. 2A-2E, 3A-3F, 4A-4E, 5A-5E and 6-10 are not labelled in one or more of FIGS. 2A-2E, 3A-3F, 4A-4E, 5A-5E and 6-10. In some embodiments, layout design 200 includes additional elements not shown in FIGS. 2A-2E.

Portion 200B includes one or more features of layout design 200 of an oxide diffusion (OD) level or an active level, a gate (POLY) level, a continuous poly over diffusion edge (CPODE) level, a cut-poly (CPO) level, a metal over diffusion (MD) level and a cut-MD (CMD) level of layout design 200.

Portion 200C includes one or more features of the OD level, the POLY level, the CPODE level, the CPO level, the MD level and the CMD level of layout design 200. Portion 200C is similar to portion 200B and portion 200D, and similar detailed description is therefore omitted. For example, in comparison with portion 200B and portion 200D, elements of the POLY level, the CPO level, and the CMD level of portion 200C are labelled in FIG. 2C, but are not labelled in portion 200B and portion 200D for ease of illustration.

Portion 200D includes one or more features of the OD level, the POLY level, the CPODE level, the CPO level, the MD level and the CMD level of layout design 200. Portion 200D is similar to portion 200B and portion 200C, and similar detailed description is therefore omitted. For example, in comparison with portion 200B and portion 200C, elements of the MD level in portion 200C are labelled in FIG. 2D, but are not labelled in portion 200C and portion 200D for ease of illustration.

Portion 200E includes one or more features of layout design 200 of the OD level, the POLY level, the CPODE level, the CPO level, the MD level and the CMD level, a via over gate (VG) level a via over diffusion (VD) level and a metal 0 (M0) level of layout design 200.

In some embodiments, layout design 200 includes additional elements not shown in FIGS. 2A-2E for ease of illustration. In some embodiments, at least one of integrated circuit 300, 400 or 500 includes additional elements not shown in FIGS. 2A-2E for ease of illustration.

Layout design 200 is usable to manufacture integrated circuit 100 of FIGS. 1B-1C. Layout design 200 is usable to manufacture integrated circuit 300 of FIGS. 3A-3F.

Layout design 200 corresponds to a cell 201. Cell 201 includes a cell boundary 201*a* and a cell boundary 201*b* that extend in a first direction X. Cell 201 further includes a cell boundary 201*c* and a cell boundary 201*d* that extend in a second direction Y. In some embodiments, the second direction Y is different from the first direction X. Cell 201 is divided into row 1 and row 2. A line 201*e* separates row 1 and row 2 of cell 201 from each other. Line 201*e* extends in the first direction X.

Cell 201 corresponds to a standard cell of portion 100A of integrated circuit 100 of FIG. 1B or portion 100B of integrated circuit 100B of FIG. 1C. In some embodiments, cell 201 is a standard cell of a flip-flop. In some embodiments, layout design 200 abuts other cell layout designs (not shown) along cell boundaries 201*a* and 201*b*, and along cell boundaries 201*c* and 201*d* that extend in the second direction Y. In some embodiments, layout design 200 is a double height standard cell.

In some embodiments, layout 200 is a layout of integrated circuit 100 of FIG. 1B or integrated circuit 100B of FIG. 1C.

In some embodiments, patterns of layout design 200 or integrated circuit 300-500 that are shown in FIGS. 2A-2E, 3A-3F, 4A-4E and 5A-5E are shown with the same corresponding node labels (e.g., D, seb, se, si, mx1, ml1_*a*, ml2_*a*, ml1_*bx*, ml2_*bx*, sl1_*ax*, sl2_*ax*, sl1_*b*, sl2_*b*, CP, clkb1, clkbb1, clkb2, clkbb2, Q, VDD, VSS, etc.) as that shown in FIGS. 1B-1C.

Layout design 200 includes one or more active region layout patterns 202*a*, 202*b*, 202*c* or 202*d* (collectively referred to as a "set of active region patterns 202") extending in the first direction X.

Embodiments of the present disclosure use the term "layout pattern" which is hereinafter also referred to as "patterns" in the remainder of the present disclosure for brevity.

Active region patterns 202*a*, 202*b*, 202*c* or 202*d* of the set of active region patterns 202 are separated from one another in the second direction Y.

The set of active region patterns 202 is usable to manufacture a corresponding set of active regions 302 of integrated circuit 300, 400 or 500. In some embodiments, the set of active regions 302 are located on a front-side of integrated circuit 300, 400 or 500. In some embodiments, the set of active regions 302 correspond to source and drain regions of one or more planar transistors, finFET transistors, nanosheet transistors or nanowire transistors. Other transistor types are within the scope of the present disclosure.

In some embodiments, active region patterns 202*a*, 202*b*, 202*c*, 202*d* are usable to manufacture corresponding active regions 302*a*, 302*b*, 302*c*, 302*d* of the set of active regions 302 of integrated circuit 300, 400 or 500.

In some embodiments, the set of active region patterns 202 is referred to as an oxide diffusion (OD) region which defines the source or drain diffusion regions of at least integrated circuit 300, 400 or 500 or layout design 200.

As shown in FIG. 2A, active region patterns 202*b* and 202*c* correspond to a supply voltage VDD), and therefore active region patterns 202*b* and 202*c* correspond to PMOS transistors. As shown in FIG. 2A, active region patterns 202*a* and 202*d* correspond to a reference supply voltage VSS and therefore active region patterns 202*a* and 202*d* correspond to NMOS transistors.

In some embodiments, active region patterns 202*b* and 202*c* are usable to manufacture source and drain regions of PMOS transistors of integrated circuit 300, 400 or 500, and active region patterns 202*a* and 202*d* are usable to manufacture source and drain regions of NMOS transistors of integrated circuits 300, 400 or 500.

In some embodiments, active region patterns 202*a*, 202*b*, 202*c* and 202*d* in FIGS. 2A, 2D are shown with corresponding node labels (e.g., D, seb, se, si, mx1, ml1_*a*, ml2_*a*, ml1_*bx*, ml2_*bx*, sl1_*ax*, sl2_*ax*, sl1_*b*, sl2_*b*, CP, clkb1, clkbb1, clkb2, clkbb2, Q, VDD, VSS, etc.) that identify corresponding drain or source regions of corresponding transistors of FIGS. 1B-1C that are coupled to the corresponding node. For example, a source of transistor T1 of active region pattern 202*b* is coupled to supply voltage VDD, and is labeled in FIGS. 2B-2E with "VDD." Similarly, a source of transistor T8 and a source of transistor T6 of active region pattern 202*a* is coupled to reference supply voltage VSS, and is labeled in FIGS. 2B-2E with "VSS."

In some embodiments, active region patterns 202*a* and 202*d* are usable to manufacture source and drain regions of PMOS transistors of integrated circuit 300, 400 or 500, and active region patterns 202*b* and 202*c* are usable to manufacture source and drain regions of NMOS transistors of integrated circuits 300, 400 or 500.

At least one of active region pattern 202*a*, 202*b*, 202*c* or 202*d* has a width W1*a* in the second direction Y. In some embodiments, at least one of active region pattern 202*a*, 202*b*, 202*c* or 202*d* has a width in the second direction Y that is different from a width of another of active region pattern 202*a*, 202*b*, 202*c* or 202*d*.

In some embodiments, the width W1*a* of active region patterns 202*a*, 202*b*, 202*c* or 202*d* is related to the number of conducting devices (e.g., transistors) manufactured by the corresponding active region patterns 202*a*, 202*b*, 202*c* or 202*d*, and the corresponding speed and driving strength of the conducting devices (e.g., transistors) in the corresponding active regions 302*a*, 302*b*, 302*c* or 302*d*.

In some embodiments, at least the width W1*a* of active region patterns 202*a*, 202*b*, 202*c* or 202*d* is directly related to the number of fin patterns NF1*a* useable to manufacture corresponding fins in active region 302*a*, 302*b*, 302*c* or 302*d*. For example, in some embodiments, an increase in the width W1*a* of active region patterns 202*a*, 202*b*, 202*c* or 202*d* causes the number of fins NF1*a* and the number of conducting devices (e.g., transistors) manufactured by set of active region layout patterns 202 to increase, and the corresponding speed and driving strength of the conducting devices (e.g., transistors) increases while the area and power consumed increases. For example, in some embodiments, a decrease in the width W1*a* of active region patterns 202*a*, 202*b*, 202*c* or 202*d* causes the number of fins NF1*a* and the number of conducting devices (e.g., transistors) manufactured by set of active region layout patterns 202 to decrease, and the corresponding speed and driving strength of the conducting devices (e.g., transistors) decreases while the area and power consumed decreases.

In some embodiments, active region patterns 202*a*, 202*b*, 202*c* or 202*d* have a number of nanosheets NS1*a* that are useable to manufacture corresponding nanosheets in active region 302*a*, 302*b*, 302*c* or 302*d*.

In some embodiments, the set of active region patterns 202 is located on a first layout level. In some embodiments, the first layout level corresponds to an active level or an OD level of one or more of layout design 200 or integrated circuit 300, 400 or 500.

Other configurations, arrangements on other layout levels or quantities of patterns in the set of active region patterns 202 are within the scope of the present disclosure.

Layout design 200 further includes one or more gate patterns 203*a* or 203*b* (collectively referred to as a "set of dummy gate patterns 203") or one or more gate patterns 204*a*, 204*b*, . . . , 204*q* or 204*r* (collectively referred to as a "set of gate patterns 204") extending in the second direction Y.

The set of dummy gate patterns 203 is usable to manufacture a corresponding set of dummy gates 303 of integrated circuit 300, 400 or 500.

In some embodiments, dummy gate patterns 203*a*, 203*b* are usable to manufacture corresponding dummy gates 303*a*, 303*b* of the set of dummy gates 303 of integrated circuit 300, 400 or 500.

The set of dummy gate patterns 203 overlap cell boundaries 201*c* and 201*d*. In some embodiments, dummy gate patterns are also referred to as CPODE patterns.

The set of gate patterns 204 is usable to manufacture a corresponding set of gates 304 of integrated circuit 300, 400 or 500.

In some embodiments, gate patterns 204*a*, 204*b*, . . . , 204*q* or 204*r* are usable to manufacture corresponding gates 304*a*, 304*b*, . . . , 304*q* or 304*r* of the set of gates 304 of integrated circuit 300, 400 or 500.

In some embodiments, each of the gate patterns in the set of gate patterns 204 is shown in FIGS. 2B-2E with labels "T1-T42" that identify corresponding transistors of FIGS. 1B-1C manufactured by the corresponding gate pattern in FIGS. 2B-2E, and further description is omitted for brevity.

In some embodiments, one or more patterns not shown with a node label correspond to one or more dummy gate patterns that are useable to manufacture a dummy gate. For example, gate pattern 204*g* is not shown in FIGS. 2B-2E with a node label, and gate pattern 204*g* is a dummy gate pattern useable to manufacture dummy gate 304*g*.

The set of gate patterns 204 is above the set of active region patterns 202. The set of gate patterns 204 is positioned on a second layout level different from the first layout level. In some embodiments, the second layout level is different from the first layout level. In some embodiments, the second layout level corresponds to the POLY level or the CPODE level of one or more of layout design 200 or integrated circuit 300, 400 or 500. In some embodiments, the POLY level or the CPODE level is above the OD level.

Other configurations, arrangements on other layout levels or quantities of patterns in the set of gate patterns 204 are within the scope of the present disclosure.

Layout design 200 further includes a set of poly cut feature patterns 205. The set of cut feature patterns 205 includes at least a poly cut feature pattern 205*a*, 205*b*, . . . , 205*n* or 205*o*.

Set of poly cut feature patterns 205 extends in the first direction X. Poly cut feature pattern 205*b* overlaps set of gate patterns 204.

In some embodiments, poly cut feature pattern 205*a* overlaps set of gate patterns 204 along cell boundary 201*a*. In some embodiments, poly cut feature pattern 205*d* overlaps set of gate patterns 204 along cell boundary 201*b*. In some embodiments, poly cut feature patterns 205*a* and 205*d* extends continuously through the cell boundaries 101*a* or 101*b* of layout design 200 to other neighboring cells.

In some embodiments, at least one cut feature pattern of the set of poly cut feature patterns 205 is separated from another cut feature pattern of the set of poly cut feature patterns 205 in the second direction Y. In some embodiments, at least one cut feature pattern of the set of poly cut feature patterns 205 is separated from another cut feature pattern of the set of poly cut feature patterns 205 in the first direction X.

Figure 7:
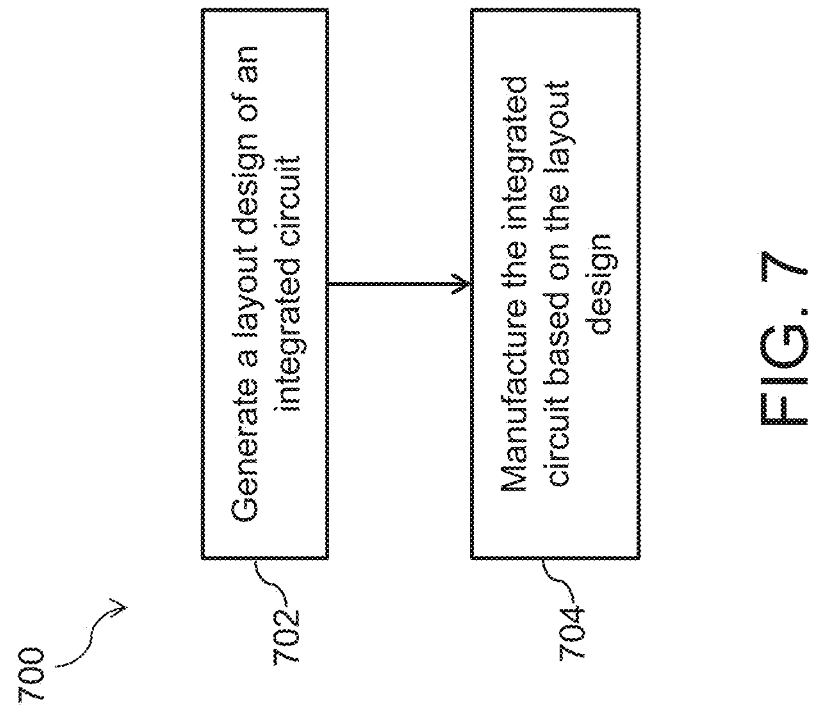
FIG. 7 is a flow chart of a method of manufacturing an IC device, in accordance with some embodiments.

Each poly cut feature pattern of the set of poly cut feature patterns 205 has a corresponding gate pattern width (not labelled) in the second direction Y, and a corresponding gate pattern length (not labelled) in the first direction X. In some embodiments, poly cut feature pattern 205*a* is usable to identify a corresponding location of a removed portion of corresponding gate structure 305*a* of integrated circuit 300 that is removed during method 700 (FIG. 7).

In some embodiments, at least one of the set of gate layout patterns 204 or the set of poly cut feature patterns 205 is located on the second layout level or the POLY or the CPO level.

Other configurations or quantities of patterns in the poly cut feature pattern 205 are within the scope of the present disclosure.

Layout design 200 further includes one or more contact patterns 206*a*, 206*b*, . . . , 206*r* or 206*s* (collectively referred to as a "set of contact patterns 206") extending in the second direction Y.

Each of the contact patterns of the set of contact patterns 206 is separated from an adjacent contact pattern of the set of contact patterns 206 in at least the first direction X or the second direction Y. For ease of illustration, one or more contact patterns of the set of contact patterns 206 are not labelled.

The set of contact patterns 206 is usable to manufacture a corresponding set of contacts 306 of integrated circuit 300, 400 or 500.

In some embodiments, contact pattern 206*a*, 206*b*, . . . , 206*r* or 206*s* of the set of contact patterns 206 is usable to manufacture corresponding contact 306*a*, 306*b*, . . . , 306*r* or 306*s* of the set of contacts 306.

In some embodiments, the set of contact patterns 206 is also referred to as a set of metal over diffusion (MD) patterns.

In some embodiments, at least one of contact pattern 206*a*, 206*b*, . . . , 206*r* or 206*s* of the set of contact patterns 206 is usable to manufacture source or drain terminals of one of the NMOS or PMOS transistors of integrated circuit 100, 300, 400 or 500.

The set of contact patterns 206 overlaps the set of active region patterns 202.

The set of contact patterns is located on a third layout level. In some embodiments, the third layout level is different from the first layout level. In some embodiments, the third layout level corresponds to the contact level or an MD level of one or more of layout design 200 or integrated circuit 300, 400 or 500. In some embodiments, the MD level is above the OD level.

Other configurations, arrangements on other layout levels or quantities of patterns in the set of contact patterns 206 are within the scope of the present disclosure.

Layout design 200 further includes a set of contact cut feature patterns 209. The set of cut feature patterns 209 includes at least contact cut feature pattern 209*a*, 209*b*, . . . , 209*p* or 209*q*.

Set of contact cut feature patterns 209 extends in the first direction X. The set of contact cut feature patterns 209 overlaps the set of contact patterns 206 and 207. In some embodiments, the set of contact cut feature patterns 209 are located in the second row ROW2 of layout design 200.

In some embodiments, at least one cut feature pattern of the set of contact cut feature patterns 209 is separated from another cut feature pattern of the set of contact cut feature patterns 209 in the second direction Y. In some embodiments, at least one cut feature pattern of the set of contact cut feature patterns 209 is separated from another cut feature pattern of the set of contact cut feature patterns 209 in the first direction X.

Each contact cut feature pattern of the set of contact cut feature patterns 209 has a corresponding cut pattern width (not labelled) in the second direction Y, and a corresponding cut pattern length (not labelled) in the first direction X. In some embodiments, contact cut feature pattern 209*a* is usable to identify a corresponding location of a removed portion of corresponding contact 309*a* of integrated circuit 300 that is removed during method 700 (FIG. 7).

Layout design 200 further includes a set of contact cut feature patterns 210. The set of cut feature patterns 210 includes at least a contact cut feature pattern 210*a*, 210*b*, . . . , 210*p* or 210*q*.

Set of contact cut feature patterns 210 extends in the first direction X. The set of contact cut feature patterns 210 overlaps the set of contact patterns 207 and 208.

In some embodiments, the set of contact cut feature patterns 210 are located in the first row ROW1 of layout design 200.

In some embodiments, at least one cut feature pattern of the set of contact cut feature patterns 210 is separated from another cut feature pattern of the set of contact cut feature patterns 210 in the second direction Y. In some embodiments, at least one cut feature pattern of the set of contact cut feature patterns 210 is separated from another cut feature pattern of the set of contact cut feature patterns 210 in the first direction X.

Each contact cut feature pattern of the set of contact cut feature patterns 210 has a corresponding cut pattern width (not labelled) in the second direction Y, and a corresponding cut pattern length (not labelled) in the first direction X. In some embodiments, contact cut feature pattern 210*a* is usable to identify a corresponding location of a removed portion of corresponding contact 310*a* of integrated circuit 300 that is removed during method 700 (FIG. 7).

In some embodiments, at least one of the set of contact layout patterns 209 or the set of contact cut feature patterns 210 is located on the third layout level or the MD or the CMD level.

Layout design 200 further includes one or more via patterns 212*a*, 212*b*, . . . 212*x* (collectively referred to as a "set of via patterns 212") or one or more via patterns 214*a*, 214*b*, . . . 214*r* (collectively referred to as a "set of via patterns 214").

The set of via patterns 212 is usable to manufacture a corresponding set of vias 312 of integrated circuit 300, 400 or 500. The set of via patterns 214 is usable to manufacture a corresponding set of vias 314 of integrated circuit 300, 400 or 500.

In some embodiments, via patterns 212*a*, 212*b*, . . . 212*x* of the set of via patterns 212 are usable to manufacture corresponding vias 312*a*, 312*b*, . . . 312*x* of the set of vias 312 of integrated circuit 300, 400 or 500. In some embodiments, via patterns 214*a*, 214*b*, . . . 214*r* of the set of via patterns 214 are usable to manufacture corresponding vias 314*a*, 314*b*, . . . 314*r* of the set of vias 314 of integrated circuit 300, 400 or 500.

In some embodiments, the set of via patterns 212 is between the set of active region patterns 202 and the set of contact patterns 206. In some embodiments, the set of via patterns 214 is between the set of active region patterns 202 and the set of contact patterns 206.

The set of via patterns 212 or 214 is positioned at a via over diffusion (VD) level of one or more of layout design 200 or integrated circuit 300, 400 or 500. In some embodiments, the VD level is above the MD and OD level. In some embodiments, the VD level is between the MD level and the M0 level. In some embodiments, the VD level is between the first layout level and the third layout level. Other layout levels are within the scope of the present disclosure.

Other configurations, arrangements on other layout levels or quantities of patterns in at least set of via patterns 212 or 214 are within the scope of the present disclosure.

Layout design 200 further includes one or more via patterns 216*a*, 216*b*, . . . 216*t* (collectively referred to as a "set of via patterns 216") or one or more via patterns 218*a*, 218*b*, . . . 218*s* (collectively referred to as a "set of via patterns 218").

The set of via patterns 216 is usable to manufacture a corresponding set of vias 316 of integrated circuit 300, 400 or 500. The set of via patterns 218 is usable to manufacture a corresponding set of vias 318 of integrated circuit 300, 400 or 500.

In some embodiments, via patterns 216*a*, 216*b*, . . . 216*t* of the set of via patterns 216 are usable to manufacture corresponding vias 316*a*, 316*b*, . . . 316*t* of the set of vias 316 of integrated circuit 300, 400 or 500. In some embodiments, via patterns 218*a*, 218*b*, . . . 218*s* of the set of via patterns 218 are usable to manufacture corresponding vias 318*a*, 318*b*, . . . 318*s* of the set of vias 318 of integrated circuit 300, 400 or 500.

In some embodiments, the set of via patterns 216 are between the set of gate patterns 204 and the set of conductive feature patterns 220. In some embodiments, the set of via patterns 218 are between the set of gate patterns 206 and the set of conductive feature patterns 222.

The set of via patterns 216 or 218 is positioned at a via over gate (VG) level of one or more of layout design 200 or integrated circuits 300, 400 or 500. In some embodiments, the VG level is above the OD level, the MD level and the POLY level. In some embodiments, the VG level is between the POLY level and the M0 level. In some embodiments, the VG level is between the second layout level and the third layout level. Other layout levels are within the scope of the present disclosure.

Other configurations, arrangements on other layout levels or quantities of patterns in at least set of via patterns 216 or 218 are within the scope of the present disclosure.

Layout design 200 further includes one or more conductive feature patterns 220*a*, 220*b*, . . . 220*e* (collectively referred to as a "set of conductive feature patterns 220") or one or more conductive feature patterns 222*a*, 222*b*, . . . 222*e* (collectively referred to as a "set of conductive feature patterns 222") extending in the first direction X.

The set of conductive feature patterns 220 is usable to manufacture a corresponding set of conductors 320 of integrated circuit 300, 400 or 500. The set of conductive feature patterns 222 is usable to manufacture a corresponding set of conductors 322 of integrated circuit 300, 400 or 500.

Conductive feature patterns 220*a*, 220*b*, . . . 220*e* are usable to manufacture corresponding conductors 320*a*, 320*b*, . . . 320*e* of integrated circuit 300, 400 or 500. Conductive feature patterns 222*a*, 222*b*, . . . 222*e* are usable to manufacture corresponding conductors 322*a*, 322*b*, . . . 3221 of integrated circuit 300, 400 or 500. In some embodiments, one or more conductive feature patterns 220*a*, 220*b*, . . . 220*e* of the set of conductive feature patterns 220 is divided into discontinuous portions (not labelled). In some embodiments, one or more conductive feature patterns 222*a*, 222*b*, . . . 222*e* of the set of conductive feature patterns 222 is divided into discontinuous portions (not labelled).

In some embodiments, the set of conductive feature patterns 220 or the set of conductive feature patterns 222 are located on a fourth layout level. In some embodiments, the fourth layout level is different from the first layout level, the second layout level and the third layout level. In some embodiments, the fourth layout level corresponds to the M0 level of one or more of layout design 200 or integrated circuits 300, 400 or 500. In some embodiments, the M0 level is above the OD level, the MD level and the POLY level.

In some embodiments, the set of conductive feature patterns 220 correspond to 5 M0 routing tracks and the set of conductive feature patterns 222 correspond to 5 M0 routing tracks. Other numbers of M0 routing tracks are within the scope of the present disclosure.

Other configurations, arrangements on other layout levels or quantities of patterns in the set of conductive feature patterns 220 or 222 are within the scope of the present disclosure.

Other configurations or quantities of patterns in the set of contact cut feature patterns 209 or 210 are within the scope of the present disclosure.

Other configurations, arrangements on other layout levels or quantities of patterns in layout design 200 are within the scope of the present disclosure.

FIGS. 3A-3F are diagrams of an integrated circuit 300, in accordance with some embodiments.

FIGS. 3A-3E are corresponding diagrams of corresponding portions 300A-300E of integrated circuit 300, simplified for ease of illustration.

Portion 300A includes one or more features of integrated circuit 300 of the OD level, the POLY level, the CPODE level, the CPO level, the MD level and the CMD level. Portion 300A is manufactured by portion 200B.

Portion 300B includes one or more features of integrated circuit 300 of the OD level, the POLY level, the CPODE level, the CPO level, the MD level and the CMD level. Portion 300B is manufactured by portion 200C. Portion 300B is similar to portion 300D and portion 300E, and similar detailed description is therefore omitted. For example, in comparison with portion 300D and portion 300E, elements of the POLY level, the CPO level, and the CMD level of portion 300B are labelled in FIG. 3B, but are not labelled in portion 300D and portion 300E for ease of illustration.

Portion 300C includes one or more features of integrated circuit 300 of the OD level, the POLY level, the CPODE level, the CPO level, the MD level and the CMD level. Portion 300C is manufactured by portion 200C. Portion 300C is similar to portion 300D and portion 300E, and similar detailed description is therefore omitted. For example, in comparison with portion 300D and portion 300E, elements of the POLY level, the CPO level, and the CMD level of portion 300C are labelled in FIG. 3B, but are not labelled in portion 300D and portion 300E for ease of illustration.

Portion 300D includes one or more features of integrated circuit 300 of the OD level, the POLY level, the CPODE level, the CPO level, the MD level and the CMD level. Portion 300D is manufactured by portion 200D. Portion 300D is similar to portion 300B and portion 300C, and similar detailed description is therefore omitted. For example, in comparison with portion 300B and portion 300C, elements of the MD level in portion 300D are labelled in FIG. 3D, but are not labelled in portion 300B and portion 300C for ease of illustration.

Portion 300E includes one or more features of integrated circuit 300 of the OD level, the POLY level, the CPODE level, the CPO level, the MD level, the CMD level, the VG level, the VD level and the M0 level.

Figure 3A:
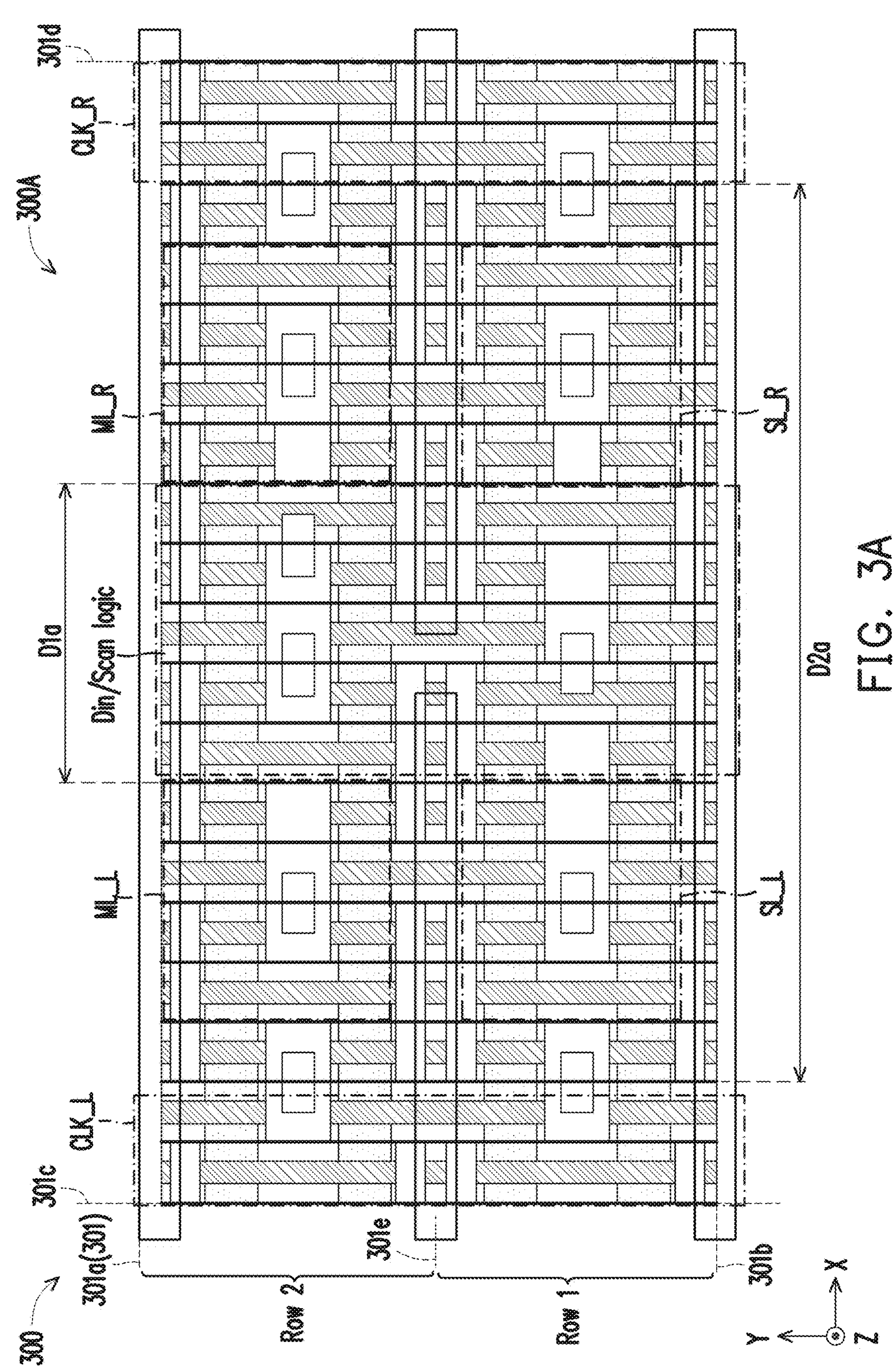
FIGS. 3A-3F are diagrams of an integrated circuit, in accordance with some embodiments.
Figure 3B:
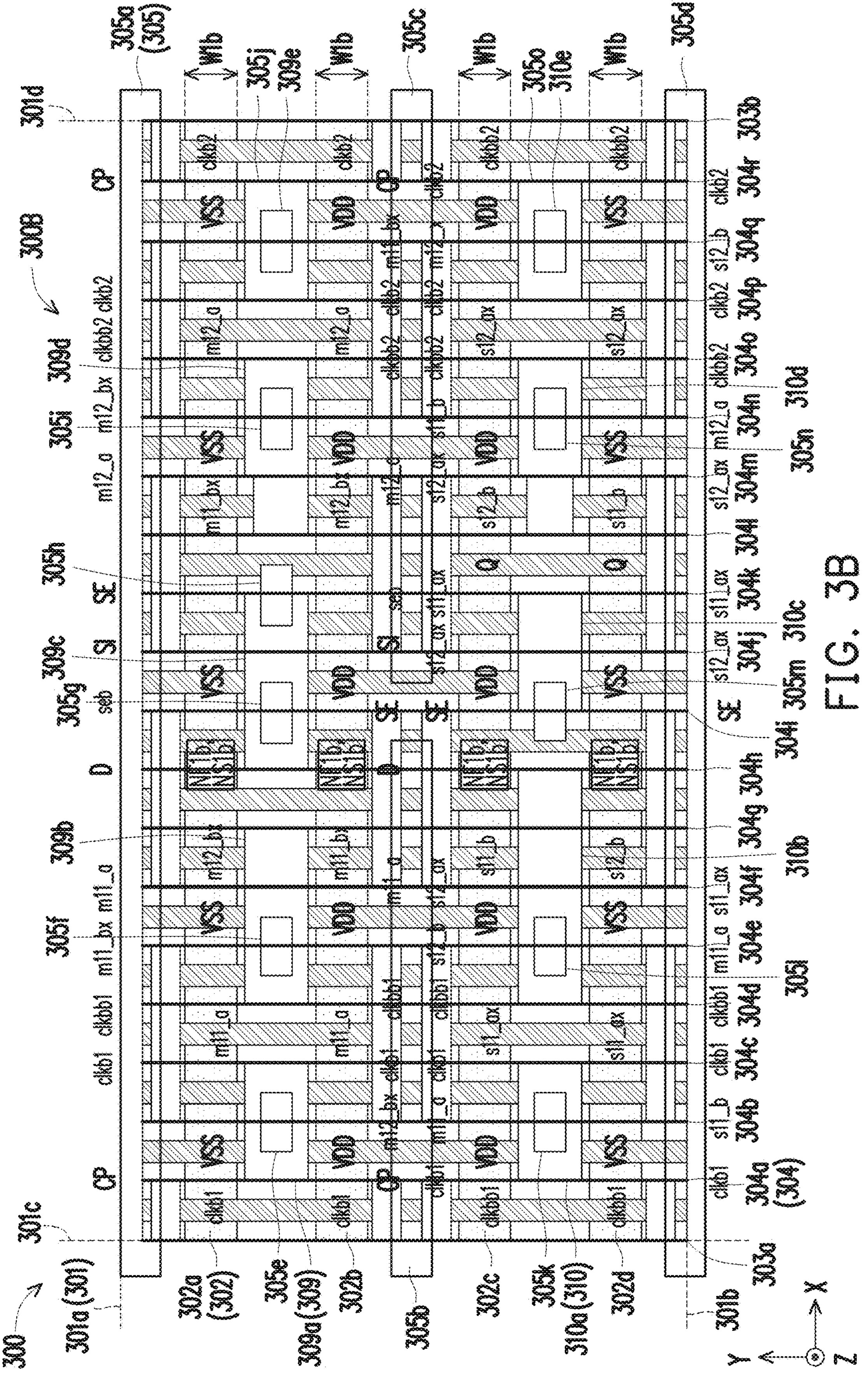
Figure 3C:
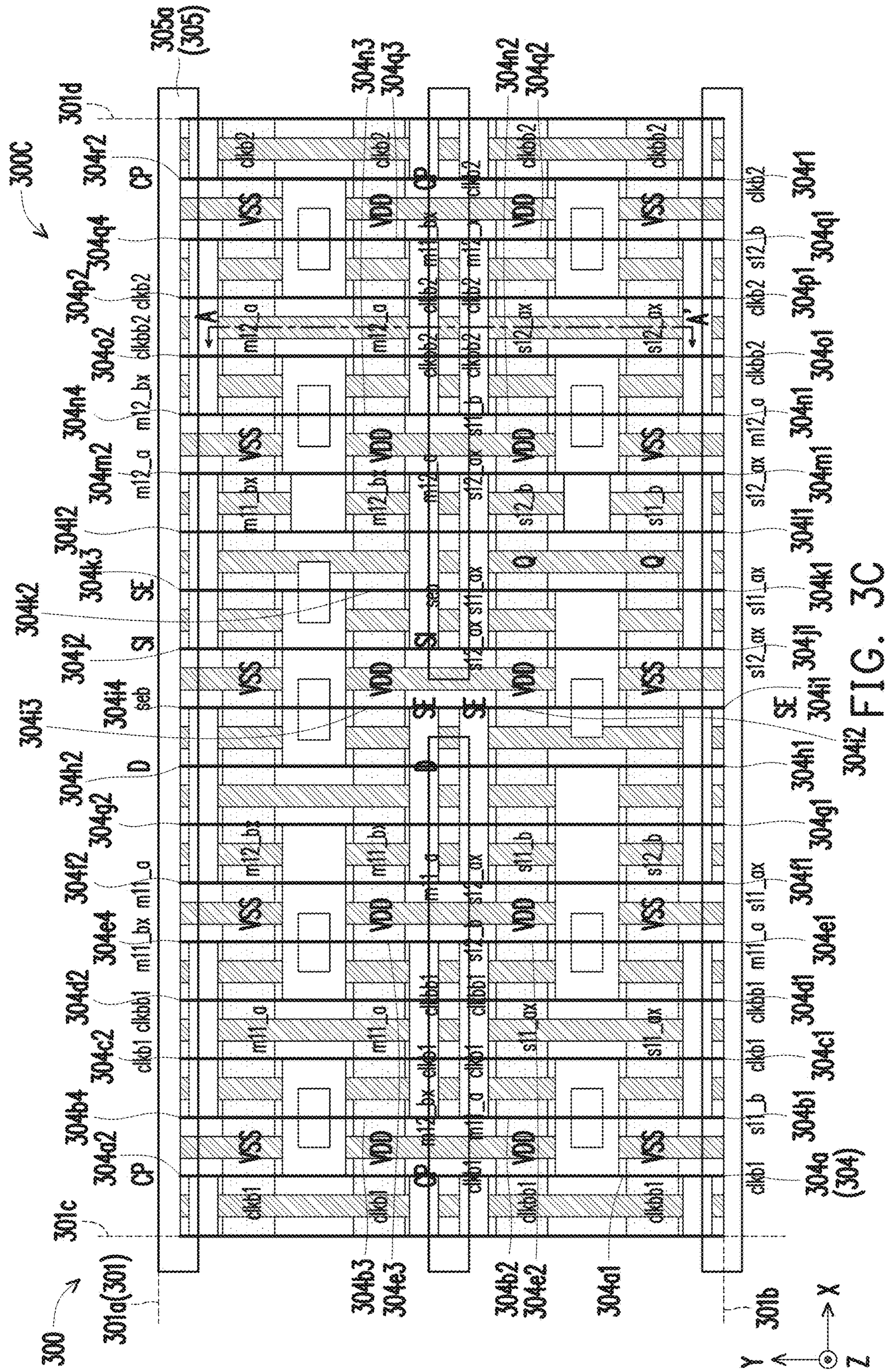
Figure 3D:
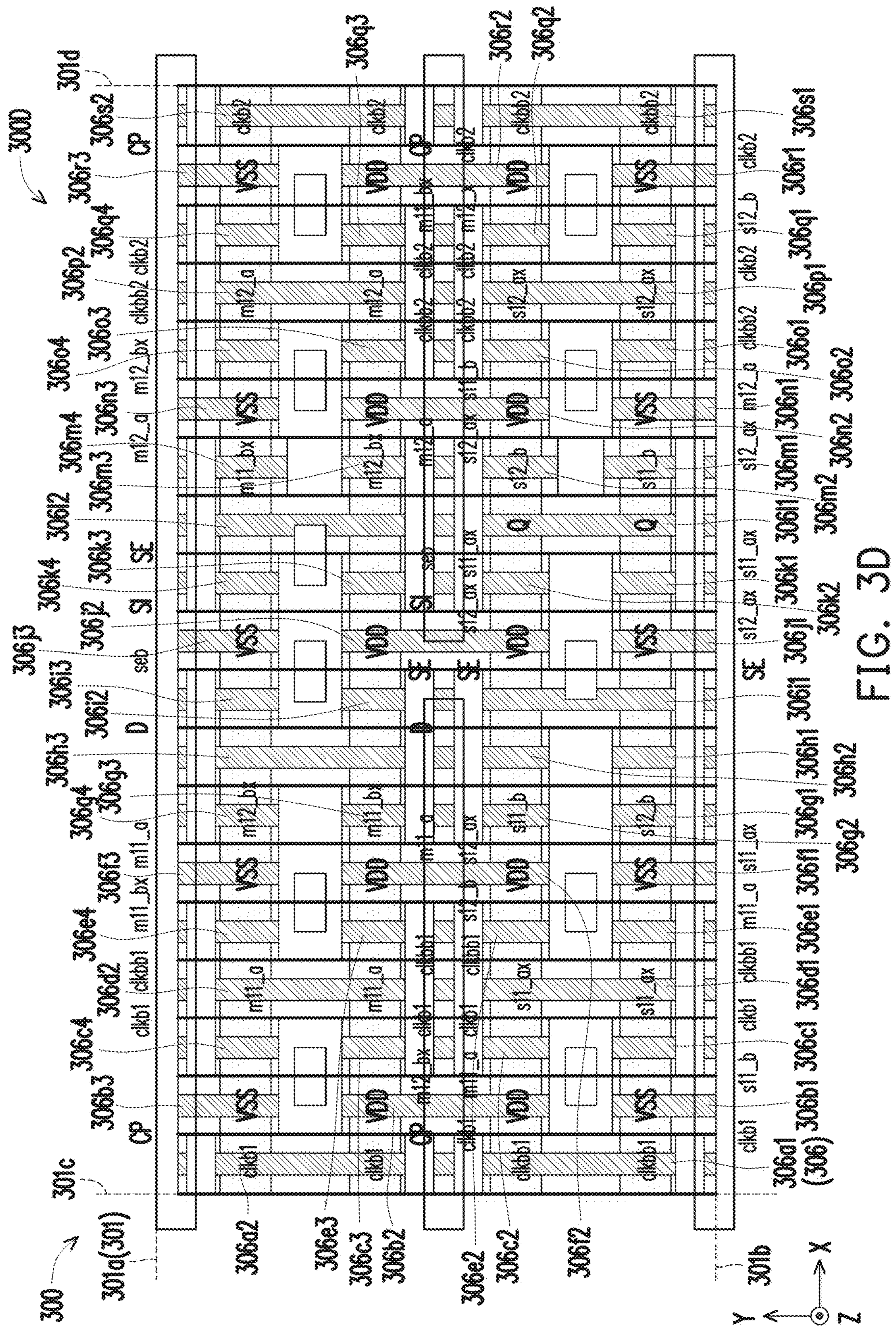
Figure 3E:
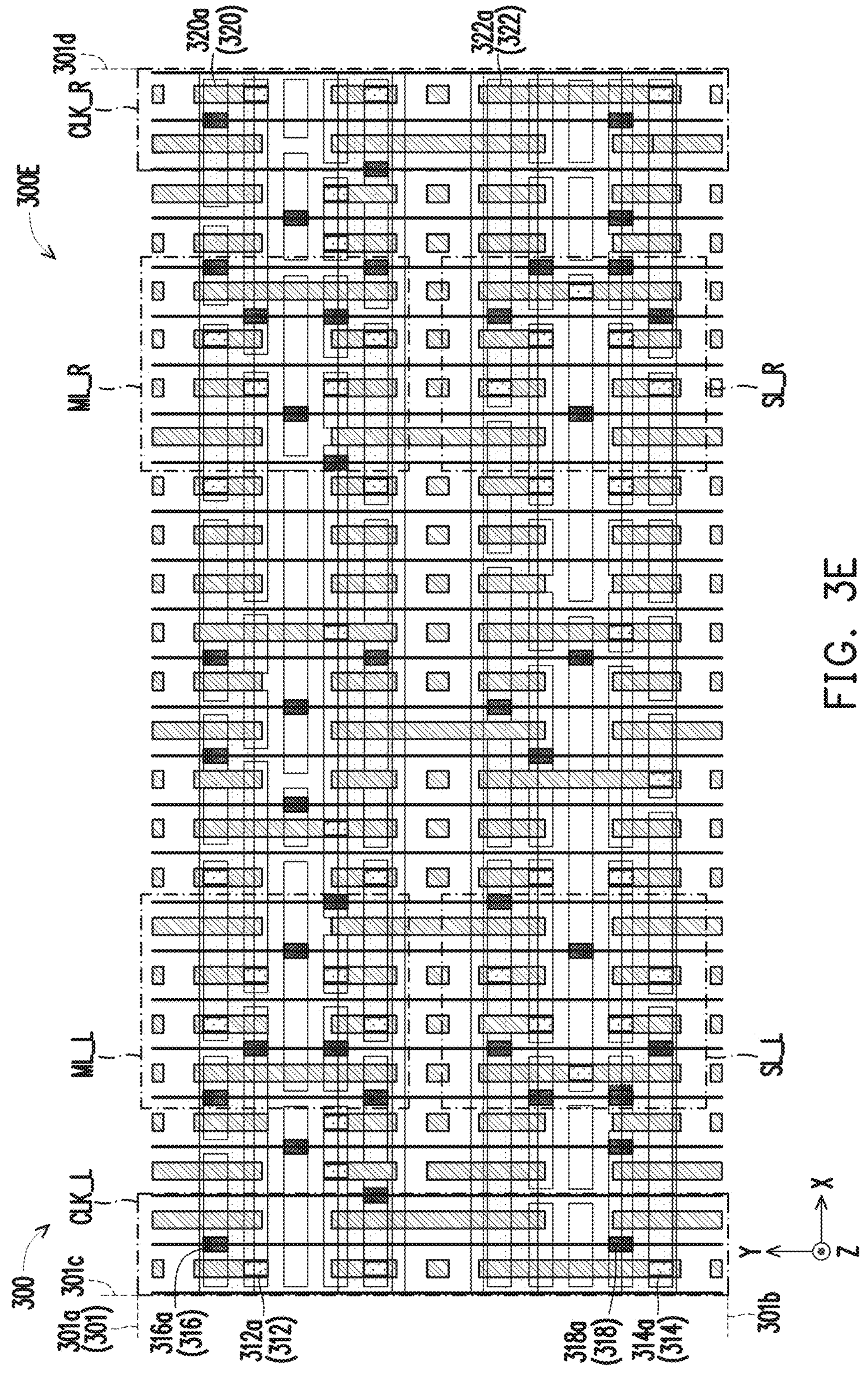
Figure 3F:
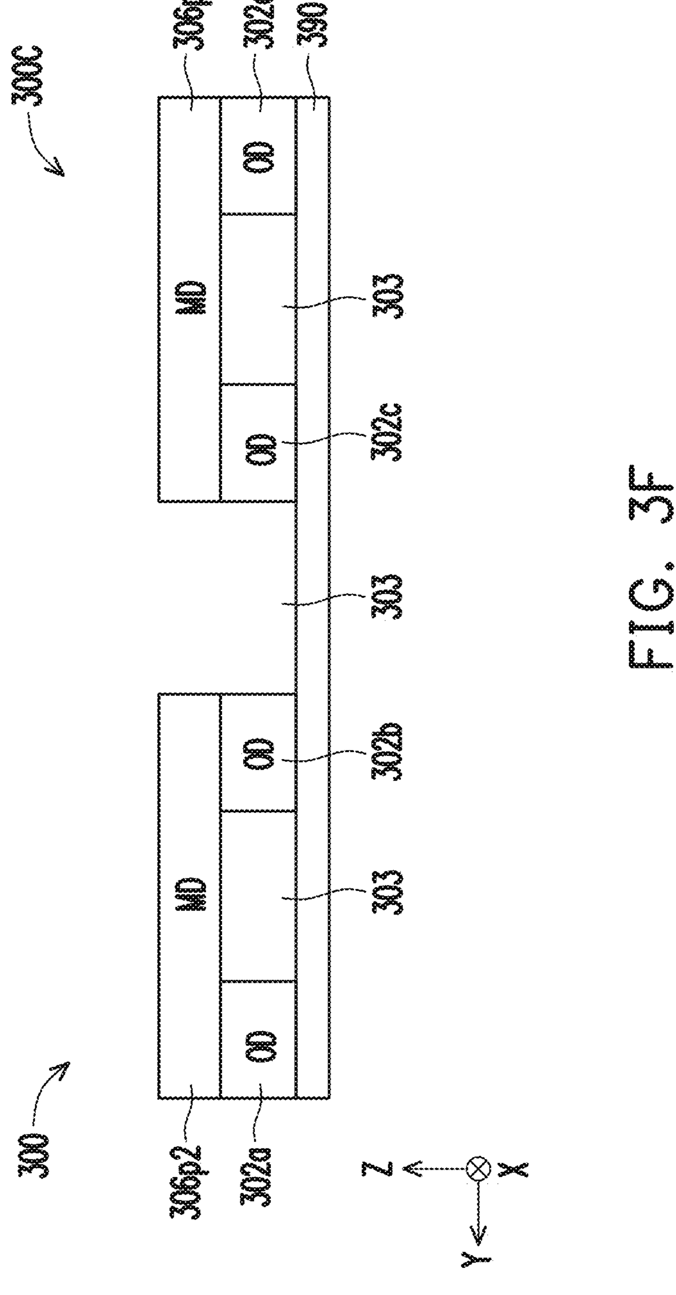

FIG. 3F is a corresponding cross-sectional view of integrated circuit 300, in accordance with some embodiments. FIG. 3E is a cross-sectional view of portion 300C of integrated circuit 300 as intersected by plane A-A', in accordance with some embodiments.

Components that are the same or similar to those in one or more of FIGS. 1B-1C, 2A-2E, 3A-3F, 4A-4E, 5A-5E and 6-10 are given the same reference numbers, and detailed description thereof is thus omitted.

Integrated circuit 300 is a top view of integrated circuit 200 of FIGS. 2A-2E. Integrated circuit 300 is a top view of a diagram of at least portion 100A of integrated circuit 100 of FIG. 1B or portion 100B of integrated circuit 100 of FIG. 1C.

Integrated circuit 300 is manufactured by layout design 200. Structural relationships including alignment, lengths and widths, as well as configurations and layers of integrated circuit 300 are similar to the structural relationships and configurations and layers of layout design 200 of FIGS. 2A-2E, and similar detailed description will not be described in at least FIGS. 3A-3F, for brevity. For example, in some embodiments, at least one or more widths, lengths or pitches of layout design 200 is similar to corresponding widths, lengths or pitches of integrated circuit 300, and similar detailed description is omitted for brevity. For example, in some embodiments, at least cell boundary 201*a*, 201*b*, 201*c*, 201*d* or line 201*e* of layout design 200 is similar to at least corresponding cell boundary 301*a*, 301*b*, 301*c*, 301*d* or line 301*e* of integrated circuit 300, and similar detailed description is omitted for brevity.

Integrated circuit 300 includes at least the set of active regions 302, the set of dummy gates 303, the set of gates 304, the set of contacts 306, a substrate 390, an insulating region 392, the set of vias 312, the set of vias 314, the set of vias 316, the set of vias 318, the set of conductors 320 and the set of conductors 322.

The set of active regions 302 are embedded in substrate 390. Substrate 390 has a front-side and a back-side opposite from the front-side. In some embodiments, at least the set of active regions 302, the set of gates 304 or the set of contacts 306 are formed in the front-side of substrate 390.

In some embodiments, the set of active regions 302 corresponds to planar structures (not shown) of planar transistors. In some embodiments, the set of active regions 302 corresponds to fin structures (not shown) of finFETs.

In some embodiments, the set of active regions 302 corresponds to nanosheet structures (not labelled) of nanosheet transistors. In some embodiments, the set of active regions 302 include drain regions and source regions grown by an epitaxial growth process. In some embodiments, the set of active regions 302 include drain regions and source regions that are grown with an epitaxial material at the corresponding drain regions and source regions.

Other transistor types are within the scope of the present disclosure. For example, in some embodiments, the set of active regions 302 corresponds to nanowire structures (not shown) of nanowire transistors.

As shown in FIG. 3A, active regions 302*b* and 302*c* correspond to a supply voltage VDD, and therefore active regions 302*b* and 302*c* correspond to PMOS transistors. As shown in FIG. 3A, active regions 302*a* and 302*d* correspond to a reference supply voltage VSS, and therefore active regions 302*a* and 302*d* correspond to NMOS transistors.

In some embodiments, active regions 302*a* and 302*d* are source and drain regions of NMOS transistors of integrated circuits 300, 400 or 500, and active regions 302*b* and 302*c* are source and drain regions of PMOS transistors of integrated circuits 300, 400 or 500.

In some embodiments, active regions 302*a* and 302*d* are source and drain regions of PMOS transistors of integrated circuit 300, 400 or 500, and active regions 302*b* and 302*c* are source and drain regions of NMOS transistors of integrated circuits 300, 400 or 500.

In some embodiments, active regions 302*a*, 302*b*, 302*c* and 302*d* in FIGS. 3A-3F, 4A-4E, 5A-5B, 6-7, 8A-8B, 9A-9B and 10 are shown with corresponding node labels (e.g., D, seb, se, si, mx1, ml1_*a*, ml2_*a*, ml1_*bx*, ml2_*bx*, sl1_*ax*, sl2_*ax*, sl1_*b*, sl2_*b*, CP, clkb1, clkbb1, clkb2, clkbb2, Q, VDD, VSS, etc.) that identify corresponding drain or source regions of corresponding transistors of FIGS. 1B-1C that are coupled to the corresponding node. For example, a source of transistor T1 of active region 302*b* is coupled to supply voltage VDD, and is labeled in FIGS. 3B-3E with "VDD." Similarly, a source of transistor T8 and a source of transistor T6 of active region 302*a* is coupled to reference supply voltage VSS, and is labeled in FIGS. 3B-3E with "VSS."

At least one of active region 302*a*, 302*b*, 302*c* or 302*d* has a width W1*b* in the second direction Y.

In some embodiments, the width W1*b* of active regions 302*a*, 302*b*, 302*c* or 302*d* is related to the number of conducting devices (e.g., transistors) of integrated circuit 300, and the corresponding speed, driving strength and power of the conducting devices (e.g., transistors) in the corresponding active regions 302*a*, 302*b*, 302*c* or 302*d*.

In some embodiments, at least the width W1*b* of active regions 302*a*, 302*b*, 302*c* or 302*d* is directly related to the number of fins NF1*b* in corresponding active region 302*a*, 302*b*, 302*c* or 302*d*.

In some embodiments, active regions 302*a*, 302*b*, 302*c* or 302*d* have a number of nanosheets NS1*b* in corresponding active regions 302*a*, 302*b*, 302*c* or 302*d*.

Other configurations, arrangements on other layout levels or quantities of structures in the set of active regions 302 are within the scope of the present disclosure.

Figure 6A:
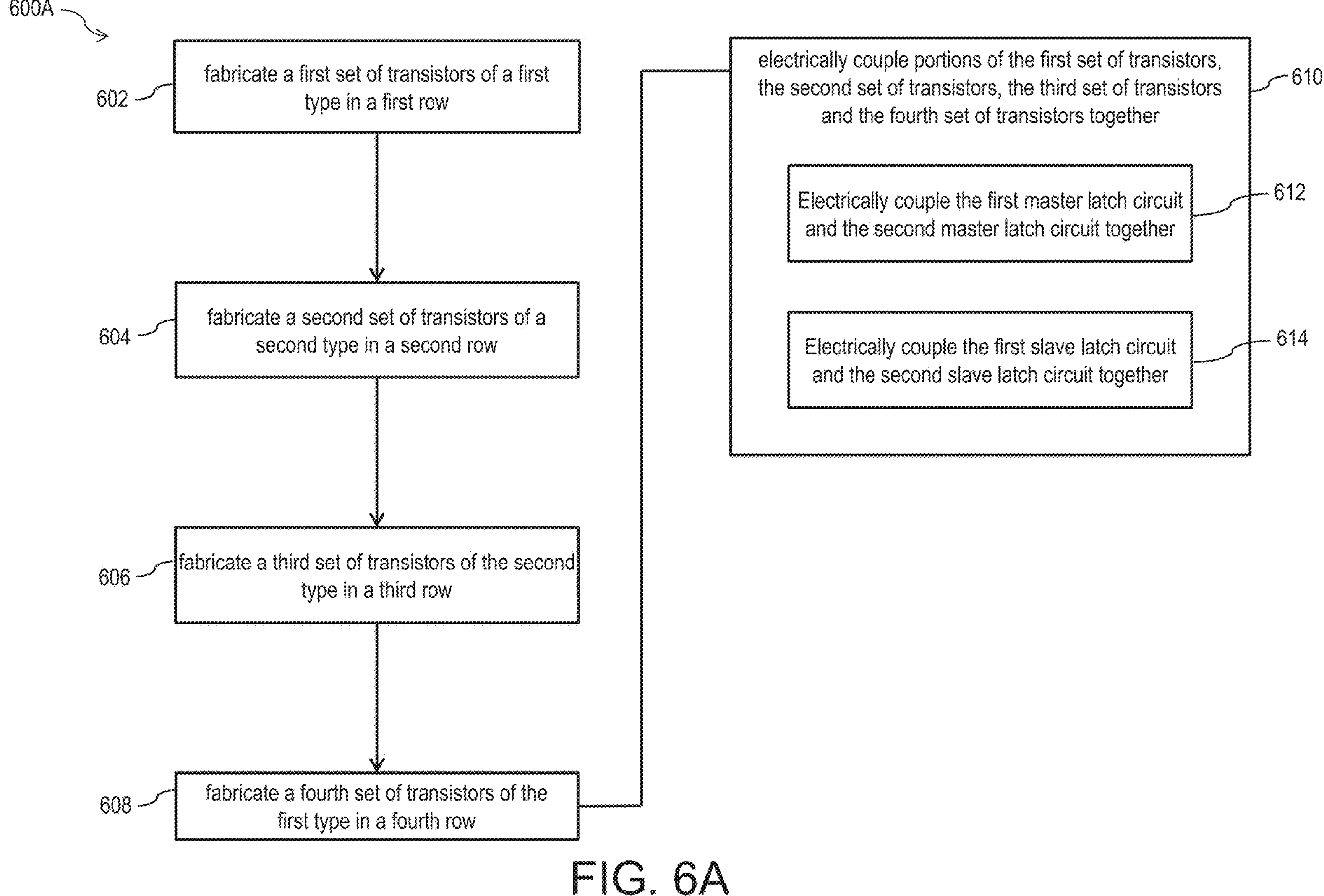
FIGS. 6A-6B are flow charts of a method of forming or manufacturing an integrated circuit in accordance with some embodiments.
Figure 6B:
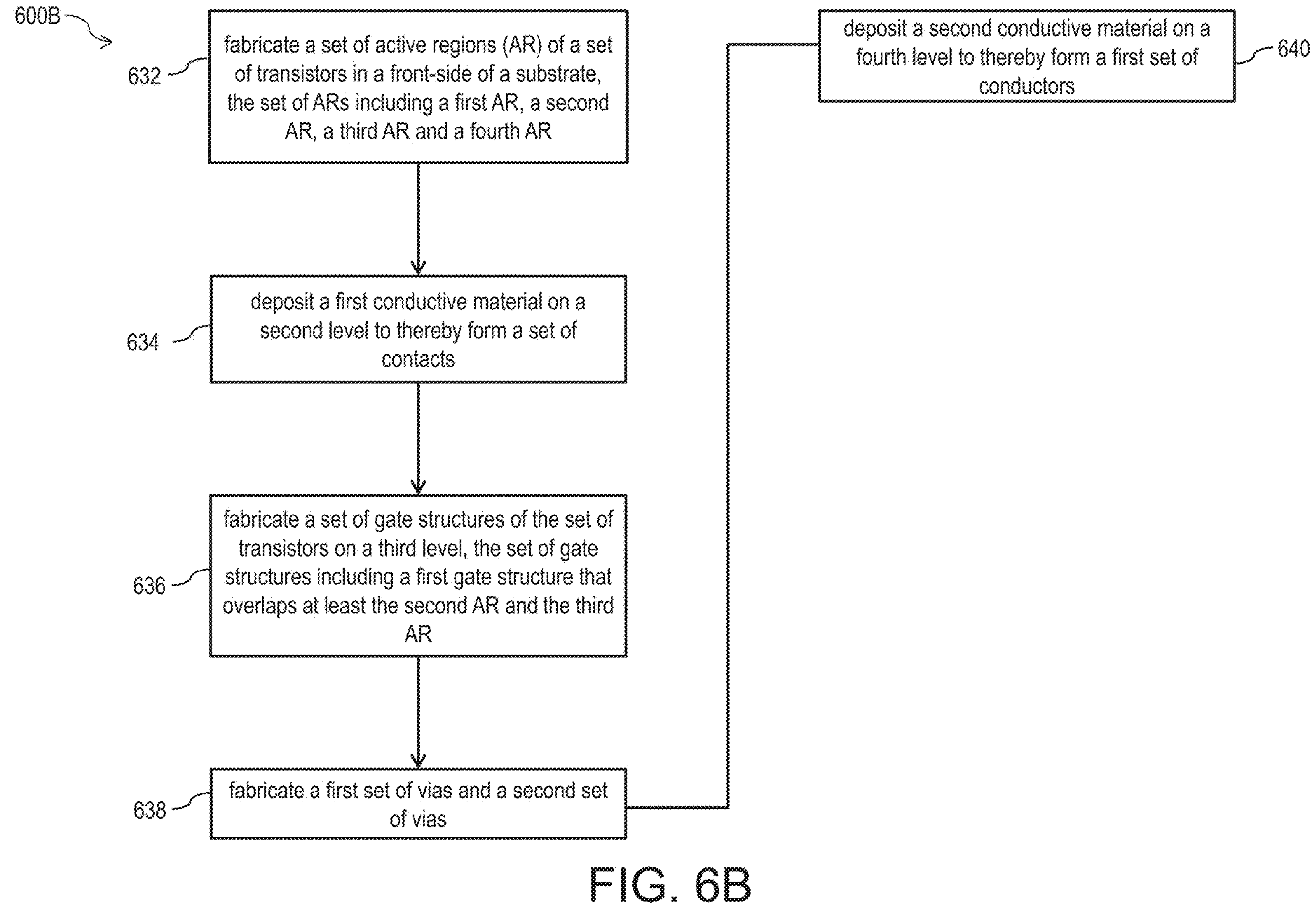

Insulating region 392 is configured to electrically isolate one or more elements of the set of active regions 302, the set of dummy gates 303, the set of gates 304, the set of contacts 306, a set of conductors in the M0 level, a set of vias in the VG level or a set of vias in the VD level from one another. In some embodiments, insulating region 390 includes multiple insulating regions deposited at different times from each other during method 600A-600B (FIGS. 6A-6B). In some embodiments, insulating region is a dielectric material. In some embodiments, the dielectric material includes silicon dioxide, silicon oxy-nitride, or the like.

Other configurations, arrangements on other layout levels or other numbers of portions in insulating region 390 are within the scope of the present disclosure.

The set of gates 304 correspond to one or more gates of transistors T1-T42 of at least one of integrated circuit 100, 300, 400 or 500. In some embodiments, each of the gates in the set of gates 304 are shown in FIGS. 3A-3F with labels "T1-T32" that identify corresponding transistors of FIGS. 1B-1C having corresponding gates in FIGS. 3A-3F, and are omitted for brevity.

The set of gates 304 includes at least gate 304*a*, 304*b*, . . . , 304*q* or 304*r*.

Gate 304*a* includes at least gate 304*al* or 304*a*2.

Gate 304*b* includes at least gate 304*b*1, 304*b*2, 304*b*3 or 304*b*4.

Gate 304*c* includes at least gate 304*c*1 or 304*c*2.

Gate 304*d* includes at least gate 304*d*1 or 304*d*2.

Gate 304*e* includes at least gate 304*e*1, 304*e*2, 304*e*3 or 304*e*4.

Gate 304*f* includes at least gate 304*f*1 or 304*f*2.

Gate 304*g* includes at least gate 304*g*1 or 304*g*2.

Gate 304*h* includes at least gate 304*h*1 or 304*h*2.

Gate 304*i* includes at least gate 304*i*1, 304*i*2, 304*i*3 or 304*i*4.

Gate 304*j* includes at least gate 304*j*1 or 304*j*2.

Gate 304*k* includes at least gate 304*k*1, 304*k*2 or 304*k*3.

Gate 304*l* includes at least gate 30411 or 30412.

Gate 304*m* includes at least gate 304*m*1 or 304*m*2.

Gate 304*n* includes at least gate 304*n*1, 304*n*2, 304*n*3 or 304*n*4.

Gate 304*o* includes at least gate 30401 or 304*o*2.

Gate 304*p* includes at least gate 304*p*1 or 304*p*2.

Gate 304*q* includes at least gate 304*q*1, 304*q*2, 304*q*3 or 304*q*4.

Gate 304*r* includes at least gate 304*r*1 or 304*r*2.

In some embodiments, at least gate 304*g* is a dummy gate. In some embodiments, a dummy gate is a gate of a non-functional transistor. Other gates configured as dummy gates are within the scope of the present disclosure.

Other configurations, arrangements on other layout levels or quantities of gates in the set of dummy gates 303 and the set of gates 304 are within the scope of the present disclosure.

Each contact of the set of contacts 306 corresponds to one or more drain or source terminals of transistors T1-T42 of at least one of integrated circuit 100, 300, 400 or 500.

In some embodiments, one or more contacts of the set of contacts 306 overlaps a pair of active regions of the set of active regions 302, thereby electrically coupling the pair of active regions of the set of active regions 302 and the source or drain of the corresponding transistors.

The set of contacts 306 includes at least contact 306*a*, 306*b*, . . . , 306*r* or 306*s*.

Contact 306*a* includes at least contact 306*al* or 306*a*2.

Contact 306*b* includes at least contact 306*b*1, 306*b*2 or 306*b*3.

Contact 306*c* includes at least contact 306*c*1, 306*c*2, 306*c*3 or 306*c*4.

Contact 306*d* includes at least contact 306*d*1 or 306*d*2.

Contact 306*e* includes at least contact 306*e*1, 306*e*2, 306*e*3 or 306*e*4.

Contact 306*f* includes at least contact 306*f*1, 306*f*2 or 306*f*3.

Contact 306*g* includes at least contact 306*g*1, 306*g*2, 306*g*3 or 306*g*4.

Contact 306*h* includes at least contact 306*h*1, 306*h*2 or 306*h*3.

Contact 306*i* includes at least contact 306*i*1, 306*i*2 or 306*i*3.

Contact 306*j* includes at least contact 306*j*1, 306*j*2 or 306*j*3.

Contact 306*k* includes at least contact 306*k*1, 306*k*2, 306*k*3 or 306*k*4.

Contact 306*l* includes at least contact 30611 or 30612.

Contact 306*m* includes at least contact 306*m*1, 306*m*2, 306*m*3 or 306*m*4.

Contact 306*n* includes at least contact 306*n*1, 306*n*2 or 306*n*3.

Contact 306*o* includes at least contact 30601, 306*o*2, 306*o*3 or 306*o*4.

Contact 306*p* includes at least contact 306*p*1 or 306*p*2.

Contact 306*q* includes at least contact 306*q*1, 306*q*2, 306*q*3 or 306*q*4.

Contact 306*r* includes at least contact 306*r*1, 306*r*2 or 306*r*3.

Contact 306*s* includes at least contact 306*s*1 or 306*s*2.

Other configurations, arrangements on other layout levels or quantities of contacts in the set of contacts 306 are within the scope of the present disclosure.

In some embodiments, at least one gate of the set of dummy gates 303 or the set of gates 304 are formed using a doped or non-doped polycrystalline silicon (or polysilicon). In some embodiments, at least one gate of the set of dummy gates 303 or the set of gates 304 include a metal, such as Al, Cu, W, Ti, Ta, TiN, TaN, NiSi, CoSi, other suitable conductive materials, or combinations thereof.

In some embodiments, at least one contact of the set of contacts 306, or at least one conductor in the M0 level or the set of conductors 320 or 322, or at least one via in the VG level or the set of vias 316 or 318 or the VD level or the set of vias 312 or 314 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

In some embodiments, integrated circuit 300 achieves one or more of the benefits discussed herein.

Other configurations or arrangements of integrated circuit 300 are within the scope of the present disclosure.

Figure 4A:
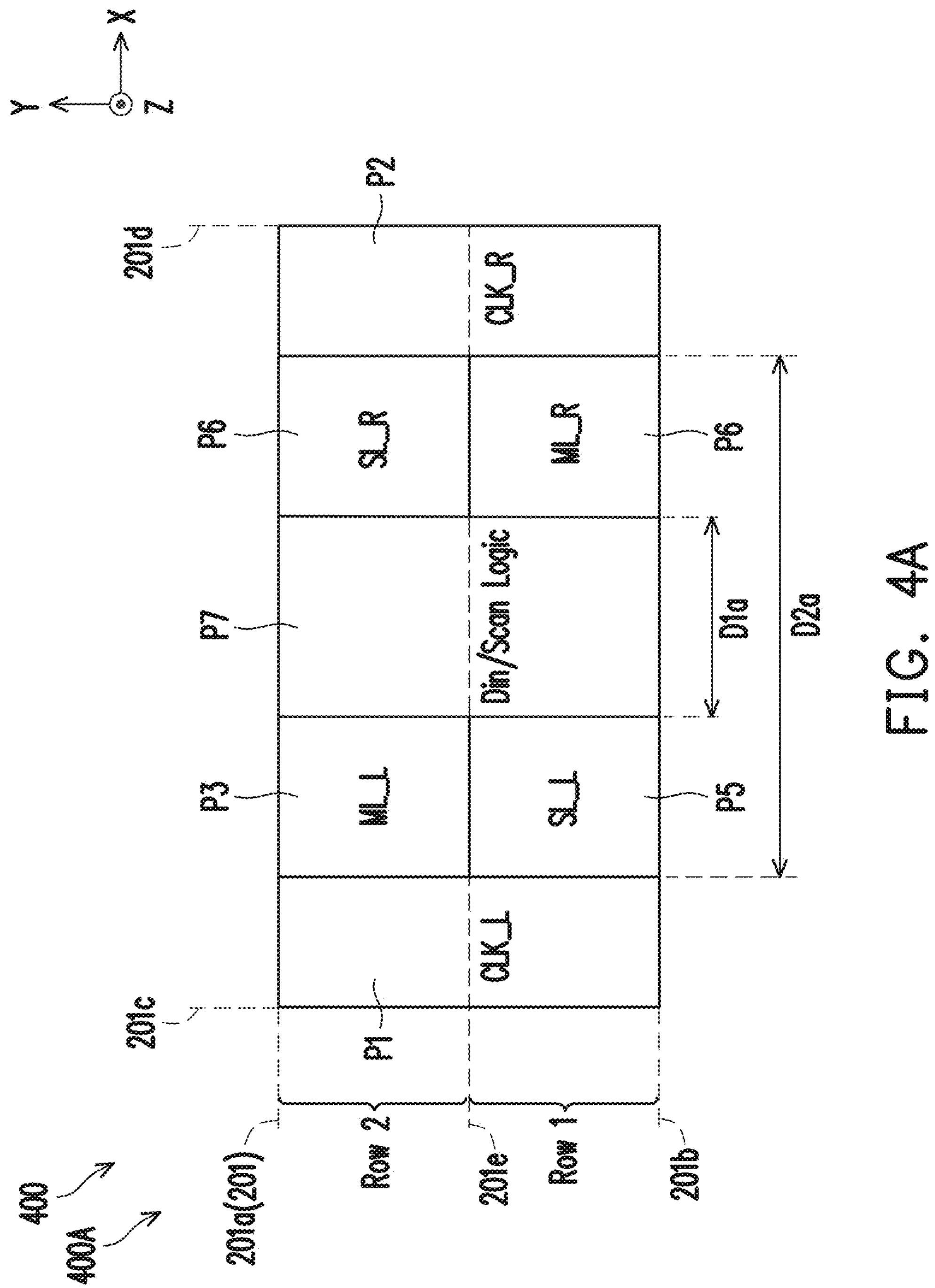
FIG. 4A is a diagram of a floorplan of an integrated circuit, in accordance with some embodiments.
Figure 4B:
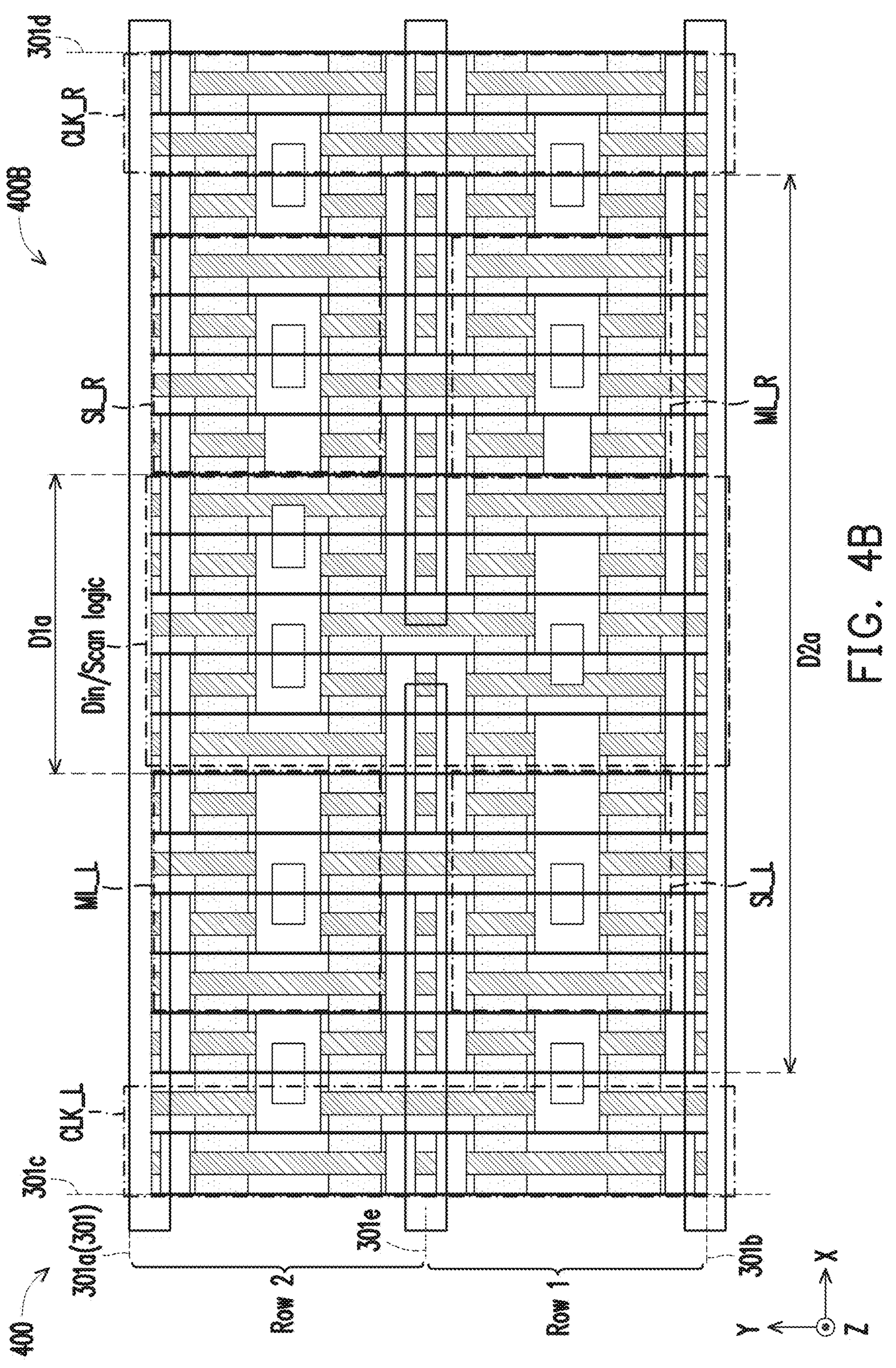
FIGS. 4B-4E are diagrams of an integrated circuit, in accordance with some embodiments.

FIG. 4A is a diagram of a floorplan 400A of an integrated circuit, in accordance with some embodiments.

In some embodiments, floorplan 400A is a floorplan of portion 100A of integrated circuit 100 of FIG. 1B or portion 100B of integrated circuit 100 of FIG. 1C. In some embodiments, floorplan 400A is a floorplan of integrated circuit 300 of FIGS. 4A-4E. In some embodiments, floorplan 400A corresponds to the layout 200 shown in FIGS. 2B-2E.

Floorplan 400A is a variation of floorplan 200A, and similar detailed description is therefore omitted. In comparison with floorplan 200A, the position of the second master latch region P4 is switched with the position of the second slave latch region P6, and similar detailed description is therefore omitted. For example, each of the first slave latch region P5 and the second master latch region P4 are in the first row (e.g., ROW1) of floorplan 400A, and each of the first master latch region P3 and the second slave latch region P6 are in the second row (e.g., ROW2) of floorplan 400A.

In some embodiments, at least one of the first master latch region P3 or the first slave latch region P5 is separated from at least one of the second master latch region P4 or the second slave latch region P6 by at least the distance D1*a*.

In some embodiments, by positioning the first slave latch region P5 in the first row (e.g., ROW1) of floorplan 400A, and the second slave latch region P6 in the second row (e.g., ROW2) of floorplan 400A, causes the first slave latch region P5 and the second slave latch region P6 to be separated from each other in both the first direction X and the second direction Y (e.g., a diagonal direction), thereby causing integrated circuit 400 to have better SEU or SEE performance than other approaches.

In some embodiments, by positioning the first master latch region P3 in the second row (e.g., ROW2) of floorplan 400A, and the second slave latch region P6 in the first row (e.g., ROW1) of floorplan 400A, causes the first master latch region P3 and the second slave latch region P6 to be separated from each other in both the first direction X and the second direction Y (e.g., another diagonal direction), thereby causing integrated circuit 400 to have better SEU or SEE performance than other approaches.

FIGS. 4B-4E are diagrams of an integrated circuit 400, in accordance with some embodiments.

FIGS. 4B-4E are corresponding diagrams of corresponding portions 400B-400E of an integrated circuit 400, simplified for ease of illustration.

Figure 4C:
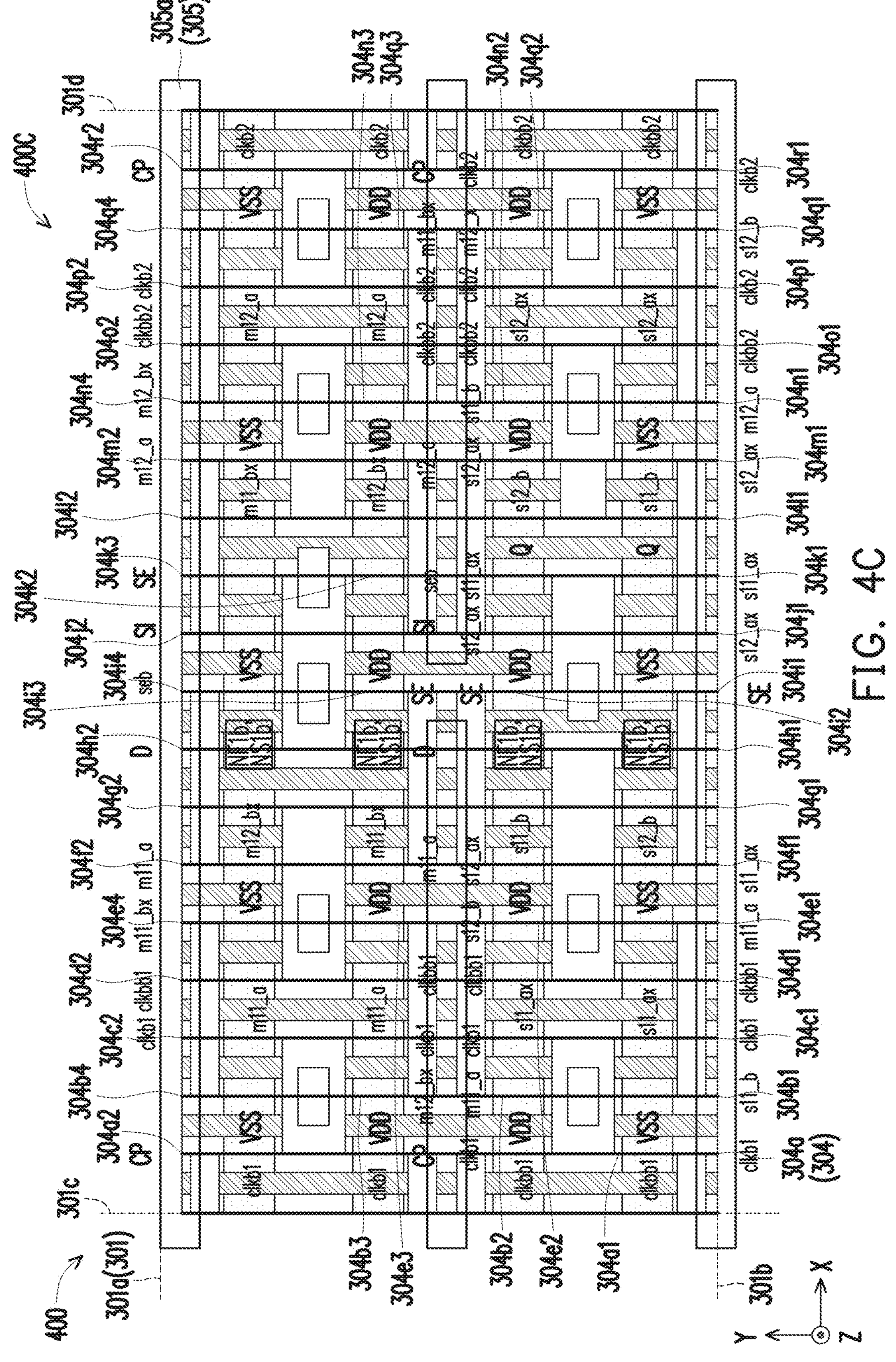
Figure 4D:
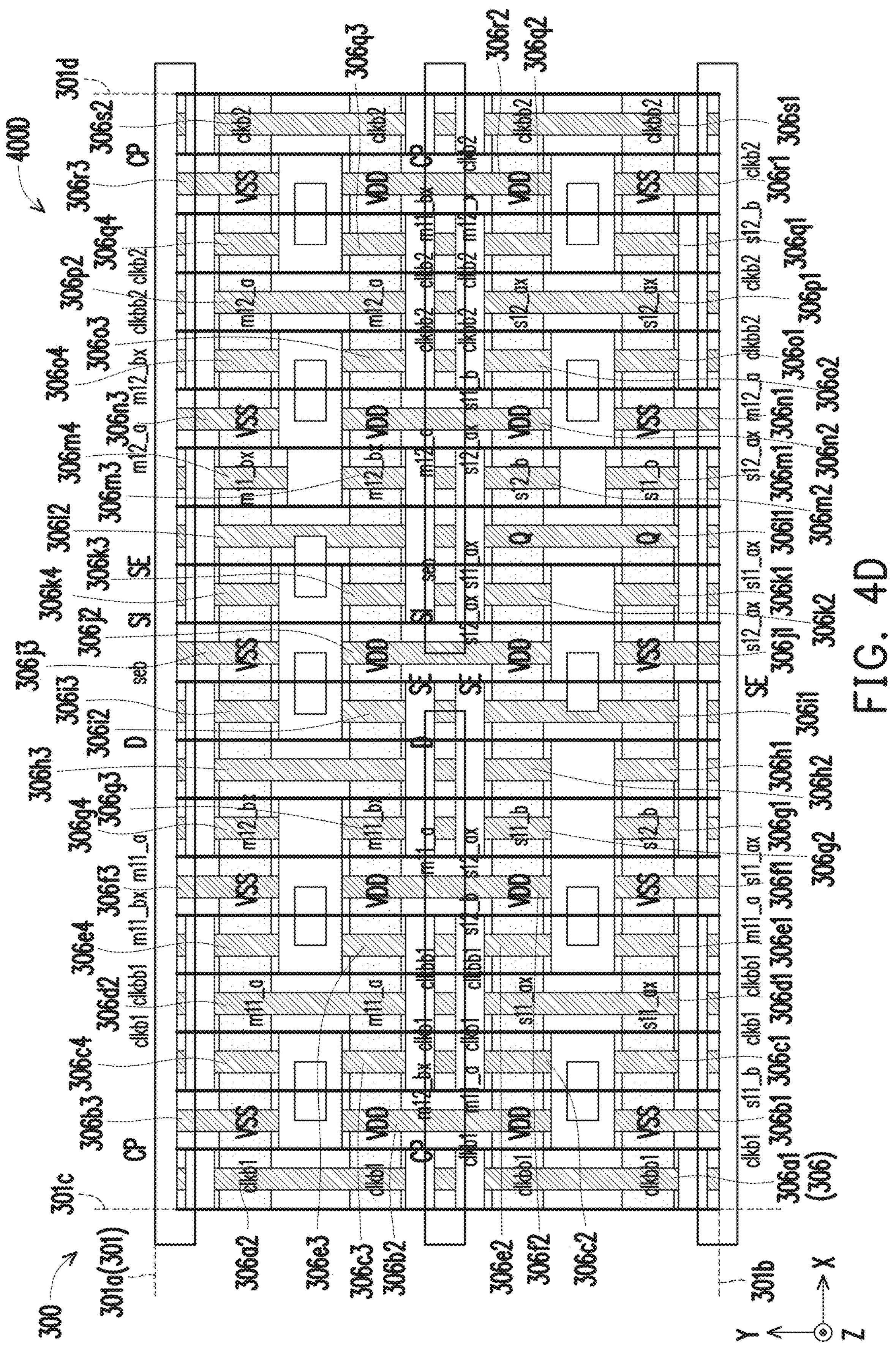
Figure 4E:
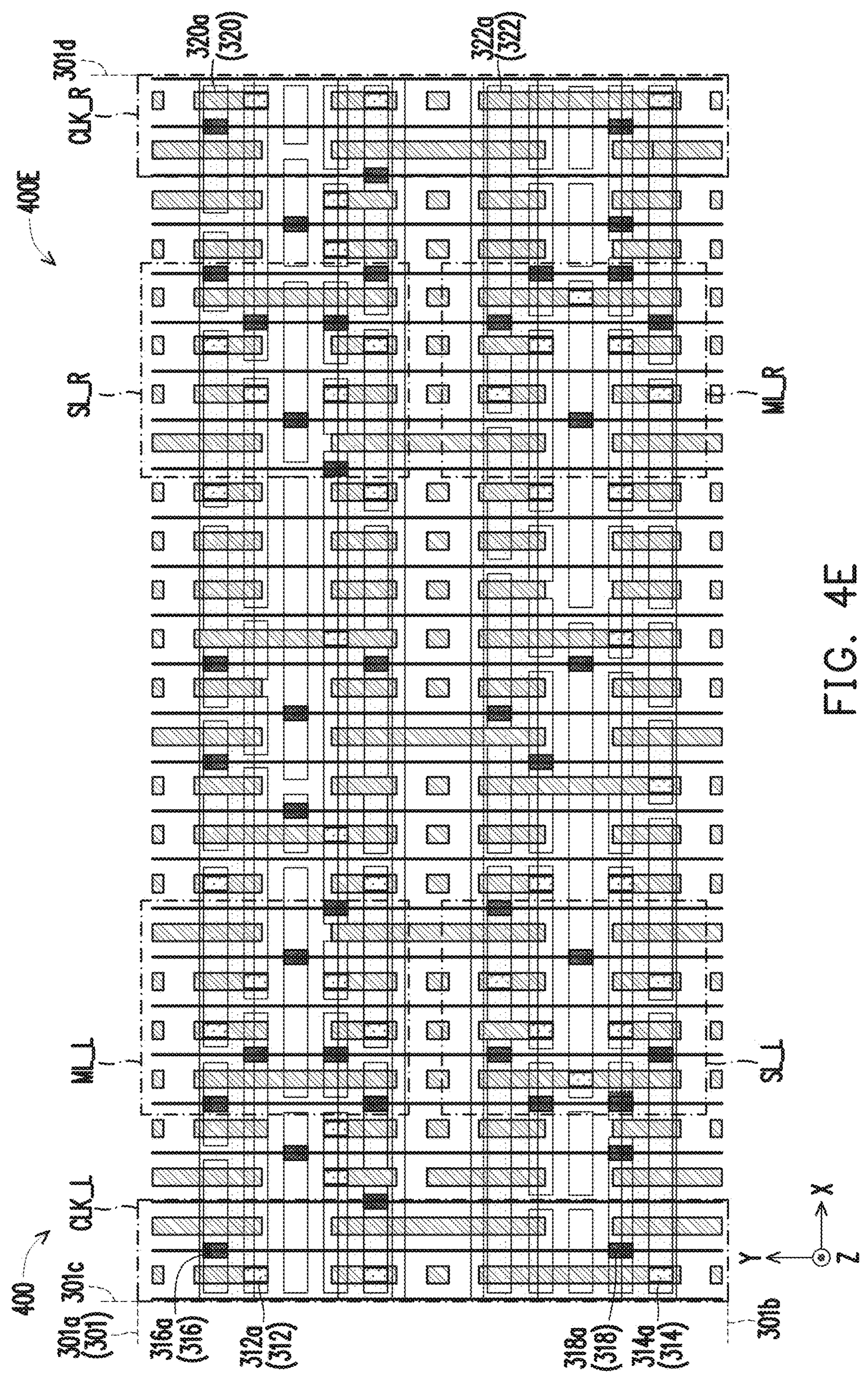

FIG. 4C is a diagram of a corresponding portion 400C of an integrated circuit 400, simplified for ease of illustration.

Portion 400B includes one or more features of integrated circuit 400 of the OD level, the POLY level, the CPODE level, the CPO level, the MD level and the CMD level. Portion 400B is manufactured by a portion similar to portion 200B.

Portion 400C includes one or more features of integrated circuit 400 of the OD level, the POLY level, the CPODE level, the CPO level, the MD level and the CMD level. Portion 400C is manufactured by a portion similar to portion 200C. Portion 400C is similar to portion 400D and portion 400E, and similar detailed description is therefore omitted. For example, in comparison with portion 400D and portion 400E, elements of the POLY level of portion 400C are labelled in FIG. 3B, but are not labelled in portion 400D and portion 400E for ease of illustration.

Portion 400D includes one or more features of integrated circuit 400 of the OD level, the POLY level, the CPODE level, the CPO level, the MD level and the CMD level. Portion 400D is manufactured by a portion similar to portion 200D. Portion 400D is similar to portion 400B and portion 400C, and similar detailed description is therefore omitted. For example, in comparison with portion 400B and portion 400C, elements of the MD level in portion 400D are labelled in FIG. 3D, but are not labelled in portion 400B and portion 400C for ease of illustration.

Portion 400E includes one or more features of integrated circuit 400 of the OD level, the POLY level, the CPODE level, the CPO level, the MD level, the CMD level, the VG level, the VD level and the M0 level.

Integrated circuit 400 is a top view of a portion 100A of at least integrated circuit 100 of FIG. 1B or a portion 100B of integrated circuit 100B of FIG. 1C.

Integrated circuit 400 is manufactured by a corresponding layout design similar to integrated circuit 400. Integrated circuit 400 is an embodiment of integrated circuit 100, and similar detailed description is omitted. For brevity FIGS. 4A-4E are described as integrated circuit 400, but in some embodiments, FIGS. 4A-4E also correspond to layout designs similar to layout design 200, structural elements of integrated circuit 400 also correspond to layout patterns, and structural relationships including alignment, lengths and widths, as well as configurations and layers of a corresponding layout design of integrated circuit 400 are similar to the structural relationships and configurations and layers of integrated circuit 400, and similar detailed description will not be described for brevity.

In some embodiments, integrated circuit 400 is manufactured by a layout design similar to layout design 200, and similar detailed description is omitted for brevity.

Integrated circuit 400 is a variation of integrated circuit 300 (FIGS. 3A-3E). For example, integrated circuit 400 illustrates an example of where the position of the second master latch region P4 is switched with the position of the second slave latch region P6, and similar detailed description is therefore omitted. In some embodiments, integrated circuit 400 includes the same elements as integrated circuit 300, and similar detailed description is therefore omitted.

Integrated circuit 400 includes at least the at least the set of active regions 302, the set of dummy gates 303, the set of gates 304, the set of contacts 306, the substrate 390, the insulating region 392 the set of vias 312, the set of vias 314, the set of vias 316, the set of vias 318, the set of conductors 320 and the set of conductors 322.

In comparison with integrated circuit 300 of FIGS. 3A-3F, nodes sl2_*b*, sl1_*b*, and sl2_*ax* of second slave latch region P6 of integrated circuit 400 replaces nodes ml2_*bx*, ml1_*bx*, and ml2_*a* of second master slave latch region P4 of integrated circuit 300, and similar detailed description is therefore omitted.

In comparison with integrated circuit 300 of FIGS. 3A-3F, nodes ml2_*bx*, ml1_*bx*, and ml2_*a* of second master slave latch region P4 of integrated circuit 400 replaces nodes sl2_*b*, sl1_*b*, and sl2_*ax* of second slave latch region P6 integrated circuit 300, and similar detailed description is therefore omitted.

In comparison with integrated circuit 300 of FIGS. 3A-C and 3E-3F, contact 306*m*3 of integrated circuit 400 corresponds to node sl2_*b*, contact 306*m*4 of integrated circuit 400 corresponds to node sl1_*b*, contact 306*p*2 of integrated circuit 400 corresponds to node sl2_*ax*, contact 306*m*2 of integrated circuit 400 corresponds to node ml2_*bx*, contact 306*m*1 of integrated circuit 400 corresponds to node ml1_*bx*, and contact 306*p*1 of integrated circuit 400 corresponds to node ml2_*a*, and similar detailed description is therefore omitted.

In some embodiments, integrated circuit 400 achieves one or more of the benefits discussed herein.

Other configurations, arrangements on other layout levels or quantities of structures in integrated circuit 400 are within the scope of the present disclosure.

Figure 5A:
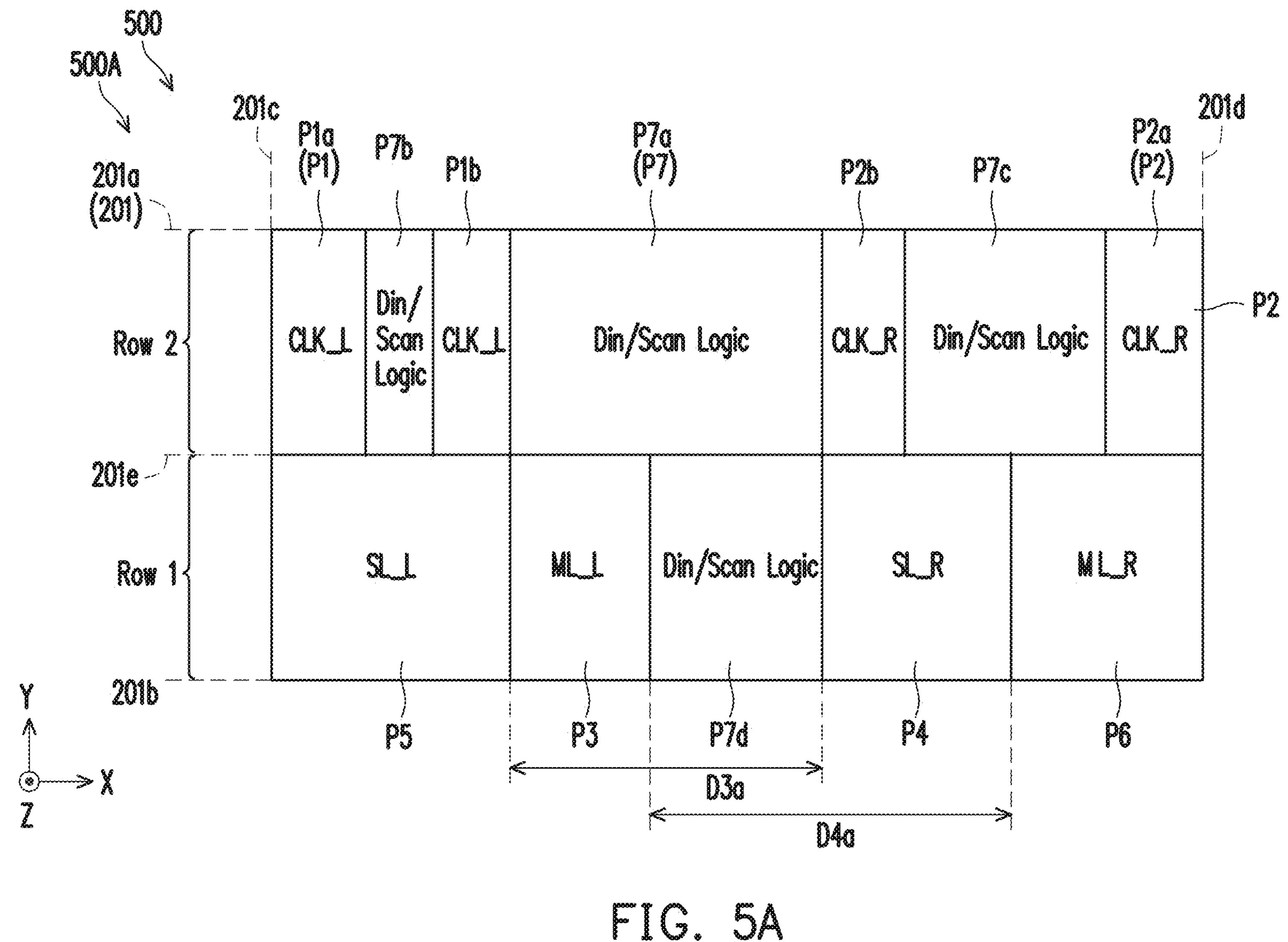
FIG. 5A is a diagram of a floorplan of an integrated circuit, in accordance with some embodiments.

FIG. 5A is a diagram of a floorplan 500A of an integrated circuit, in accordance with some embodiments.

In some embodiments, floorplan 500A is a floorplan of portion 100A of integrated circuit 100 of FIG. 1B or portion 100B of integrated circuit 100 of FIG. 1C. In some embodiments, floorplan 500A is a floorplan of integrated circuit 500 of FIGS. 5B-5E. In some embodiments, floorplan 500A corresponds to the layout 200 shown in FIGS. 2B-2E.

Floorplan 500A is a variation of floorplan 200A, and similar detailed description is therefore omitted. In comparison with floorplan 200A, the position of the first master latch region P3 and the second master latch region P4 are positioned in the first row ROW1, and similar detailed description is therefore omitted.

In comparison with floorplan 200A, the first clock region P1 is divided into a clock region P1*a* and a clock region P1*b*, and the first clock region P1 is positioned in the second row ROW2, and similar detailed description is therefore omitted.

In comparison with floorplan 200A, the second clock region P2 is divided into a clock region P2*a* and a clock region P2*b*, and the second clock region P2 is positioned in the second row ROW2, and similar detailed description is therefore omitted.

In comparison with floorplan 200A, the data input/scan logic region P7 is divided into a data input/scan logic region P7*a*, a data input/scan logic region P7*b*, a data input/scan logic region P7*c*, and a data input/scan logic region P7*d*, and similar detailed description is therefore omitted.

The data input/scan logic regions P7*a*, P7*b* and P7*c* are positioned in the second row ROW2.

The data input/scan logic region P7*d* is positioned in the first row ROW1.

The second row ROW2 of floorplan 500A includes the clock region P1*a*, the data input/scan logic region P7*b*, the clock region P1*b*, the data input/scan logic region P7*a*, the clock region P2*b*, data input/scan logic region P7*c* and the clock region P2*a*.

The clock region P1*a* and the clock region P2*a* are on opposite ends of floorplan 500A from each other. The data input/scan logic region P7*b* is between the clock region P1*a* and the clock region P1*b*. The clock region P1*b* is between the data input/scan logic region P7*b* and the data input/scan logic region P7*a*. The data input/scan logic region P7*a* is between the clock region P1*b* and the clock region P2*b*. The clock region P2*b* is between the data input/scan logic region P7*a* and the data input/scan logic region P7*c*. The data input/scan logic region P7*c* is between the clock region P2*b* and the clock region P2*a*.

The first row ROW1 of floorplan 500A includes the first slave latch region P5, the first master latch region P3, the data input/scan logic region P7*d*, the second slave latch region P6 and the second slave latch region P6.

The first slave latch region P5 and the second master latch region P4 are on opposite ends of floorplan 500A from each other. The first master latch region P3 is between the first slave latch region P5 and the data input/scan logic region P7*d*. The data input/scan logic region P7*d* is between the first master latch region P3 and the second slave latch region P6. The second slave latch region P6 is between the data input/scan logic region P7*d* and the second master latch region P4.

In some embodiments, the first slave latch region P5 is separated from the second slave latch region P6 by at least a distance D3*a*. In some embodiments, the distance D3*a* is greater than or equal to a third range. In some embodiments, the third range is between 400 nm to about 1000 nm. Other ranges or values for the third range are within the scope of the present disclosure.

In some embodiments, if the distance D3*a* is greater than or equal to the third range, then the first slave latch region P5 and the second slave latch region P6 are sufficiently separated from each other, thereby decreasing the likelihood of an SEU or SEE at both regions (e.g., the first slave latch region P5 and the second slave latch region P6) at the same time, thus increasing reliability and accuracy of floorplan 500A or integrated circuit 500 compared to other approaches.

In some embodiments, if the distance D3*a* is less than the third range, then the first slave latch region P5 and the second slave latch region P6 are not sufficiently separated from each other, thereby increasing the likelihood of an SEU or SEE at both regions (e.g., the first slave latch region P5 and the second slave latch region P6) at the same time, thus decreasing reliability and accuracy of floorplan 500A or integrated circuit 500 compared to other approaches.

In some embodiments, the first master latch region P3 is separated from the second master latch region P4 by at least a distance D4*a*. In some embodiments, the distance D4*a* is greater than or equal to a fourth range. In some embodiments, the fourth range is between 400 μm to about 1000 μm. Other ranges or values for the fourth range are within the scope of the present disclosure.

In some embodiments, if the distance D4*a* is greater than or equal to the fourth range, then the first master latch region P3 and the second master latch region P4 are sufficiently separated from each other, thereby decreasing the likelihood of an SEU or SEE at both regions (e.g., the first master latch region P3 and the second master latch region P4) at the same time, thus increasing reliability and accuracy of floorplan 500A or integrated circuit 500 compared to other approaches.

In some embodiments, if the distance D4*a* is less than the fourth range, then the first master latch region P3 and the second master latch region P4 are not sufficiently separated from each other, thereby increasing the likelihood of an SEU or SEE at both regions (e.g., the first master latch region P3 and the second master latch region P4) at the same time, thus decreasing reliability and accuracy of floorplan 500A or integrated circuit 500 compared to other approaches.

FIGS. 5B-5E are diagrams of an integrated circuit 500, in accordance with some embodiments.

FIGS. 5B-5E are corresponding diagrams of corresponding portions 500B-500E of an integrated circuit 500, simplified for ease of illustration.

Figure 5B:
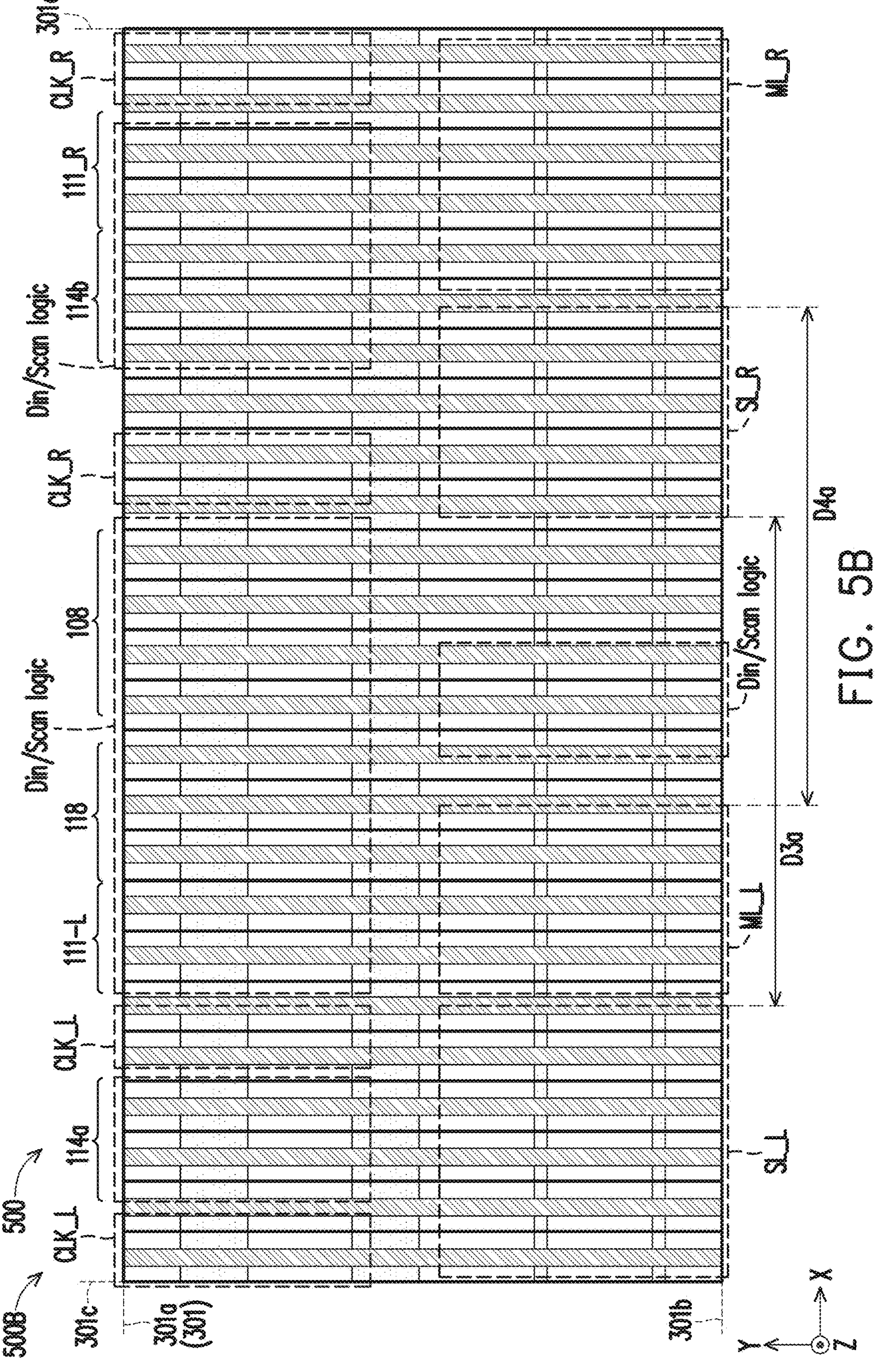
FIGS. 5B-5E are diagrams of an integrated circuit, in accordance with some embodiments.
Figure 5C:
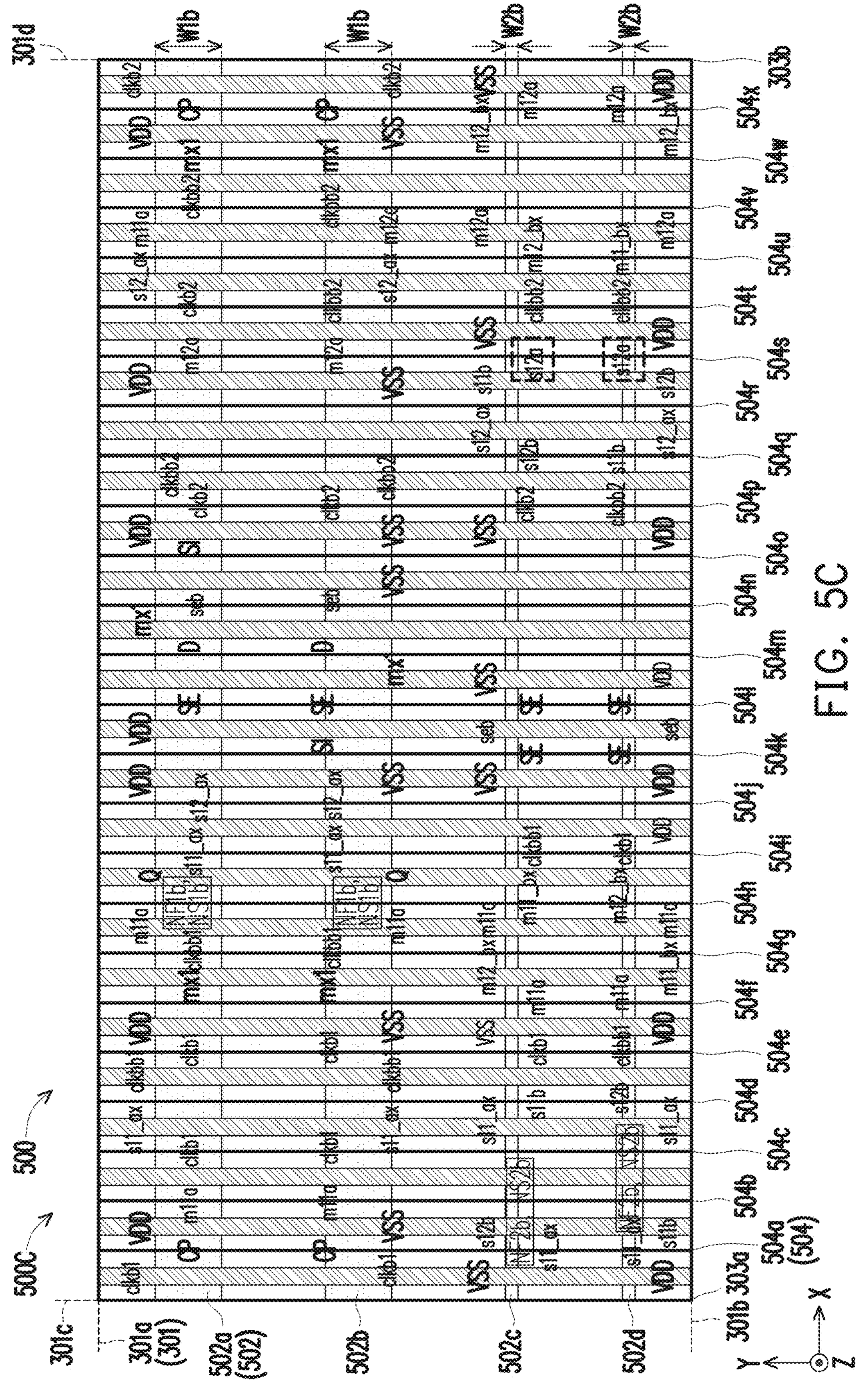
Figure 5D:
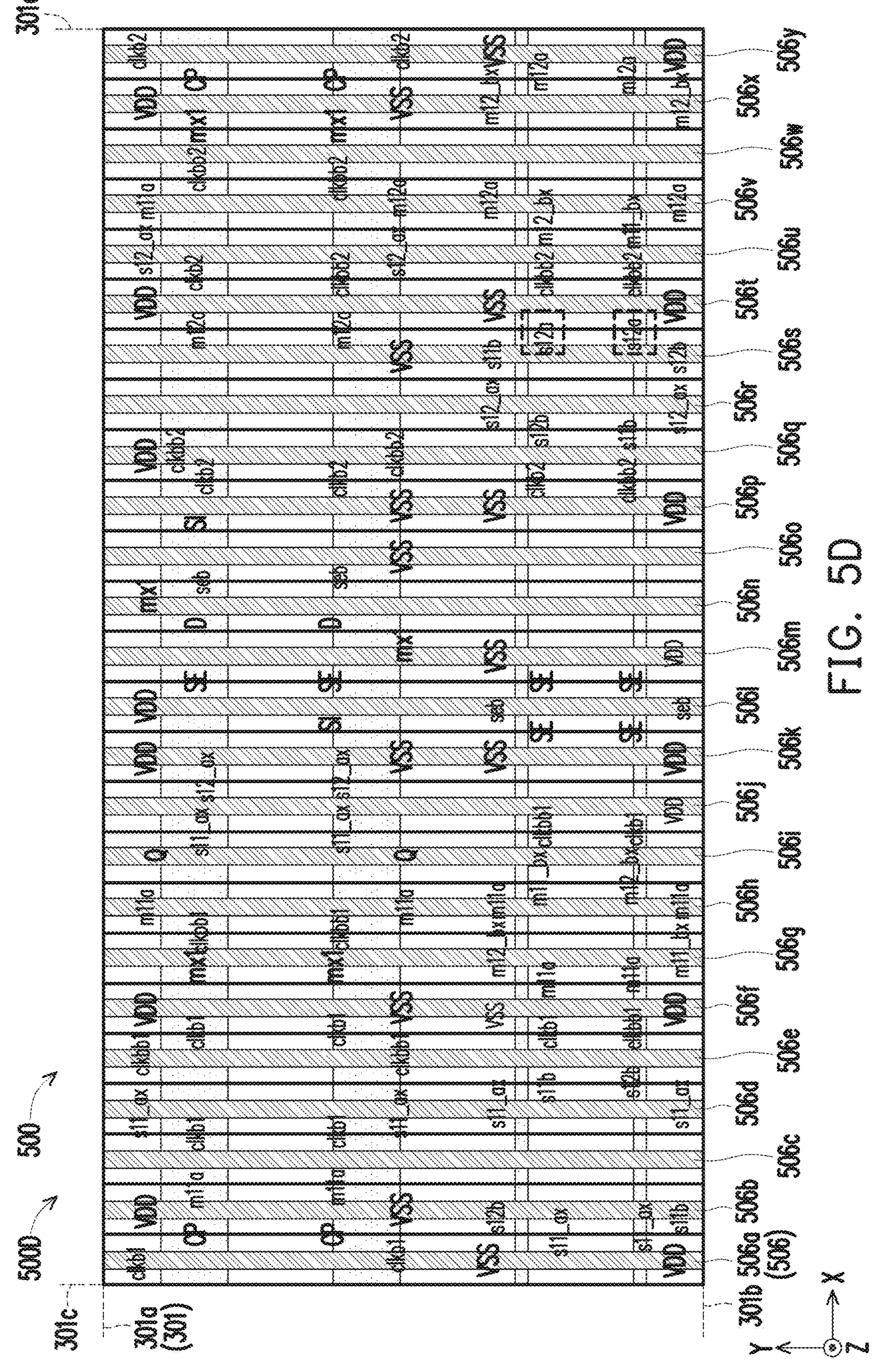
Figure 5E:
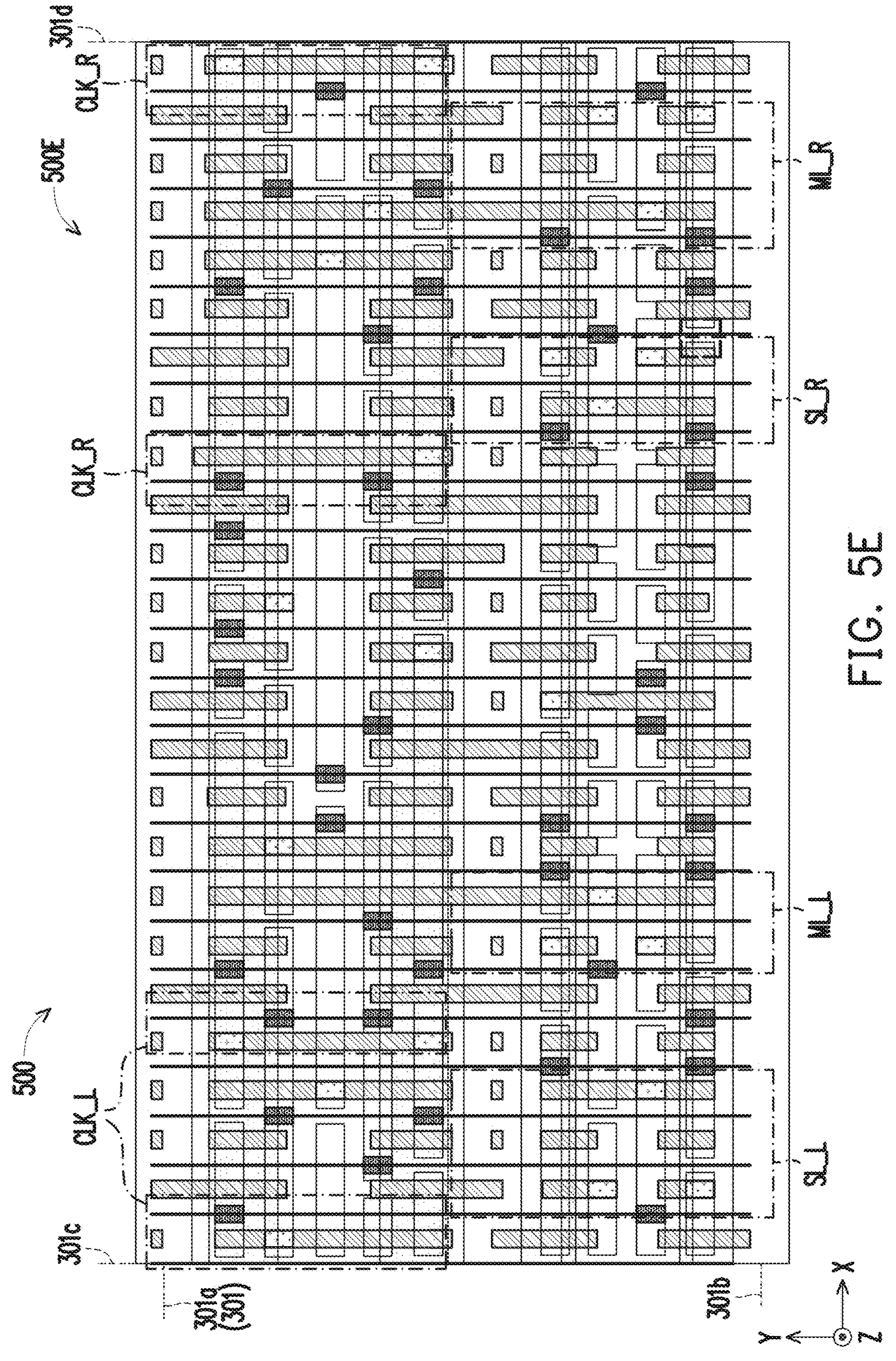

FIG. 5C is a diagram of a corresponding portion 500C of an integrated circuit 500, simplified for ease of illustration.

Portion 500B includes one or more features of integrated circuit 500 of the OD level, the POLY level, the CPODE level, the CPO level, the MD level and the CMD level. Portion 500B is manufactured by a portion similar to portion 200B.

Portion 500C includes one or more features of integrated circuit 500 of the OD level, the POLY level, the CPODE level, the CPO level, the MD level and the CMD level. Portion 500C is manufactured by a portion similar to portion 200C. Portion 500C is similar to portion 500D and portion 500E, and similar detailed description is therefore omitted. For example, in comparison with portion 500D and portion 500E, elements of the POLY level of portion 500C are labelled in FIG. 3B, but are not labelled in portion 500D and portion 500E for ease of illustration.

Portion 500D includes one or more features of integrated circuit 500 of the OD level, the POLY level, the CPODE level, the CPO level, the MD level and the CMD level. Portion 500D is manufactured by a portion similar to portion 200D. Portion 500D is similar to portion 500B and portion 500C, and similar detailed description is therefore omitted. For example, in comparison with portion 500B and portion 500C, elements of the MD level in portion 500D are labelled in FIG. 3D, but are not labelled in portion 500B and portion 500C for ease of illustration.

Portion 500E includes one or more features of integrated circuit 500 of the OD level, the POLY level, the CPODE level, the CPO level, the MD level, the CMD level, the VG level, the VD level and the M0 level.

Integrated circuit 500 is a top view of a portion 100A of at least integrated circuit 100 of FIG. 1B or a portion 100B of integrated circuit 100B of FIG. 1C.

Integrated circuit 500 is manufactured by a corresponding layout design similar to integrated circuit 500. Integrated circuit 500 is an embodiment of integrated circuit 100, and similar detailed description is omitted. For brevity FIGS. 5A-5E are described as integrated circuit 500, but in some embodiments, FIGS. 5A-5E also correspond to layout designs similar to layout design 200, structural elements of integrated circuit 500 also correspond to layout patterns, and structural relationships including alignment, lengths and widths, as well as configurations and layers of a corresponding layout design of integrated circuit 500 are similar to the structural relationships and configurations and layers of integrated circuit 500, and similar detailed description will not be described for brevity.

In some embodiments, integrated circuit 500 is manufactured by a layout design similar to layout design 200, and similar detailed description is omitted for brevity.

Integrated circuit 500 is a variation of integrated circuit 300 (FIGS. 3A-3E). For example, integrated circuit 500 illustrates an example of where the set of active regions 502 replaces the set of active regions 302 of FIGS. 3A-3E, and similar detailed description is therefore omitted. For example, integrated circuit 500 illustrates an example of where one or more active regions 502*a*, 502*b*, 502*c* or 502*d* include regions with different widths in the second direction Y.

Integrated circuit 500 includes at least the at least the set of active regions 502, the set of dummy gates 303, a set of gates 504, a set of contacts 506, the substrate 390, the insulating region 392, a set of vias 512, a set of vias 514, a set of vias 516, a set of vias 518, a set of conductors 520 and a set of conductors 522.

In comparison with integrated circuit 300 of FIGS. 3A-3E, set of active regions 502 of integrated circuit 500 replaces the set of active regions 302, set of gates 504 of integrated circuit 500 replaces the set of gates 304, set of contacts 506 of integrated circuit 500 replaces the set of contacts 306, the set of vias 512 of integrated circuit 500 replaces the set of vias 312, the set of vias 514 of integrated circuit 500 replaces the set of vias 314, the set of vias 516 of integrated circuit 500 replaces the set of vias 316, the set of vias 518 of integrated circuit 500 replaces the set of vias 318, the set of conductors 520 of integrated circuit 500 replaces the set of conductors 320, and the set of conductors 522 of integrated circuit 500 replaces the set of conductors 322, and similar detailed description is therefore omitted.

The set of active regions 502 includes at least active region 502*a*, 502*b*, 502*c* or 502*d*.

In some embodiments, the set of active regions 502 corresponds to fin structures (not shown) of finFETs.

In some embodiments, the set of active regions 502 corresponds to planar structures (not shown) of planar transistors. In some embodiments, the set of active regions 502 corresponds to nanosheet structures (not labelled) of nanosheet transistors.

Other transistor types are within the scope of the present disclosure. For example, in some embodiments, the set of active regions 502 corresponds to nanowire structures (not shown) of nanowire transistors.

As shown in FIG. 5B, active regions 502*b* and 502*c* correspond to a supply voltage VDD, and therefore active regions 502*b* and 502*c* correspond to PMOS transistors. As shown in FIG. 5B, active regions 502*a* and 502*d* correspond to a reference supply voltage VSS, and therefore active regions 502*a* and 502*d* correspond to NMOS transistors.

In some embodiments, active regions 502*a* and 502*d* are source and drain regions of NMOS transistors of integrated circuits 300, 400 or 500, and active regions 502*b* and 502*c* are source and drain regions of PMOS transistors of integrated circuits 300, 400 or 500.

In some embodiments, active regions 502*a* and 502*d* are source and drain regions of PMOS transistors of integrated circuit 300, 400 or 500, and active regions 502*b* and 502*c* are source and drain regions of NMOS transistors of integrated circuits 300, 400 or 500.

At least one of active region 502*a* or 502*b* has a width W1*b* in the second direction Y.

At least one of active region 502*c* or 502*d* has a width W2*b* in the second direction Y.

The width W1*b* is different from the width W2*b*. In some embodiments, the width W1*b* is greater than the width W2*b*.

In some embodiments, at least the width W1*b* of active regions 502*a* and 502*b* is directly related to the number of fins NF1*b* in corresponding active regions 502*a* and 502*b*. In some embodiments, active regions 502*a* and 502*b* have a number of fins NF1*b* in corresponding active regions 502*a* and 502*b*.

In some embodiments, at least the width W2*b* of active regions 502*c* and 502*d* is directly related to the number of fins NF2*b* in corresponding active regions 502*c* and 502*d*. In some embodiments, active regions 502*c* and 502*d* have a number of fins NF2*b* in corresponding active regions 502*c* and 502*d*.

In some embodiments, the number of fins NF1*b* of active regions 502*a* or 502*b*, and the number of fins NF2*b* of active regions 502*c* or 502*d* is related to the corresponding speed, driving strength and power of the conducting devices (e.g., transistors) in the corresponding active regions 502*a*, 502*b*, 502*c* or 502*d*.

In some embodiments, the number of fins NF1*b* is greater than the number of fins NF2*b*. In some embodiments, the number of fins NF1*b* is at least 3 fins, and the number of fins NF2*b* is 2 fins. In some embodiments, the number of fins NF1*b* is at least 2 fins, and the number of fins NF2*b* is 1 fin. In some embodiments, the number of fins NF1*b* is at least 1 fin.

Other numbers of fins for at least NF1*b* or Nf2*b* are within the scope of the present disclosure.

In some embodiments, by including the number of fins NF1*b* of active regions 502*a* or 502*b*, and the number of fins NF2*b* of active regions 502*c* or 502*d* in different rows (e.g., ROW 1 and ROW 2) of floorplan 400A or integrated circuit 500 thereby allows floorplan 400A or integrated circuit 500 to have a hybrid row layout that has less power planning and area (PPA) penalty compared to other approaches.

In some embodiments, active regions 502*a* and 502*b* have a number of nanosheets NS1*b* in corresponding active regions 502*a* and 502*b*. In some embodiments, active regions 502*c* and 502*d* have a number of nanosheets NS2*b* in corresponding active regions 502*c* and 502*d*.

In some embodiments, the number of nanosheets NS1*b* is greater than the number of nanosheets NS2*b*.

In some embodiments, the width W1*b* of active regions 502*a* or 502*b*, or the width W2*b* of active regions 502*c* or 502*d* is related to the number of conducting devices (e.g., transistors) of integrated circuit 500, and the corresponding speed, driving strength and power of the conducting devices (e.g., transistors) in the corresponding active regions 502*a*, 502*b*, 502*c* or 502*d*.

Other configurations, arrangements on other layout levels or quantities of structures in the set of active regions 502 are within the scope of the present disclosure.

Set of gates 504 includes at least gate 504*a*, 504*b*, . . . , 504*w* or 504*x*.

In comparison with integrated circuit 300 of FIGS. 3A-3E, at least one or more of gate 504*a*, 504*b*, . . . , 504*w* or 504*x* replaces at least one or more of gate 304*a*, 304*b*, . . . , 304*q* or 304*r* of the set of gates 304, and similar detailed description is therefore omitted.

Set of contacts 506 includes at least contact 506*a*, 506*b*, . . . , 506*x* or 506*y*.

In comparison with integrated circuit 300 of FIGS. 3A-3E, at least one or more of contact 506*a*, 506*b*, . . . , 506*x* or 506*y* replaces at least one or more of contact 306*a*, 306*b*, . . . , 306*r* or 306*s* of the set of contacts 306, and similar detailed description is therefore omitted.

Set of vias 512 includes at least via 512*a*, 512*b*, . . . , 512*l*.

In comparison with integrated circuit 300 of FIGS. 3A-3E, at least one or more of via 512*a*, 512*b*, . . . , 512*l* replaces at least one or more of via 312*a*, 312*b*, . . . , 312*x* of the set of vias 312, and similar detailed description is therefore omitted.

Set of vias 514 includes at least via 514*a*, 514*b*, . . . , 514*m*.

In comparison with integrated circuit 300 of FIGS. 3A-3E, at least one or more of via 514*a*, 514*b*, . . . , 514*m* replaces at least one or more of via 314*a*, 314*b*, . . . , 314*r* of the set of vias 314, and similar detailed description is therefore omitted.

Set of vias 516 includes at least via 516*a*, 516*b*, . . . , 516*y*.

In comparison with integrated circuit 300 of FIGS. 3A-3E, at least one or more of via 516*a*, 516*b*, . . . , 516*y* replaces at least one or more of via 316*a*, 316*b*, . . . , 316*t* of the set of vias 316, and similar detailed description is therefore omitted.

Set of vias 518 includes at least via 518*a*, 518*b*, . . . , 518*s*.

In comparison with integrated circuit 300 of FIGS. 3A-3E, at least one or more of via 518*a*, 518*b*, . . . , 518*s* replaces at least one or more of via 318*a*, 318*b*, . . . , 318*s* of the set of vias 318, and similar detailed description is therefore omitted.

Set of conductors 520 includes at least conductor 520*a*, 520*b*, . . . , 520*e*.

In comparison with integrated circuit 300 of FIGS. 3A-3E, at least one or more of conductor 520*a*, 520*b*, . . . , 520*e* replaces at least one or more of conductor 320*a*, 320*b*, . . . , 320*e* of the set of conductors 320, and similar detailed description is therefore omitted.

Set of conductors 522 includes at least conductor 522*a*, 522*b*, . . . , 522*e*.

In comparison with integrated circuit 300 of FIGS. 3A-3E, at least one or more of conductor 522*a*, 522*b*, . . . , 522*e* replaces at least one or more of conductor 322*a*, 322*b*, . . . , 322*e* of the set of conductors 322, and similar detailed description is therefore omitted.

In some embodiments, integrated circuit 500 achieves one or more of the benefits discussed herein.

Other configurations, arrangements on other layout levels or quantities of structures in integrated circuit 500 are within the scope of the present disclosure.

FIGS. 6A-6B are corresponding functional flow charts of corresponding methods 600A-600B of manufacturing an IC device, in accordance with some embodiments.

FIG. 6A is a functional flow chart of a method 600A of manufacturing an IC device, in accordance with some embodiments. It is understood that additional operations may be performed before, during, and/or after the method 600A depicted in FIG. 6A, and that some other processes may only be briefly described herein.

In some embodiments, methods 600A and 600B are an embodiment of operation 704 of method 700. In some embodiments, the methods 600A-800 are usable to manufacture or fabricate at least integrated circuit 300, 400 or 500, or an integrated circuit with similar features as at least layout design 200.

In operation 602 of method 600A, a first set of transistors of a first type are fabricated in a first row. In some embodiments, the first row extends in the first direction X. In some embodiments, operation 602 includes at least operation 632, 634, 636 or 638 of method 600B.

In some embodiments, the first row or a second row includes ROW1. In some embodiments, the first row or the second row includes ROW2.

In operation 604 of method 600A, a second set of transistors of a second type are fabricated in a second row. In some embodiments, operation 604 includes at least operation 632, 634, 636 or 638 of method 600B.

In some embodiments, the first type is an n-type, and the second type is a p-type. In some embodiments, the first type is a p-type, and the second type is an n-type.

In some embodiments, the second row extends in the first direction X, and is separated from the first row in the second direction Y. In some embodiments, the second type is different from the first type.

In some embodiments, the first set of transistors and the second set of transistors include a first master latch circuit and a second master latch circuit. In some embodiments, the first master latch circuit and the second master latch circuit are separated from each other in the first direction by a first distance.

In some embodiments, the first master latch circuit corresponds to one of region ML_L or ML_R, the second master latch circuit corresponds to the other of region ML_R or ML_L, a first slave latch circuit corresponds to one of region SL_L or SL_R, and a second slave latch circuit corresponds to the other of region SL_R or SL_L.

In some embodiments, the first distance includes at least one of distance D1$a$, D3$a$ or D4$a$.

In operation 606 of method 600A, a third set of transistors of the second type are fabricated in a third row. In some embodiments, the third row extends in the first direction X. In some embodiments, operation 606 includes at least operation 632, 634, 636 or 638 of method 600B.

In operation 608 of method 600A, a fourth set of transistors of the first type are fabricated in a fourth row. In some embodiments, the fourth row extends in the first direction X. In some embodiments, operation 608 includes at least operation 632, 634, 636 or 638 of method 600B.

In some embodiments, the third row or the fourth row includes ROW1. In some embodiments, the third row or the fourth row includes ROW2.

In some embodiments, the third set of transistors and the fourth set of transistors include a first slave latch circuit and a second slave latch circuit. In some embodiments, the first slave latch circuit and the second slave latch circuit are separated from each other in the first direction X by a second distance. In some embodiments, the second distance includes at least one of distance D1$a$, D3$a$ or D4$a$.

In some embodiments, the first row corresponds to active region 202$a$, the second row corresponds to active region 202$b$, the third corresponds to active region 202$c$, and the fourth corresponds to active region 202$d$. In these embodiments, the first set of transistors include the set of transistors located in at least active region 302$a$, the second set of transistors include the set of transistors located in at least active region 302$b$, the third set of transistors include the set of transistors located in at least active region 302$c$, and the fourth set of transistors include the set of transistors located in at least active region 302$d$.

In some embodiments, the first row and the third row correspond to active region 502$c$, and the second row and the fourth row correspond to active region 502$d$. In these embodiments, the first set of transistors include the set of transistors located in at least active region 502$c$, the second set of transistors include the set of transistors located in at least active region 502$c$, the third set of transistors include the set of transistors located in at least active region 502$d$, and the fourth set of transistors include the set of transistors located in at least active region 502$d$.

In operation 610 of method 600A, portions of the first set of transistors, the second set of transistors, the third set of transistors and the fourth set of transistors are electrically coupled together.

In some embodiments, operation 610 includes operation 612 and 614. In some embodiments, operation 610 includes at least operation 640 of method 600B.

In operation 612 of method 600A, the first master latch circuit and the second master latch circuit are electrically coupled together.

In operation 614 of method 600A, the first slave latch circuit and the second slave latch circuit are electrically coupled together.

FIG. 6B is a functional flow chart of a method 600B of manufacturing an IC device, in accordance with some embodiments. It is understood that additional operations may be performed before, during, and/or after the method 600B depicted in FIG. 6B, and that some other processes may only be briefly described herein.

In operation 632 of method 600A, a set of active regions 302 or 502 of a set of transistors is formed in a front-side (e.g., first level) of a substrate 390. In some embodiments, the set of transistors of at least method 600A includes one or more transistors in the set of active regions 302 or 502. In some embodiments, the set of transistors of at least method 600A includes one or more transistors described herein.

In some embodiments, the set of active regions of method 600A includes a first active region, a second active region, a third active region and a fourth active region in the first level (e.g., OD) of substrate 290.

In some embodiments, the first active region corresponds to a first set of transistors of a first type (e.g., p-type or n-type). In some embodiments, the second active region corresponds to a second set of transistors of a second type (e.g., n-type or p-type) different from the first type. In some embodiments, the third active region corresponds to a third set of transistors of the second type. In some embodiments, the fourth active region corresponds to a fourth set of transistors of the first type.

In some embodiments, operation 632 further includes at least operation 632$a$. In some embodiments, operation 632$a$ (not shown) includes fabricating source and drain regions of the set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1\times10^{12}$ atoms/cm$^3$ to $1\times10^{14}$ atoms/cm$^3$. Other dopant concentrations are in the scope of the present disclosure.

In some embodiments, the first well comprises n-type dopants. In some embodiments, the n-type dopants include phosphorus, arsenic or other suitable n-type dopants. In some embodiments, the n-type dopant concentration ranges from about $1\times10^{12}$ atoms/cm$^3$ to about $1\times10^{14}$ atoms/cm$^3$. Other dopant concentrations are in the scope of the present disclosure.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In operation 634 of method 600A, a first conductive material is deposited over source/drain regions of at least one of the first, second, third or fourth set of transistors on a second level thereby forming a set of contacts of the set of transistors. In some embodiments, the second level of at least method 600A includes the MD level.

In some embodiments, the set of contacts overlap at least the first active region, the second active region, the third active region or the fourth active region. In some embodiments, the set of contacts includes a first contact that overlaps a first region of the first active region and a first region of the second active region. In some embodiments, the first contact electrically coupling the first region of the first active region and the first region of the second active region together.

In some embodiments, the source/drain regions of the set of transistors of at least method 600A includes the source/drain regions of one or more transistors in the set of active regions 302 or 502. In some embodiments, the set of contacts of at least method 600A include at least the set of contacts 306 or 506. In some embodiments, the set of contacts of at least method 600A includes features in the MD level.

In operation 636 of method 600A, a set of gate structures of the set of transistors is formed on a third level. In some embodiments, the set of gate structures of at least method 600A includes at least one or more of gates of the set of gates 303, 304 or 504. In some embodiments, the third level of at least method 600A includes the POLY level.

In some embodiments, a gate region of one or more gates of the set of gates is between the drain region and the source region. In some embodiments, the gate region is over the first well and the substrate. In some embodiments, fabricating the gate regions of operation 636 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 638 of method 600A, a first set of vias and a second set of vias are formed.

In some embodiments, the first set of vias of at least method 600A are in the VG level. In some embodiments, the first set of vias of at least method 600A includes at least the set of vias in the VG level. In some embodiments, the first set of vias are formed over the set of gates.

In some embodiments, the second set of vias of at least method 600A are in the VD level. In some embodiments, the second set of vias of at least method 600A includes at least the set of vias in the VD level. In some embodiments, the second set of vias are formed over the set of contacts.

In some embodiments, operation 638 includes forming a first and second set of self-aligned contacts (SACs) in the insulating layer over the front-side of the wafer. In some embodiments, the first and second set of vias are electrically coupled to at least the set of transistors.

In operation 640 of method 600A, a second conductive material is deposited on a fourth level thereby forming a first set of conductors. In some embodiments, the fourth level of at least method 600A includes the M0 level. In some embodiments, operation 640 includes at least depositing a first set of conductive regions over the front-side of the integrated circuit.

In some embodiments, the first set of conductors of at least method 600A includes one or more portions of at least the set of conductors in the M0 level.

In some embodiments, the set of conductors is electrically coupled to at least the set of contacts by the second set of vias. In some embodiments, the first set of conductors is electrically coupled to at least the set of gates by the first set of vias.

In some embodiments, one or more of operations 634, 636, 638 or 640 of method 600A include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 10:
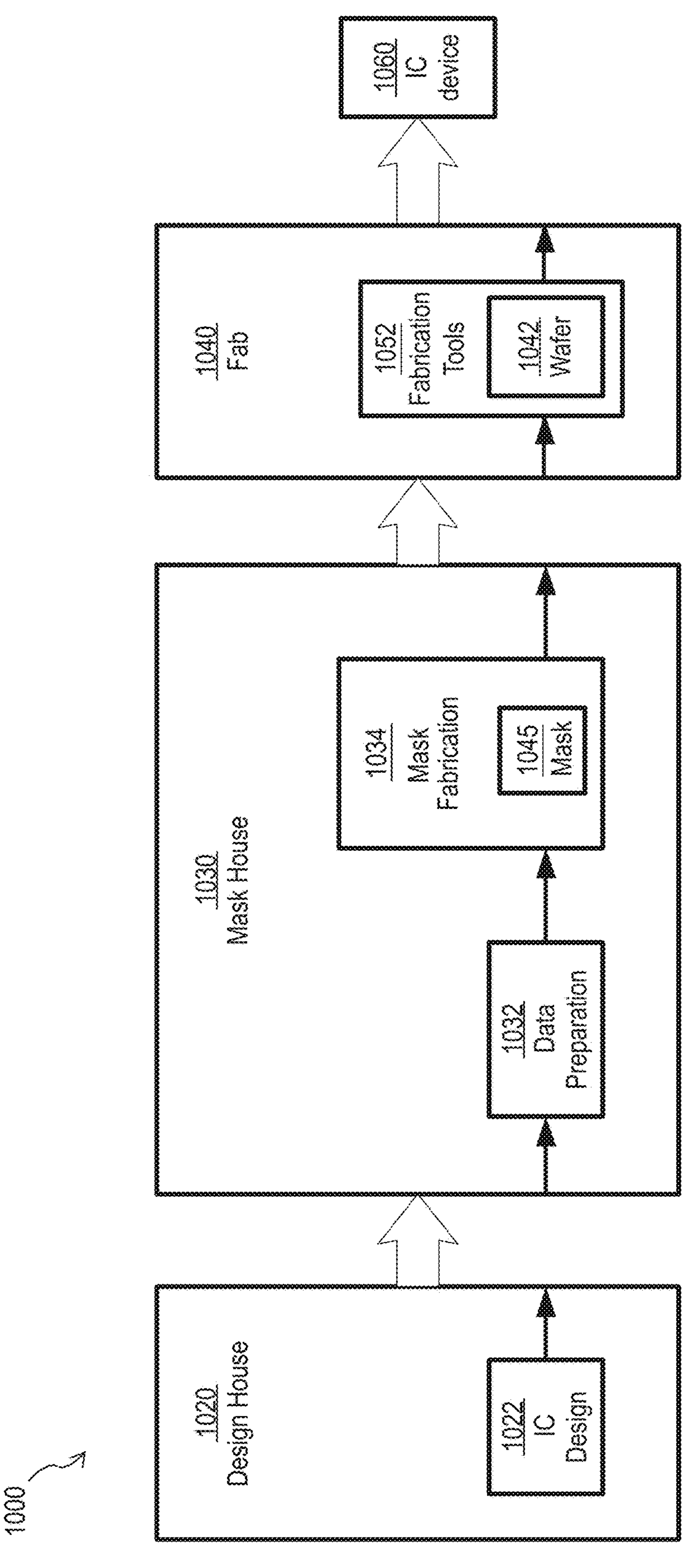
FIG. 10 is a block diagram of an IC manufacturing system, and an IC manufacturing flow associated therewith, in accordance with at least one embodiment of the present disclosure.

In some embodiments, at least one or more operations of method 600A or 600B is performed by system 1000 of FIG. 10. In some embodiments, at least one method(s), such as method 600A or 600B discussed above, is performed in whole or in part by at least one manufacturing system, including system 1000. One or more of the operations of method 600A or 600B is performed by IC fab 1040 (FIG. 10) to fabricate IC device 1060. In some embodiments, one or more of the operations of method 600A or 600B is performed by fabrication tools 1052 to fabricate wafer 1042.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 634, 636, 638 or 640, the conductive material is planarized to provide a level surface for subsequent steps.

In some embodiments, one or more of the operations of method 600A, 600B, 700 or 800 is not performed.

One or more of the operations of methods 700-800 is performed by a processing device configured to execute instructions for manufacturing an integrated circuit, such as at least integrated circuit 100, 300, 400 or 500. In some embodiments, one or more operations of methods 700-800 is performed using a same processing device as that used in a different one or more operations of methods 700-800. In some embodiments, a different processing device is used to perform one or more operations of methods 700-800 from that used to perform a different one or more operations of methods 700-800. In some embodiments, other order of operations of method 600A, 600B, 700 or 800 is within the scope of the present disclosure. Method 600A, 600B, 700 or 800 includes exemplary operations, but the operations are not necessarily performed in the order shown. Operations in method 600A, 600B, 700 or 800 may be added, replaced, changed order, and/or eliminated as appropriate, in accordance with the spirit and scope of disclosed embodiments.

FIG. 7 is a flowchart of a method 700 of forming or manufacturing an integrated circuit in accordance with some embodiments. It is understood that additional operations may be performed before, during, and/or after the method 700 depicted in FIG. 7, and that some other operations may only be briefly described herein. In some embodiments, the method 700 is usable to form integrated circuits, such as at least integrated circuit 300, 400 or 500. In some embodiments, the method 700 is usable to form integrated circuits having similar features and similar structural relationships as one or more of layout design 200.

In operation 702 of method 700, a layout design of an integrated circuit is generated. Operation 702 is performed by a processing device (e.g., processor 902 (FIG. 9)) configured to execute instructions for generating a layout design. In some embodiments, the layout design of method 700 includes one or more patterns of at least layout design 200, or one or more features similar to at least integrated circuit 300, 400 or 500. In some embodiments, the layout design of the present application is in a graphic database system (GDSII) file format.

In operation 704 of method 700, the integrated circuit is manufactured based on the layout design. In some embodiments, operation 704 of method 700 comprises manufacturing at least one mask based on the layout design, and manufacturing the integrated circuit based on the at least one mask. In some embodiments, operation 704 corresponds to method 600A of FIG. 6 or method 600B of FIG. 6B.

Figure 8:
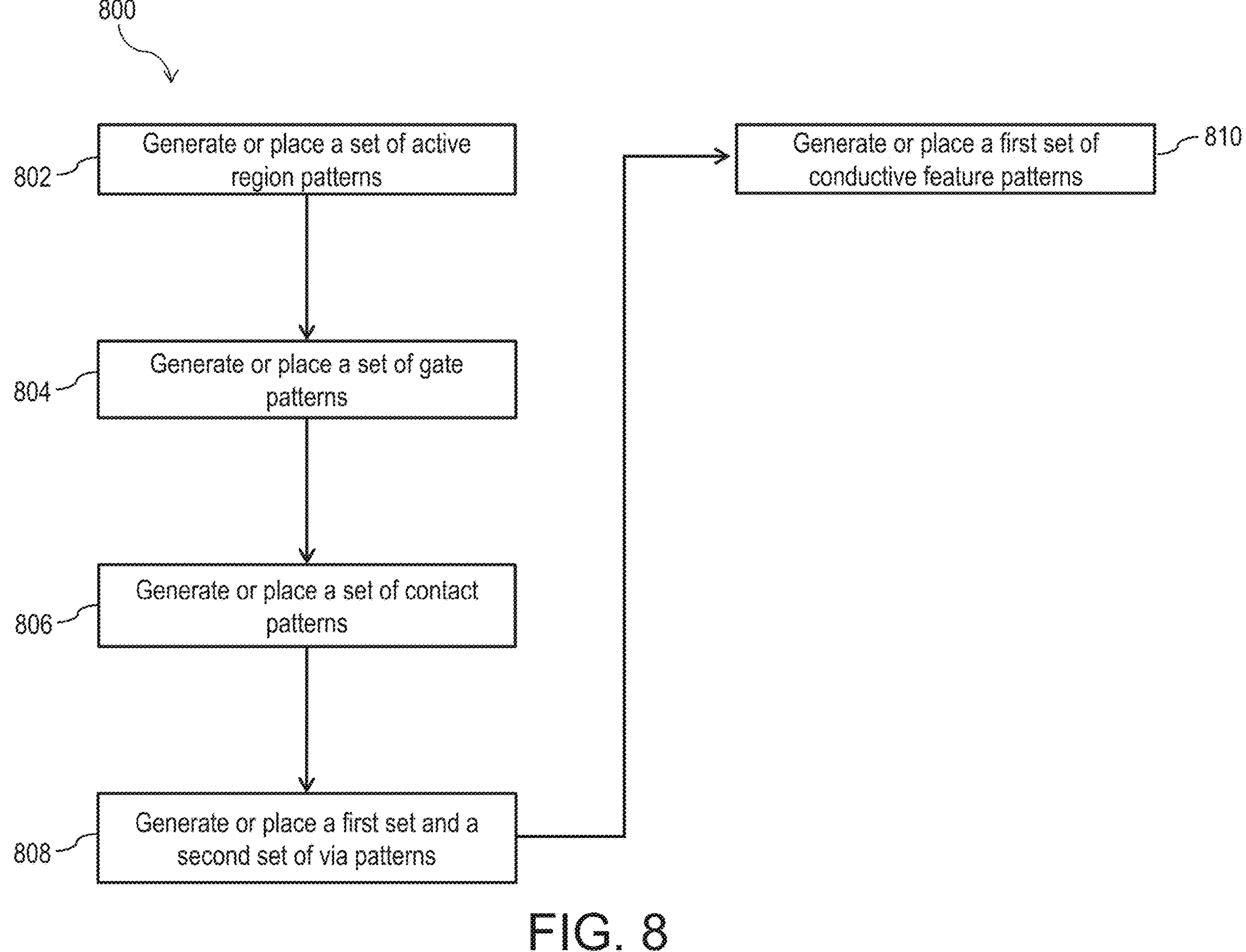
FIG. 8 is a flowchart of a method of generating a layout design of an integrated circuit, in accordance with some embodiments.

FIG. 8 is a flowchart of a method 800 of generating a layout design of an integrated circuit, in accordance with some embodiments. It is understood that additional operations may be performed before, during, and/or after the method 800 depicted in FIG. 8, and that some other processes may only be briefly described herein. In some embodiments, method 800 is an embodiment of operation 702 of method 700. In some embodiments, method 800 is usable to generate one or more layout patterns of at least layout design 200, or one or more features similar to at least integrated circuit 300, 400 or 500.

In some embodiments, method 800 is usable to generate one or more layout patterns having structural relationships including alignment, lengths and widths, as well as configurations and layers of at least layout design 200, or one or more features similar to at least integrated circuit 300, 400 or 500, and similar detailed description will not be described in FIG. 8, for brevity.

In operation 802 of method 800, a set of active region patterns is generated or placed on the layout design. In some embodiments, the set of active region patterns of method 800 includes at least portions of one or more patterns of set of active region patterns 202. In some embodiments, the set of active region patterns of method 800 includes one or more regions similar to the set of active regions 302 or 502.

In some embodiments, the set of active region patterns of method 800 includes one or more patterns in the OD level or patterns similar to active regions in the OD level.

In operation 804 of method 800, a set of gate patterns is generated or placed on the layout design. In some embodiments, the set of gate patterns of method 800 includes at least portions of one or more patterns of set of gate patterns 203 or 204. In some embodiments, the set of gate patterns of method 800 includes one or more gate patterns similar to the set of gates 303, 304 or 504. In some embodiments, the set of gate patterns of method 800 includes one or more patterns in the POLY level or patterns similar to gates in the POLY level.

In operation 806 of method 800, a set of contact patterns is generated or placed on the layout design. In some embodiments, the set of contact patterns of method 800 includes at least portions of one or more patterns of set of contact patterns 206. In some embodiments, the set of contact patterns of method 800 includes one or more contact patterns similar to the set of contacts 306 or 506. In some embodiments, the set of contact patterns of method 800 includes one or more patterns in the MD level or similar to contacts in the MD level.

In operation 808 of method 800, a first set of via patterns and a second set of via patterns are generated or placed on the layout design.

In some embodiments, the first set of via patterns of method 800 includes at least portions of one or more patterns of set of via patterns in the VG level. In some embodiments, the first set of via patterns of method 800 includes one or more via patterns similar to at least the set of vias in the VG level. In some embodiments, the first set of via patterns of method 800 includes one or more patterns in the VG level or via patterns similar to vias in the VG level.

In some embodiments, the second set of via patterns of method 800 includes one or more via patterns similar to at least the set of vias in the VD level. In some embodiments, the first set of via patterns of method 800 includes one or more via patterns similar to at least the set of vias in the VD level. In some embodiments, the second set of via patterns of method 800 includes one or more patterns in the VD level or via patterns similar to vias in the VD level.

In operation 810 of method 800, a first set of conductive patterns is generated or placed on the layout design. In some embodiments, the first set of conductive patterns of method 800 includes at least portions of one or more patterns of at least the set of conductive patterns in the M0 level.

In some embodiments, the first set of conductive patterns of method 800 includes one or more conductive patterns similar to at least the set of conductors in the M0 level. In some embodiments, the first set of conductive patterns of method 800 includes one or more patterns in the M0 level or patterns similar to conductors in the M0 level.

Figure 9:
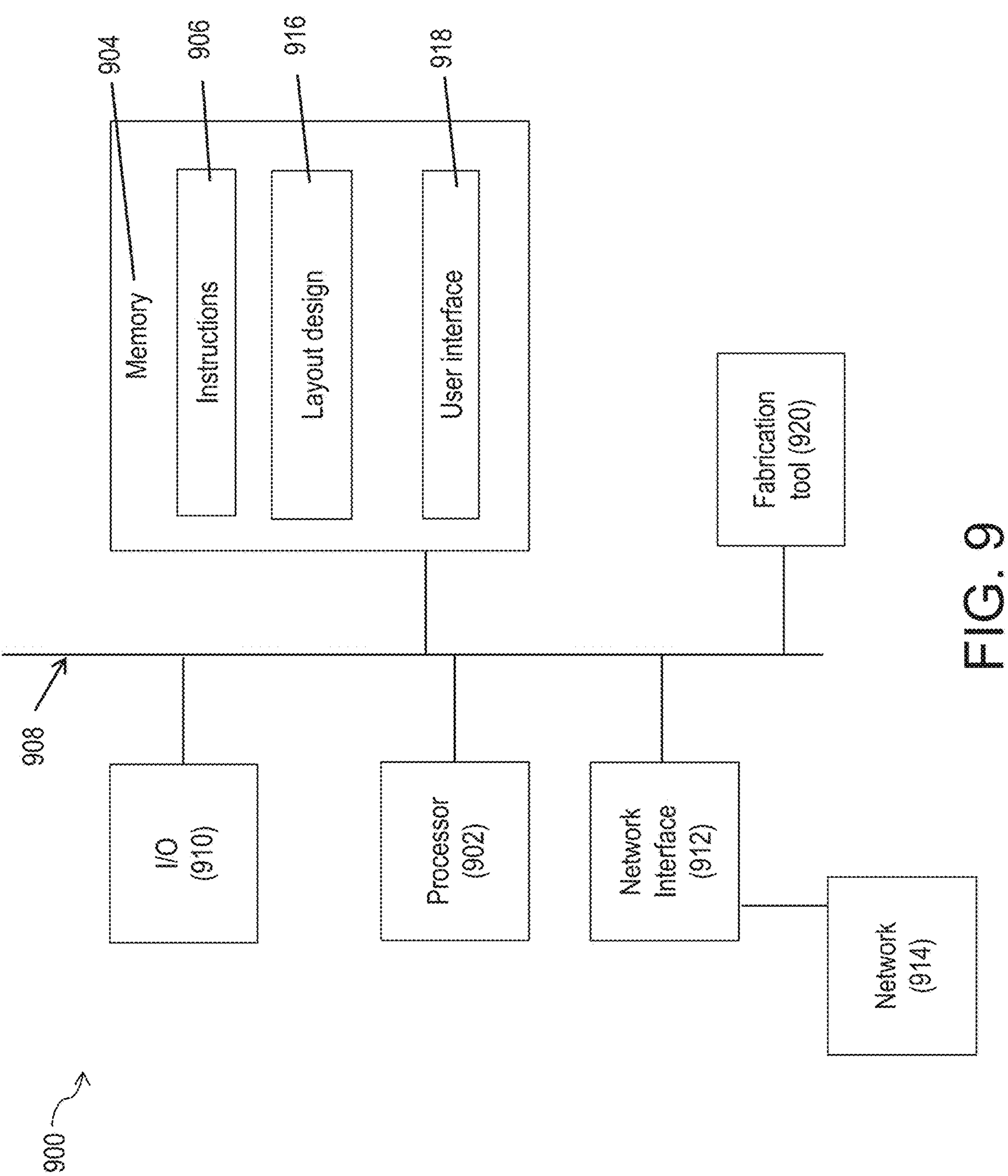
FIG. 9 is a schematic view of a system for designing an IC layout design and manufacturing an IC circuit, in accordance with some embodiments.

FIG. 9 is a schematic view of a system 900 for designing an IC layout design and manufacturing an IC circuit in accordance with some embodiments.

In some embodiments, system 900 generates or places one or more IC layout designs described herein. System 900 includes a hardware processor 902 and a non-transitory, computer readable storage medium 904 (e.g., memory 904) encoded with, i.e., storing, the computer program code 906, i.e., a set of executable instructions 906. Computer readable storage medium 904 is configured for interfacing with manufacturing machines for producing the integrated circuit. The processor 902 is electrically coupled to the computer readable storage medium 904 via a bus 908. The processor 902 is also electrically coupled to an I/O interface 910 by bus 908. A network interface 912 is also electrically connected to the processor 902 via bus 908. Network interface 912 is connected to a network 914, so that processor 902 and computer readable storage medium 904 are capable of connecting to external elements via network 914. The processor 902 is configured to execute the computer program code 906 encoded in the computer readable storage medium 904 in order to cause system 900 to be usable for performing a portion or all of the operations as described in method 700-800.

In some embodiments, the processor 902 is a central processing unit (CPU), a multi-processor, a distributed processing system, an application specific integrated circuit (ASIC), and/or a suitable processing unit.

In some embodiments, the computer readable storage medium 904 is an electronic, magnetic, optical, electromagnetic, infrared, and/or a semiconductor system (or apparatus or device). For example, the computer readable storage medium 904 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 904 includes a compact disk-read only memory (CD-ROM), a compact disk-read/write (CD-R/W), and/or a digital video disc (DVD).

In some embodiments, the storage medium 904 stores the computer program code 906 configured to cause system 900 to perform method 700-800. In some embodiments, the storage medium 904 also stores information needed for performing method 700-800 as well as information generated during performing method 700-800, such as layout design 916, user interface 918 and fabrication tool 920, and/or a set of executable instructions to perform the operation of method 700-800. In some embodiments, layout design 916 comprises one or more of layout patterns of at least layout design 200 or features similar to at least integrated circuit 300, 400 or 500.

In some embodiments, the storage medium 904 stores instructions (e.g., computer program code 906) for interfacing with manufacturing machines. The instructions (e.g., computer program code 906) enable processor 902 to generate manufacturing instructions readable by the manufacturing machines to effectively implement method 700-800 during a manufacturing process.

System 900 includes I/O interface 910. I/O interface 910 is coupled to external circuitry. In some embodiments, I/O interface 910 includes a keyboard, keypad, mouse, trackball, trackpad, and/or cursor direction keys for communicating information and commands to processor 902.

System 900 also includes network interface 912 coupled to the processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interface such as ETHERNET, USB, or IEEE-2094. In some embodiments, method 700-800 is implemented in two or more systems 900, and information such as layout design, and user interface are exchanged between different systems 900 by network 914.

System 900 is configured to receive information related to a layout design through I/O interface 910 or network interface 912. The information is transferred to processor 902 by bus 908 to determine a layout design, such as at least layout design 200, for producing at least integrated circuit 300, 400 or 500. The layout design is then stored in computer readable medium 904 as layout design 916. System 900 is configured to receive information related to a user interface through I/O interface 910 or network interface 912. The information is stored in computer readable medium 904 as user interface 918. System 900 is configured to receive information related to a fabrication tool 920 through I/O interface 910 or network interface 912. The information is stored in computer readable medium 904 as fabrication tool 920. In some embodiments, the fabrication tool 920 includes fabrication information utilized by system 900. In some embodiments, the fabrication tool 920 corresponds to mask fabrication 1034 of FIG. 10.

In some embodiments, method 700-800 is implemented as a standalone software application for execution by a processor. In some embodiments, method 700-800 is implemented as a software application that is a part of an additional software application. In some embodiments, method 700-800 is implemented as a plug-in to a software application. In some embodiments, method 700-800 is implemented as a software application that is a portion of an EDA tool. In some embodiments, method 700-800 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 700-800 is implemented by a manufacturing device to manufacture an integrated circuit using a set of masks manufactured based on one or more layout designs generated by system 900. In some embodiments, system 900 is a manufacturing device configured to manufacture an integrated circuit using a set of masks manufactured based on one or more layout designs of the present disclosure. In some embodiments, system 900 of FIG. 9 generates layout designs of an integrated circuit that are smaller than other approaches. In some embodiments, system 900 of FIG. 9 generates layout designs of integrated circuit structure that occupy less area and provide better routing resources than other approaches.

FIG. 10 is a block diagram of an integrated circuit (IC) manufacturing system 1000, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 (hereinafter "system 1000") includes entities, such as a design house 1020, a mask house 1030, and an IC manufacturer/fabricator ("fab") 1040, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1020, mask house 1030, and IC fab 1040 is owned by a single larger company. In some embodiments, one or more of design house 1020, mask house 1030, and IC fab 1040 coexist in a common facility and use common resources.

Design house (or design team) 1020 generates an IC design layout 1022. IC design layout 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout 1022 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout 1022. The design procedure includes one or more of logic design, physical design or place and route. IC design layout 1022 is presented in one or more data files having information of the geometrical patterns. For example, IC design layout 1022 can be expressed in a GDSII file format or DFII file format.

Mask house 1030 includes data preparation 1032 and mask fabrication 1034. Mask house 1030 uses IC design layout 1022 to manufacture one or more masks 1045 to be used for fabricating the various layers of IC device 1060 according to IC design layout 1022. Mask house 1030 performs mask data preparation 1032, where IC design layout 1022 is translated into a representative data file (RDF). Mask data preparation 1032 provides the RDF to mask fabrication 1034. Mask fabrication 1034 includes a mask writer. A mask writer converts the RDF to an image on a substrate, such as a mask (reticle) 1045 or a semiconductor wafer 1042. The design layout 1022 is manipulated by mask data preparation 1032 to comply with particular characteristics of the mask writer and/or requirements of IC fab 1040. In FIG. 10, mask data preparation 1032 and mask fabrication 1034 are illustrated as separate elements. In some embodiments, mask data preparation 1032 and mask fabrication 1034 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1034, which may undo part of the modifications performed by OPC in order to meet mask creation rules.

In some embodiments, mask data preparation 1032 includes lithography process checking (LPC) that simulates processing that will be implemented by IC fab 1040 to fabricate IC device 1060. LPC simulates this processing based on IC design layout 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1022.

It should be understood that the above description of mask data preparation 1032 has been simplified for the purposes of clarity. In some embodiments, data preparation 1032 includes additional features such as a logic operation (LOP) to modify the IC design layout according to manufacturing rules. Additionally, the processes applied to IC design layout 1022 during data preparation 1032 may be executed in a variety of different orders.

After mask data preparation 1032 and during mask fabrication 1034, a mask 1045 or a group of masks 1045 are fabricated based on the modified IC design layout 1022. In some embodiments, mask fabrication 1034 includes performing one or more lithographic exposures based on IC design 1022. In some embodiments, an electron-beam (e-beam) or a mechanism of multiple e-beams is used to form a pattern on a mask (photomask or reticle) 1045 based on the modified IC design layout 1022. The mask 1045 can be formed in various technologies. In some embodiments, the mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1045 includes a transparent substrate (e.g., fused quartz) and an opaque material (e.g., chromium) coated in the opaque regions of the binary mask. In another example, the mask 1045 is formed using a phase shift technology. In the phase shift mask (PSM) version of mask 1045, various features in the pattern formed on the mask are configured to have proper phase difference to enhance the resolution and imaging quality. In various examples, the phase shift mask can be attenuated PSM or alternating PSM. The mask(s) generated by mask fabrication 1034 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1040 is an IC fabrication entity that includes one or more manufacturing facilities for the fabrication of a variety of different IC products. In some embodiments, IC Fab 1040 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1040 includes wafer fabrication tools 1052 (hereinafter "fabrication tools 1052") configured to execute various manufacturing operations on semiconductor wafer 1042 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1040 uses mask(s) 1045 fabricated by mask house 1030 to fabricate IC device 1060. Thus, IC fab 1040 at least indirectly uses IC design layout 1022 to fabricate IC device 1060. In some embodiments, a semiconductor wafer 1042 is fabricated by IC fab 1040 using mask(s) 1045 to form IC device 1060. In some embodiments, the IC fabrication includes performing one or more lithographic exposures based at least indirectly on IC design 1022. Semiconductor wafer 1042 includes a silicon substrate or other proper substrate having material layers formed thereon. Semiconductor wafer 1042 further includes one or more of various doped regions, dielectric features, multilevel interconnects, and the like (formed at subsequent manufacturing steps).

System 1000 is shown as having design house 1020, mask house 1030 or IC fab 1040 as separate components or entities. However, it is understood that one or more of design house 1020, mask house 1030 or IC fab 1040 are part of the same component or entity.

One aspect of this description relates to a flip-flop. In some embodiments, the flip-flop includes a first set of transistors of a first type being located in a first row, the first row extending in a first direction. In some embodiments, the flip-flop further includes a second set of transistors of a second type being located in a second row, the second row extending in the first direction and being separated from the first row in a second direction different from the first direction, the second type being different from the first type. In some embodiments, the first set of transistors and the second set of transistors include a first slave latch circuit and a second slave latch circuit, and the first slave latch circuit and the second slave latch circuit are separated from each other in the first direction by a first distance. In some embodiments, a first output signal of the first slave latch circuit and the second slave latch circuit is a first input signal of the first slave latch circuit and the second slave latch circuit. In some embodiments, a second output signal of the first slave latch circuit and the second slave latch circuit is a second input signal of the first slave latch circuit and the second slave latch circuit.

Another aspect of this description relates to a flip-flop. In some embodiments, the flip-flop includes a first set of transistors of a first type being located in a first row, the first row extending in a first direction. In some embodiments, the flip-flop further includes a second set of transistors of a second type being located in a second row different from the first row, the second row extending in the first direction and being separated from the first row in a second direction different from the first direction, the second type being different from the first type. In some embodiments, the flip-flop further includes a third set of transistors of the second type being located in a third row different from the first row and the second row, the third row extending in the first direction and being separated from the first row and the second row in the second direction. In some embodiments, the first set of transistors and the second set of transistors include a first master latch circuit and a first slave latch circuit, and the first master latch circuit and the first slave latch circuit are separated from each other in the first direction by at least a first distance. In some embodiments, wherein the third set of transistors include a second slave latch circuit and a second master latch circuit, and the second slave latch circuit and the second master latch circuit are separated from each other in the first direction by at least a second distance. In some embodiments, wherein the first master latch circuit and the first slave latch circuit are coupled together, and the second master latch circuit and the second slave latch circuit are coupled together.

Still another aspect of this description relates to a method of fabricating a flip-flop. In some embodiments, the method includes forming a first set of transistors of a first type in a first row, the first row extending in a first direction. In some embodiments, the method further includes forming a second set of transistors of a second type in a second row, the second row extending in the first direction and being separated from the first row in a second direction different from the first direction, the second type being different from the first type, wherein the first set of transistors and the second set of transistors include a first master latch circuit and a first slave latch circuit, and the first master latch circuit and the first slave latch circuit are separated from each other in the first direction by a first distance. In some embodiments, the method further includes forming a third set of transistors of the second type in a third row, the third row extending in the first direction. In some embodiments, the method further includes forming a fourth set of transistors of the first type in a fourth row, the fourth row extending in the first direction and being separated from the third row in the second direction, wherein the third set of transistors and the fourth set of transistors include a second master latch circuit and a second slave latch circuit, and the second master latch circuit and the second slave latch circuit are separated from each other in the first direction by a second distance. In some embodiments, the method further includes electrically coupling the first master latch circuit and the second master latch circuit together.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flip-flop comprising:

a first set of transistors of a first type being located in a first row, the first row extending in a first direction; and a second set of transistors of a second type being located in a second row, the second row extending in the first direction and being separated from the first row in a second direction different from the first direction, the second type being different from the first type;

wherein the first set of transistors and the second set of transistors include a first slave latch circuit and a second slave latch circuit, and the first slave latch circuit and the second slave latch circuit are separated from each other in the first direction by a first distance;

wherein a first output signal of the first slave latch circuit and the second slave latch circuit is a first input signal of the first slave latch circuit and the second slave latch circuit; and a second output signal of the first slave latch circuit and the second slave latch circuit is a second input signal of the first slave latch circuit and the second slave latch circuit.

2. The flip-flop of claim 1, wherein a third output signal of the first slave latch circuit is a third input signal of the first slave latch circuit; and a third output signal of the second slave latch circuit is a third input signal of the second slave latch circuit.

3. The flip-flop of claim 2, wherein the first set of transistors and the second set of transistors further include:

a multiplexer configured to output a first signal on a first output node.

4. The flip-flop of claim 3, wherein the first set of transistors and the second set of transistors further include:

a first stacked gate circuit coupled to the multiplexer by the first output node; and a second stacked gate circuit coupled to the multiplexer by the first output node.

5. The flip-flop of claim 4, wherein the first set of transistors and the second set of transistors further include:

a third stacked gate circuit coupled between the first stacked gate circuit and the first slave latch circuit, and configured to output the third input signal of the first slave latch circuit to a first input node of the first slave latch circuit; and a fourth stacked gate circuit coupled between the second stacked gate circuit and the second slave latch circuit, and configured to output the third input signal of the second slave latch circuit to a first input node of the second slave latch circuit.

6. The flip-flop of claim 5, wherein the first set of transistors and the second set of transistors further include:

a first clock circuit configured to receive an input clock signal, and to generate a first clock signal and a second clock signal, the first clock circuit being coupled to the first slave latch circuit; and a second clock circuit configured to receive the input clock signal, and to generate a third clock signal and a fourth clock signal, the second clock circuit being coupled to the second slave latch circuit.

7. The flip-flop of claim 6, wherein the first clock circuit comprises:

a first inverter configured to receive the input clock signal, and to generate the first clock signal inverted from the input clock signal, the first inverter being coupled to the first slave latch circuit; and a second inverter configured to receive the first clock signal, and to generate the second clock signal inverted from the first clock signal, the second inverter being coupled to the first slave latch circuit.

8. The flip-flop of claim 6, wherein the second clock circuit comprises:

a first inverter configured to receive the input clock signal, and to generate the third clock signal inverted from the input clock signal, the first inverter being coupled to the second slave latch circuit; and a second inverter configured to receive the third clock signal, and to generate the fourth clock signal inverted from the third clock signal, the second inverter being coupled to the second slave latch circuit.

9. The flip-flop of claim 3, further comprising:

a first active region extending in the first direction, being on a first level of a substrate, and the first active region corresponding to the first set of transistors; and a second active region extending in the first direction, being on the first level, and being separated from the first active region in the second direction, the second active region corresponding to the second set of transistors.

10. The flip-flop of claim 9, wherein the first active region has a first width; and the second active region has the first width.

11. The flip-flop of claim 3, wherein the first distance is at least 400 nanometers.

12. A flip-flop comprising:

a first set of transistors of a first type being located in a first row, the first row extending in a first direction;

a second set of transistors of a second type being located in a second row different from the first row, the second row extending in the first direction and being separated from the first row in a second direction different from the first direction, the second type being different from the first type; and a third set of transistors of the second type being located in a third row different from the first row and the second row, the third row extending in the first direction and being separated from the first row and the second row in the second direction;

wherein the first set of transistors and the second set of transistors include a first master latch circuit and a first slave latch circuit, and the first master latch circuit and the first slave latch circuit are separated from each other in the first direction by at least a first distance;

wherein the third set of transistors include a second slave latch circuit and a second master latch circuit, and the second slave latch circuit and the second master latch circuit are separated from each other in the first direction by at least a second distance; and wherein the first master latch circuit and the first slave latch circuit are coupled together, and the second master latch circuit and the second slave latch circuit are coupled together.

13. The flip-flop of claim 12, wherein the first master latch circuit and the second master latch circuit are separated from each other in the first direction by the first distance; and the first slave latch circuit and the second slave latch circuit are separated from each other in the first direction by the second distance.

14. The flip-flop of claim 13, wherein the first distance is at least 400 nanometers; and the second distance is at least 400 nanometers.

15. The flip-flop of claim 12, wherein the first set of transistors and the second set of transistors further include:

a first inverter configured to receive an input clock signal, and to generate a first clock signal inverted from the input clock signal, the first inverter being coupled to at least the first master latch circuit and the first slave latch circuit; and a second inverter configured to receive the input clock signal, and to generate a second clock signal inverted from the input clock signal, the second inverter being coupled to at least the second master latch circuit and the second slave latch circuit.

16. The flip-flop of claim 15, wherein the third set of transistors further include:

a third inverter configured to receive the first clock signal, and to generate a third clock signal inverted from the first clock signal, the third inverter being coupled to at least the first inverter, the first master latch circuit and the first slave latch circuit; and a fourth inverter configured to receive the second clock signal, and to generate a fourth clock signal inverted from the second clock signal, the fourth inverter being coupled to at least the second inverter, the second master latch circuit and the second slave latch circuit.

17. The flip-flop of claim 12, wherein a first output signal of the first slave latch circuit and the second slave latch circuit is a first input signal of the first slave latch circuit and the second slave latch circuit; and a second output signal of the first slave latch circuit and the second slave latch circuit is a second input signal of the first slave latch circuit and the second slave latch circuit.

18. The flip-flop of claim 17, wherein a first output signal of the first master latch circuit and the second master latch circuit is a first input signal of the first master latch circuit and the second master latch circuit;

a second output signal of the first master latch circuit and the second master latch circuit is a second input signal of the first master latch circuit and the second master latch circuit;

a third output signal of the first slave latch circuit is a third input signal of the first slave latch circuit; and a third output signal of the second slave latch circuit is a third input signal of the second slave latch circuit.

19. The flip-flop of claim 12, further comprising:

a first active region extending in the first direction, being on a first level of a substrate, and the first active region corresponding to the first set of transistors;

a second active region extending in the first direction, being on the first level, and being separated from the first active region in the second direction, the second active region corresponding to the second set of transistors; and a third active region extending in the first direction, being on the first level, and being separated from the first active region and the second active region in the second direction, the third active region corresponding to the third set of transistors;

wherein each of the first active region, the second active region and the third active region have a first width.

20. A method of fabricating a flip-flop, the method comprising:

forming a first set of transistors of a first type in a first row, the first row extending in a first direction;

forming a second set of transistors of a second type in a second row, the second row extending in the first direction and being separated from the first row in a second direction different from the first direction, the second type being different from the first type, wherein the first set of transistors and the second set of transistors include a first master latch circuit and a first slave latch circuit, and the first master latch circuit and the first slave latch circuit are separated from each other in the first direction by a first distance;

forming a third set of transistors of the second type in a third row, the third row extending in the first direction;

forming a fourth set of transistors of the first type in a fourth row, the fourth row extending in the first direction and being separated from the third row in the second direction, wherein the third set of transistors and the fourth set of transistors include a second master latch circuit and a second slave latch circuit, and the second master latch circuit and the second slave latch circuit are separated from each other in the first direction by a second distance; and electrically coupling the first master latch circuit and the second master latch circuit together.

* * * * *